US011721623B2

(12) United States Patent
Yu et al.

(10) Patent No.: US 11,721,623 B2
(45) Date of Patent: *Aug. 8, 2023

(54) BACKSIDE CONNECTION STRUCTURES FOR NANOSTRUCTURES AND METHODS OF FORMING THE SAME

(71) Applicant: Taiwan Semiconductor Manufacturing Company Limited, Hsinchu (TW)

(72) Inventors: Li-Zhen Yu, New Taipei (TW); Chia-Hao Chang, Hsinchu (TW); Lin-Yu Huang, Hsinchu (TW); Cheng-Chi Chuang, New Taipei (TW); Chih-Hao Wang, Baoshan Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/676,300

(22) Filed: Feb. 21, 2022

(65) Prior Publication Data

US 2022/0181250 A1    Jun. 9, 2022

Related U.S. Application Data

(63) Continuation of application No. 16/910,453, filed on Jun. 24, 2020, now Pat. No. 11,257,758.

(51) Int. Cl.
*H01L 21/00* (2006.01)
*H01L 23/528* (2006.01)
(Continued)

(52) U.S. Cl.
CPC ...... *H01L 23/528* (2013.01); *H01L 21/76895* (2013.01); *H01L 23/535* (2013.01);
(Continued)

(58) Field of Classification Search
CPC ............ H01L 23/528; H01L 21/76895; H01L 23/535
See application file for complete search history.

(56) References Cited

U.S. PATENT DOCUMENTS 9,508,890 B2 * 11/2016 Li ..................... H01L 31/047
9,799,671 B2 * 10/2017 Pachamuthu ......... H01L 21/768
(Continued)

FOREIGN PATENT DOCUMENTS

CN    113140546 A  *  7/2021  ........ H01L 21/7682
CN    113299628 A  *  8/2021  ............ B82Y 40/00
(Continued)

*Primary Examiner* — Laura M Menz
(74) *Attorney, Agent, or Firm* — The Marbury Law Group, PLLC

(57) ABSTRACT

A semiconductor nanostructure and an epitaxial semiconductor material portion are formed on a front surface of a substrate, and a planarization dielectric layer is formed thereabove. A first recess cavity is formed over a gate electrode, and a second recess cavity is formed over the epitaxial semiconductor material portion. The second recess cavity is vertically recessed to form a connector via cavity. A metallic cap structure is formed on the gate electrode in the first recess cavity, and a connector via structure is formed in the connector via cavity. Front-side metal interconnect structures are formed on the connector via structure and the metallic cap structure, and a backside via structure is formed through the substrate on the connector via structure.

20 Claims, 74 Drawing Sheets

(51) Int. Cl.
*H01L 29/423* (2006.01)
*H01L 21/768* (2006.01)
*H01L 23/535* (2006.01)
*H01L 29/45* (2006.01)
*H01L 29/786* (2006.01)

(52) U.S. Cl.
CPC ...... *H01L 29/42392* (2013.01); *H01L 29/456* (2013.01); *H01L 29/78696* (2013.01)

(56) References Cited

U.S. PATENT DOCUMENTS

| | | | | |
|---|---|---|---|---|
| 9,847,448 | B2* | 12/2017 | Dasgupta | H01L 33/325 |
| 10,290,635 | B2* | 5/2019 | Ching | H01L 27/0886 |
| 10,453,854 | B2* | 10/2019 | Kanno | H10B 43/50 |
| 10,840,125 | B2* | 11/2020 | Dong | H01L 23/481 |
| 11,257,758 | B2* | 2/2022 | Yu | H01L 21/76895 |
| 2008/0047604 | A1* | 2/2008 | Korevaar | H01L 31/075 136/258 |
| 2016/0163918 | A1* | 6/2016 | Dasgupta | H01L 33/0025 438/45 |
| 2016/0300848 | A1* | 10/2016 | Pachamuthu | H01L 23/528 |
| 2018/0374791 | A1* | 12/2018 | Smith | H01L 29/78696 |
| 2020/0135982 | A1* | 4/2020 | Choi | H01L 33/00 |
| 2021/0035865 | A1* | 2/2021 | Ching | H01L 29/66795 |
| 2021/0134721 | A1* | 5/2021 | Chiang | H01L 29/42392 |
| 2021/0159311 | A1* | 5/2021 | Lan | H01L 29/66439 |
| 2021/0225918 | A1* | 7/2021 | Lin | H01L 27/14636 |
| 2021/0265220 | A1* | 8/2021 | Lee | H01L 29/785 |
| 2021/0273104 | A1* | 9/2021 | Wang | H01L 21/823431 |
| 2021/0273140 | A1* | 9/2021 | Choi | H01L 33/32 |
| 2021/0407900 | A1* | 12/2021 | Yu | H01L 23/528 |
| 2021/0408274 | A1* | 12/2021 | Yu | H01L 29/78618 |
| 2022/0109070 | A1* | 4/2022 | Ono | H01L 29/6659 |
| 2022/0181250 | A1* | 6/2022 | Yu | H01L 29/78696 |
| 2022/0181259 | A1* | 6/2022 | Chiang | H01L 29/66742 |

FOREIGN PATENT DOCUMENTS

| | | | | |
|---|---|---|---|---|
| CN | 113314468 | A * | 8/2021 | H01L 21/823821 |
| CN | 115050741 | A * | 9/2022 | H01L 21/0259 |
| WO | WO-2019108366 | A1 * | 6/2019 | H01L 21/30604 |

* cited by examiner

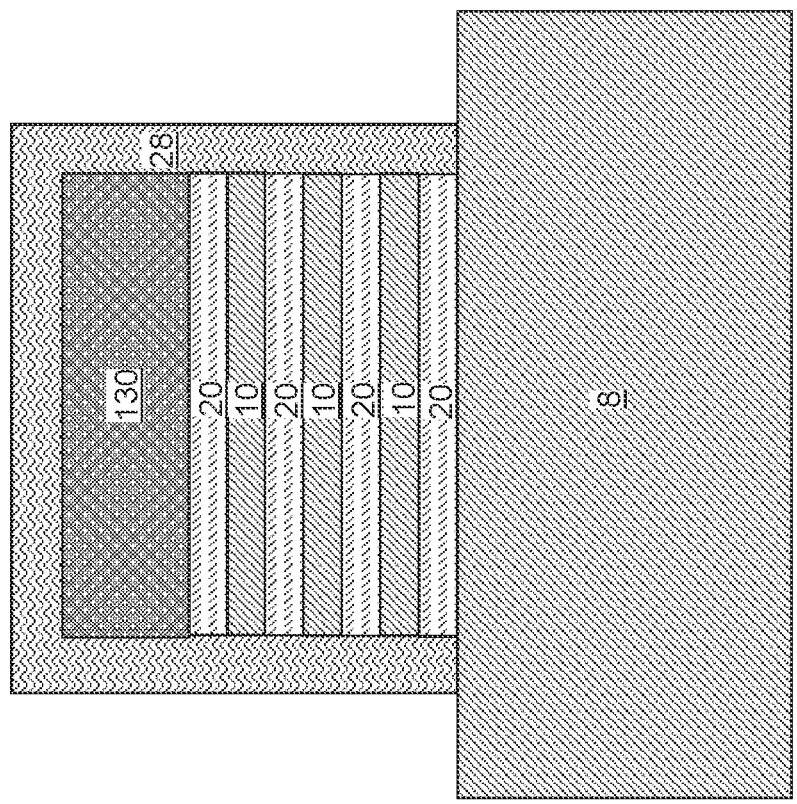
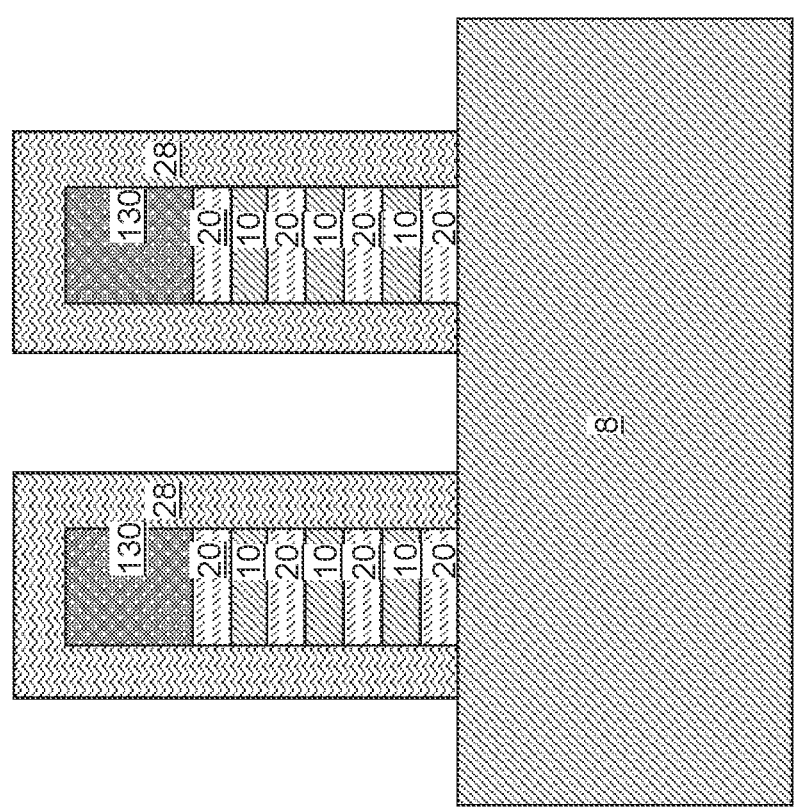

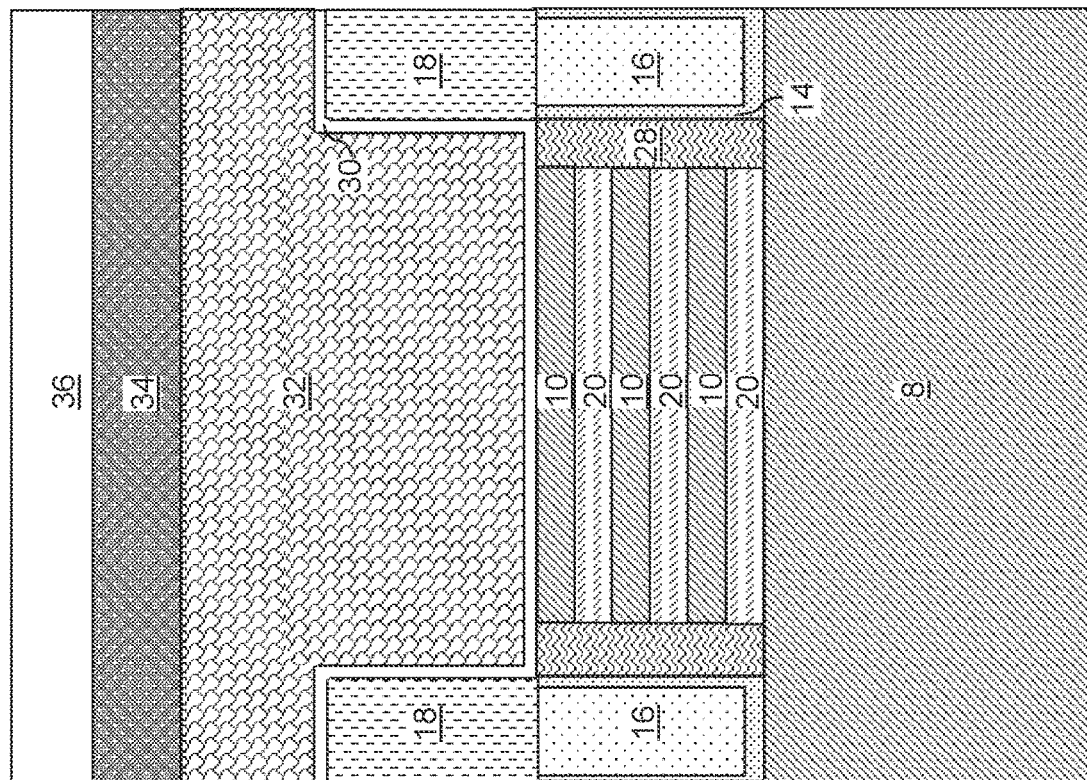
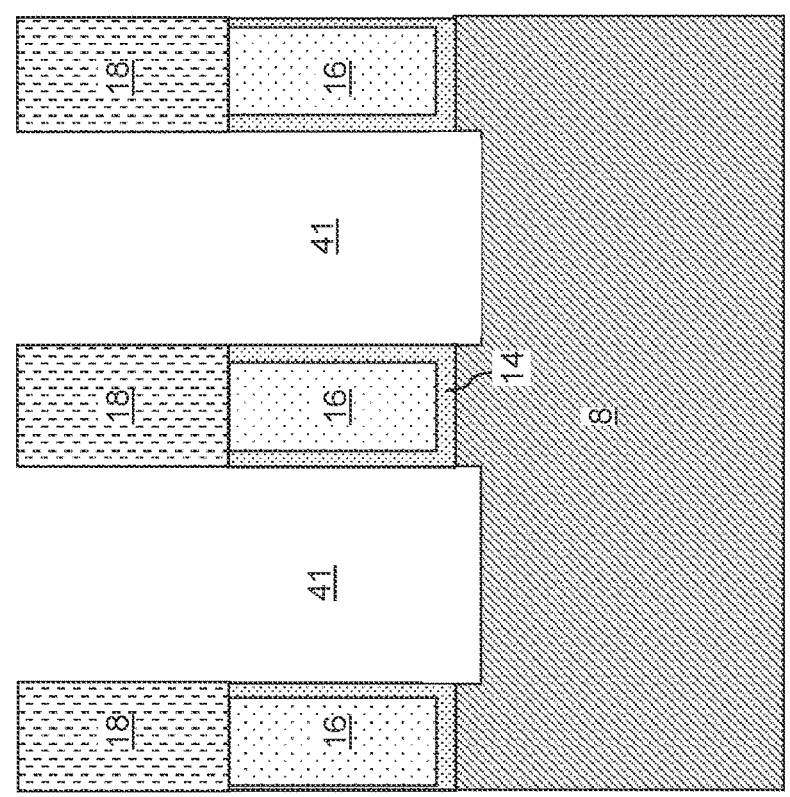
FIG. 6D
FIG. 6C

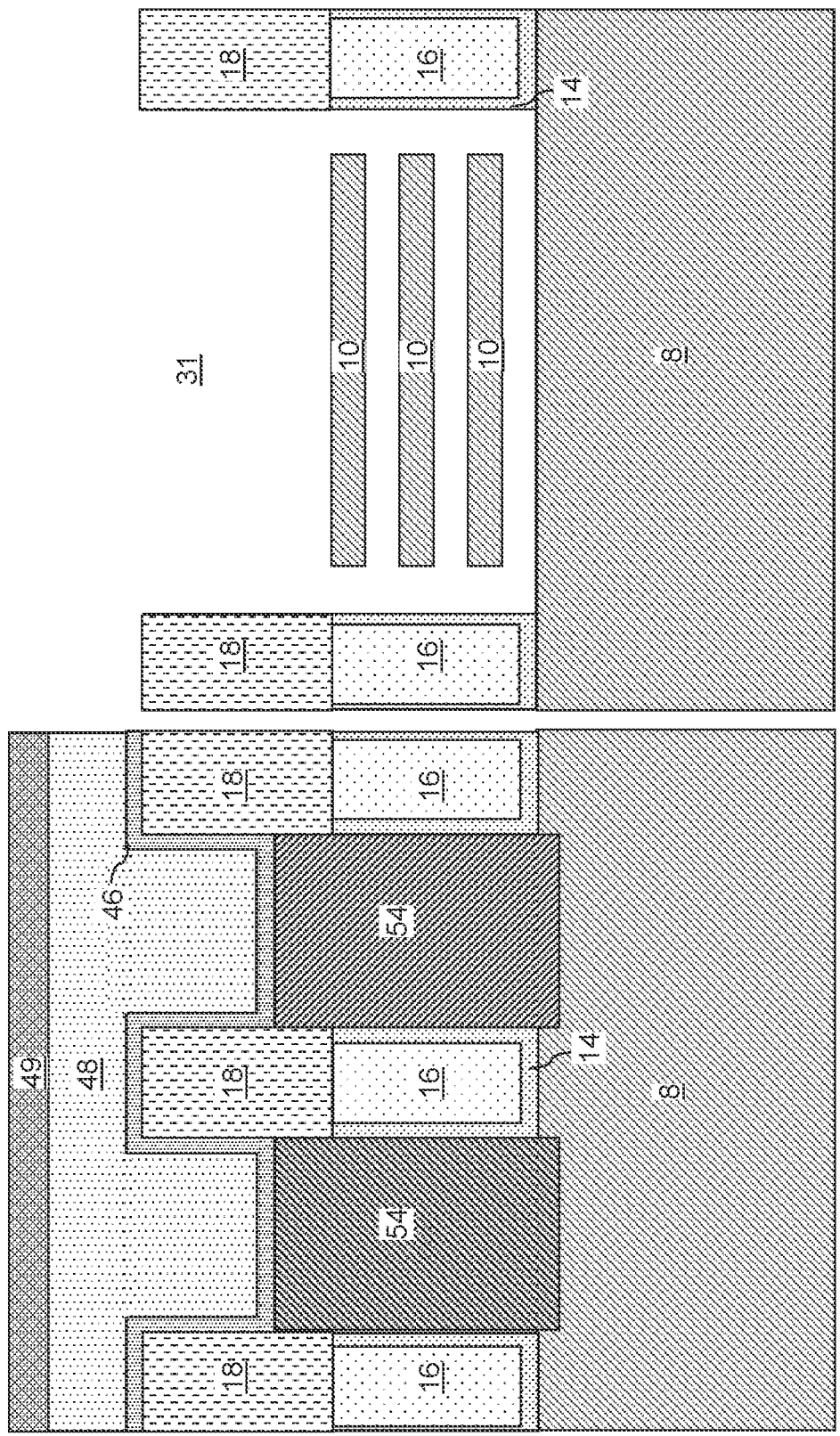

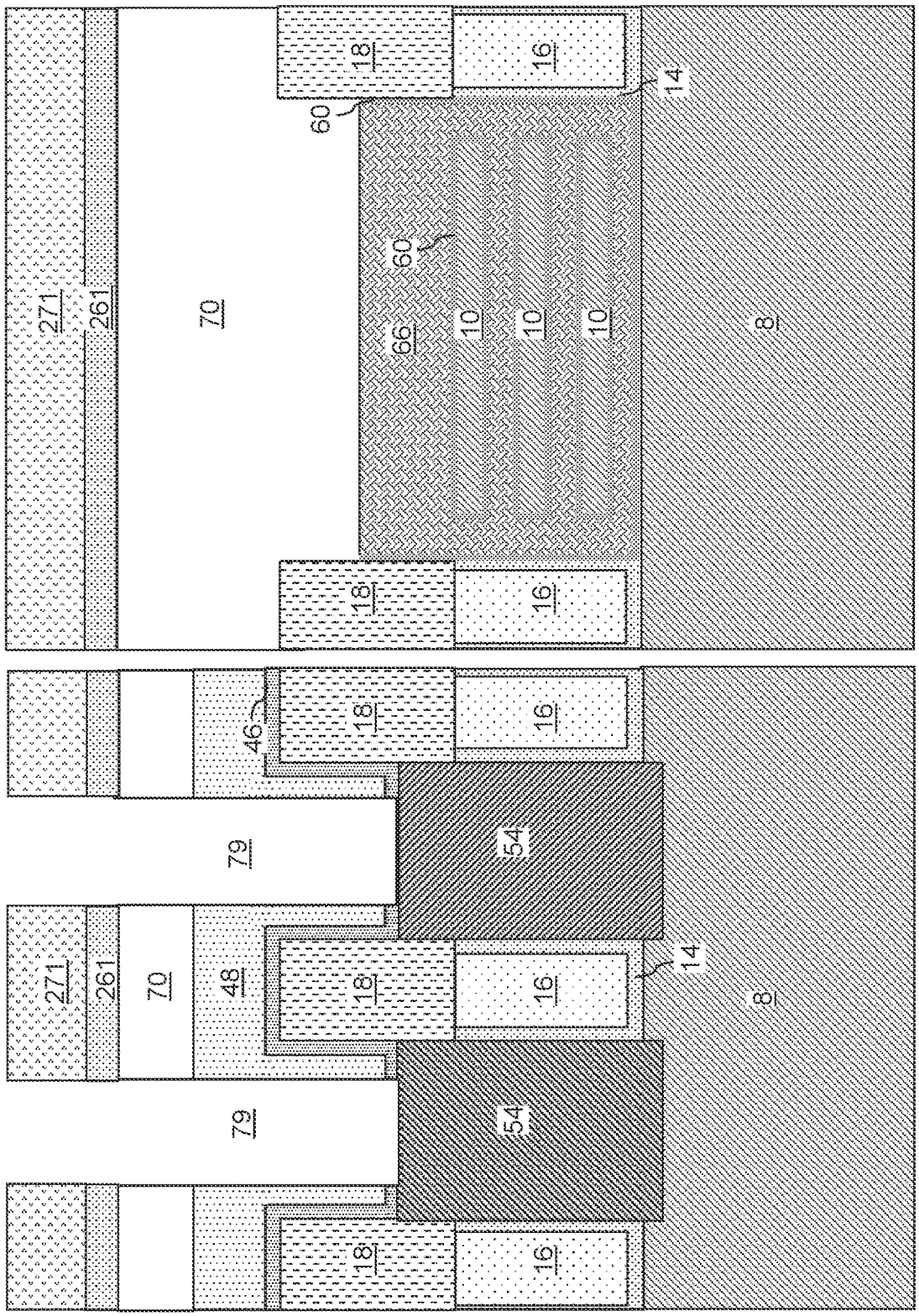

BACKSIDE CONNECTION STRUCTURES FOR NANOSTRUCTURES AND METHODS OF FORMING THE SAME

RELATED APPLICATIONS

This application is a continuation of U.S. patent application Ser. No. 16/910,453 entitled "Backside Connection Structures for Nanostructures and Methods of Forming the Same" filed Jun. 24, 2020, the entire contents of which are hereby incorporated by reference for all purposes.

BACKGROUND

Backside interconnect structures are useful for providing high density wiring and for facilitating packaging. A multigate device, multi-gate MOSFET or multi-gate field-effect transistor (MuGFET) refers to a MOSFET (metal-oxide-semiconductor field-effect transistor) that incorporates more than one gate into a single device. The multiple gates may be controlled by a single gate electrode, wherein the multiple gate surfaces act electrically as a single gate, or by independent gate electrodes. A multigate device using independent gate electrodes is sometimes called a multiple-independent-gate field-effect transistor (MIGFET). The most widely used multi-gate devices are the FinFET (fin field-effect transistor) and the GAAFET (gate-all-around field-effect transistor), which are non-planar transistors, or 3D transistors. Use of gate-all-around structures help increase device density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2C is a vertical cross-sectional view along the vertical plane C-C' of FIG. 2A.

FIG. 2D is a vertical cross-sectional view along the vertical plane D-C' of FIG. 2A.

FIG. 6C is a vertical cross-sectional view along the vertical plane C-C' of FIG. 6B.

FIG. 6D is a vertical cross-sectional view along the vertical plane D-D' of FIG. 6B.

FIG. 11C is a vertical cross-sectional view along the vertical plane C-C' of FIG. 11B.

FIG. 11D is a vertical cross-sectional view along the vertical plane D-D' of FIG. 11B.

FIG. 13C is a vertical cross-sectional view along the vertical plane C-C' of FIG. 13B.

FIG. 13D is a vertical cross-sectional view along the vertical plane D-D' of FIG. 13B.

DETAILED DESCRIPTION

Figure 1A:
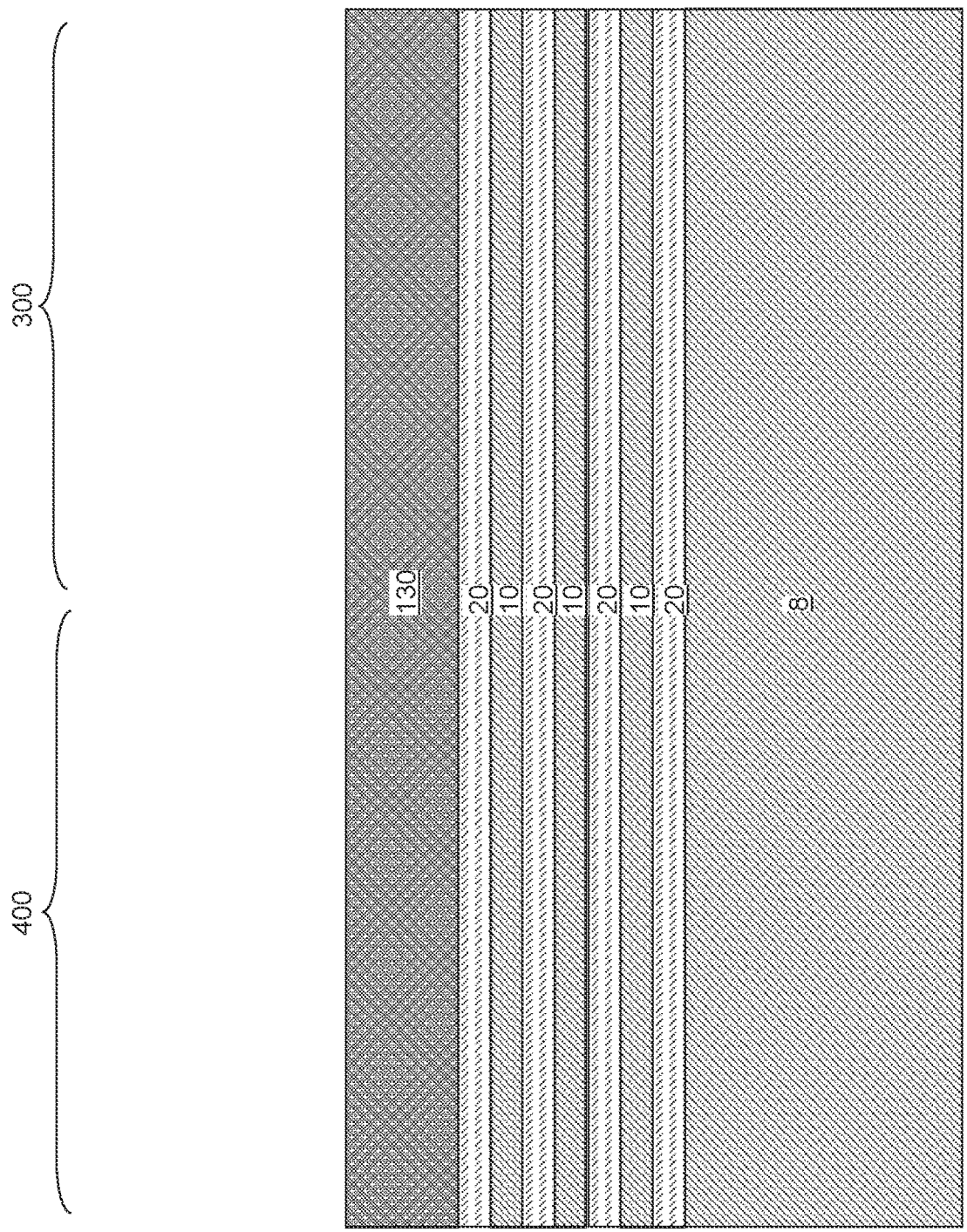
FIG. 1A is vertical cross-sectional view of an exemplary structure after formation of an alternating stack of semiconductor pates and a hard mask plate according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Gate-all-around (GAA) field effect transistors provide high current density per device area and small feature sizes. Front-side metal interconnect structures and backside metal interconnect structures may be used to provide high density electrical wiring to GAA field effect transistors. In such embodiments, connection via structures passing through device-level structures need to be provided. Integration of backside interconnect structures with gate-all-around structures poses a challenge because patterned structures need to be etched through at a level of gate-all-around field effect transistors.

The present disclosure provides structures and methods for providing low resistance connection via structures through device-level structures within a device structure including semiconductor nanostructures (such as GAA field effect transistors). The low resistance connection via structures of the present disclosure may reduce electrical resistance between the semiconductor nanostructures (such as the GAA field effect transistors) and backside metal interconnect structures, and reduce the voltage drop and RC delay in signal transmission between the semiconductor nanostructures and the backside metal interconnect structures. The various aspects of the present disclosure are described in detail herebelow.

Figure 1B:
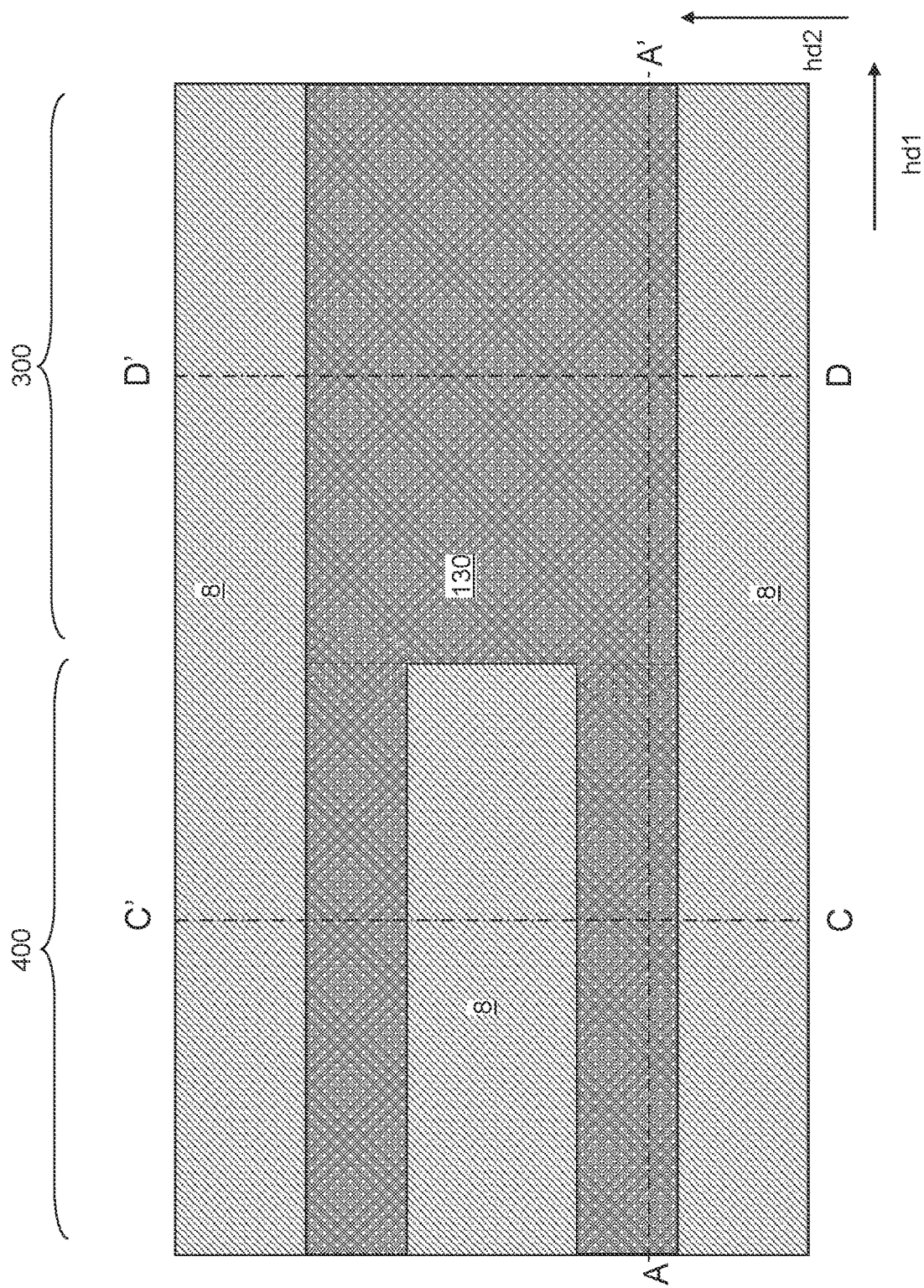
FIG. 1B is a top-down view of the exemplary structure of FIG. 1A. The vertical plane A-A' is the plane of the vertical cross-sectional view of FIG. 1A.
Figure 1D:
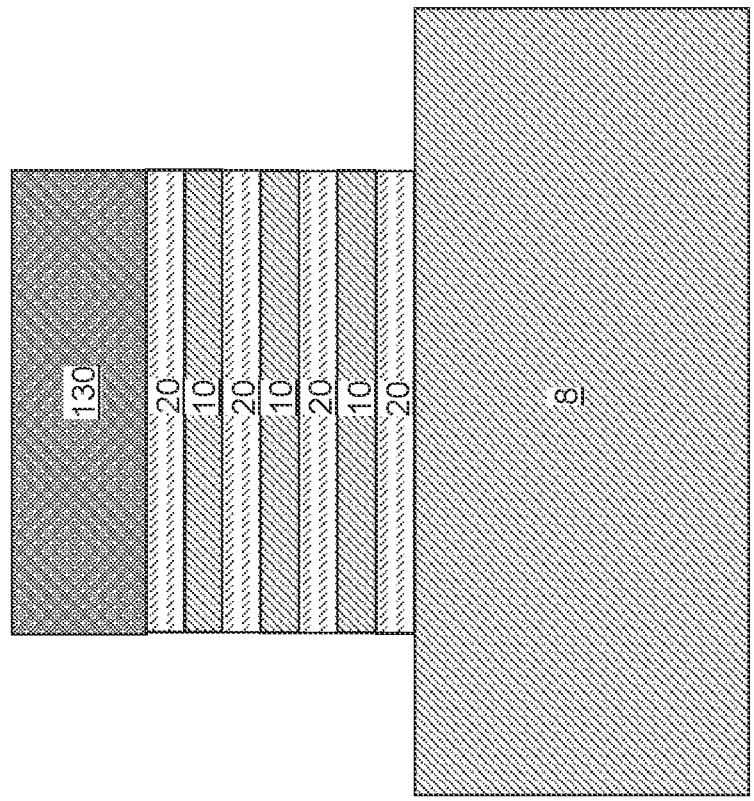
FIG. 1D is a vertical cross-sectional view along the vertical plane D-C' of FIG. 1A.
Figure 1C:
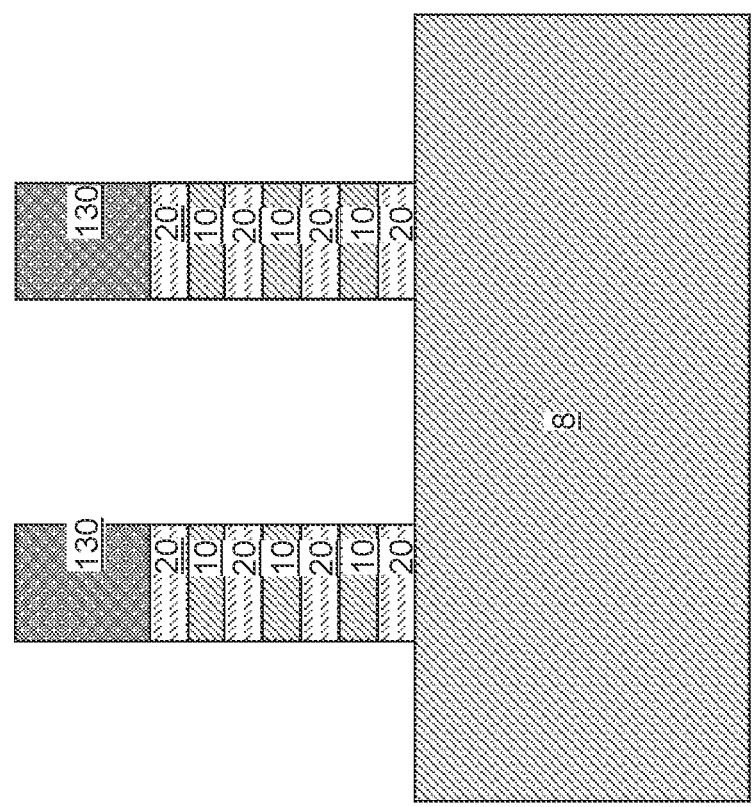
FIG. 1C is a vertical cross-sectional view along the vertical plane C-C' of FIG. 1A.

FIG. 1A is vertical cross-sectional view of an exemplary structure after formation of an alternating stack of semiconductor pates and a hard mask plate according to an embodiment of the present disclosure. FIG. 1B is a top-down view of the exemplary structure of FIG. 1A. The vertical plane A-A' is the plane of the vertical cross-sectional view of FIG. 1A. FIG. 1C is a vertical cross-sectional view along the vertical plane C-C' of FIG. 1A. FIG. 1D is a vertical cross-sectional view along the vertical plane D-C' of FIG. 1A. Referring to FIGS. 1A-1D, an exemplary structure according to an embodiment of the present disclosure is illustrated, which includes a substrate containing a substrate single crystalline semiconductor layer 8. The substrate may include a semiconductor wafer such as a commercially available single crystalline silicon wafer. The thickness of the substrate may be in a range from 200 microns to 1 mm, although lesser and greater thicknesses may also be used.

An alternating stack of single crystalline silicon-germanium alloy layers 20 and single crystalline silicon layers 10 may be deposited on the top surface of the substrate single crystalline semiconductor layer 8 by epitaxial deposition process. Each of the single crystalline silicon-germanium alloy layers 20 and the single crystalline silicon layers 10 may be formed by an epitaxial deposition process in which a single crystalline silicon-germanium alloy material or a single crystalline silicon is deposited with epitaxial registry with underlying single crystalline semiconductor layers, i.e., the substrate single crystalline semiconductor layer 8 and any underlying single crystalline silicon-germanium alloy layer and/or any underlying single crystalline silicon layer.

In one embodiment, the single crystalline silicon-germanium alloy layers may include a respective single crystalline silicon-germanium alloy material including germanium at an atomic concentration in a range from 15% to 35%, such as from 20% to 30%, although lesser and greater atomic concentrations may also be used. The thickness of each single crystalline silicon-germanium alloy layer may be in a range from 4 nm to 20 nm, such as from 8 nm to 16 nm, although lesser and greater thicknesses may also be used. The single crystalline silicon-germanium alloy layer may, or may not, be doped with electrical dopants. In one embodiment, the single crystalline silicon layers may include single crystalline silicon. The thickness of each single crystalline silicon layer may be in a range from 4 nm to 20 nm, such as from 8 nm to 16 nm, although lesser and greater thicknesses may also be used.

The exemplary structure may include a field effect transistor region 300 in which gate-all-around (GAA) field effect transistors are to be subsequently formed, and a through-device-level connection region 400 in which through-device-level connection via structures are to be subsequently formed. A "device level" refers to a level in which semiconductor channels of field effect transistors are subsequently formed, and a "through-device-level" connection via structure refers to a connection via structure that extends through the device level.

Portions of the single crystalline silicon layers located the field effect transistor region 300 may be doped with electrically active dopant atoms, which may be p-type dopant atoms or n-type dopant atoms. Different portions of the single crystalline silicon layers located the field effect transistor region 300 may be doped with electrical dopants of different conductivity types. The atomic concentration of electrical dopants in the field effect transistor regions 300 may be in a range from $1.0 \times 10^{14}/cm^3$ to $1.0 \times 10^{17}/cm^3$, although lesser and greater dopant concentrations may also be used. P-type dopants and/or n-type dopants may be introduced into various portions of the field effect transistor regions 300 by performing masked ion implantation processes.

Optionally, a silicon oxide liner (not shown) may be formed over the alternating stack of single crystalline silicon-germanium alloy layers and single crystalline silicon layers. If present, the silicon oxide liner may have a thickness in a range from 1 nm to 3 nm, although lesser and greater thicknesses may also be used. A hard mask layer may be deposited over the alternating stack of single crystalline silicon-germanium alloy layers and single crystalline silicon layers. The hard mask layer includes a hard mask material such as silicon nitride, and may have a thickness in a range from 20 nm to 40 nm, although lesser and greater thicknesses may also be used. Additional material layer such as a semiconductor liner (not shown) and a dielectric cover layer (not shown) may be optionally formed above the hard mask layer. A photoresist layer (not shown) may be applied over the layer stack including the hard mask layer and may be lithographically patterned to form patterns having edges that laterally extend along a first horizontal direction hd1. The edges may be laterally spaced apart along a second horizontal direction hd2 that is perpendicular to the first horizontal direction hd1. A portion of the pattern in the photoresist layer in the field effect transistor region 300 defines the area of channels of a field effect transistor to be subsequently formed. Portions of the pattern in the photoresist layer in the through-device-level connection region 400 define areas in which connection via structures are to be subsequently formed. In an illustrative example, two patterned portions of the photoresist layer may be provided in the through-device-level connection region 400 to provide subsequent formation of a pair of connection via structures. An anisotropic etch process may be performed to transfer the pattern in the photoresist layer through underlying material layers. Fin stack structures including patterned portions of the underlying material layers and the top portion of the substrate single crystalline semiconductor layer 8 may be formed.

Each fin stack structure may include, from bottom to top, a semiconductor plate stack (10, 20) that is an alternating stack of silicon-germanium plates 20 and semiconductor channel plates 10, an optional silicon oxide liner, and a hard mask plate 130 that is a patterned portion of the hard mask layer, and optionally additional overlying temporary structures (not show) that may be subsequently facilitate various planarization processes to be subsequently performed and removed during, or after, planarization processes.

A fin stack structure (10, 20, 130) may extend across the field effect transistor region 300 and the through-device-level connection region 400. The portion of the fin stack structure (10, 20, 130) in the field effect transistor region 300 may have a uniform width, which may be in a range from 100 nm to 1,000 nm, although lesser and greater widths may also be used. While the present disclosure is described using an embodiment in which a gate-all-around field effect transistor to be formed in the field effect transistor region 300 is a power field effect transistor configured to provide high on-current, embodiments of the present disclosure may be used for gate-all-around field effect transistors of any size. Use of the device of the present disclosure for gate-all-around field effect transistors of any size is expressly contemplated herein. The fin stack structure (10, 20, 130) may have edges that laterally extend along the first horizontal direction hd1.

Generally, a semiconductor plate stack (10, 20) including at least one semiconductor channel plate 10 and at least one silicon-germanium plate 20 may be formed over a substrate. A hard mask plate 130 may be formed above the semiconductor plate stack (10, 20). In one embodiment, sidewalls of a fin stack structure (10, 20, 130) may be vertically coincident, i.e., may be located within a same vertical plane. For example, sidewalls of the hard mask plate 130 of a fin stack structure (10, 20, 130) may be vertically coincident with sidewalls of the semiconductor plate stack (10, 20).

Figure 2A:
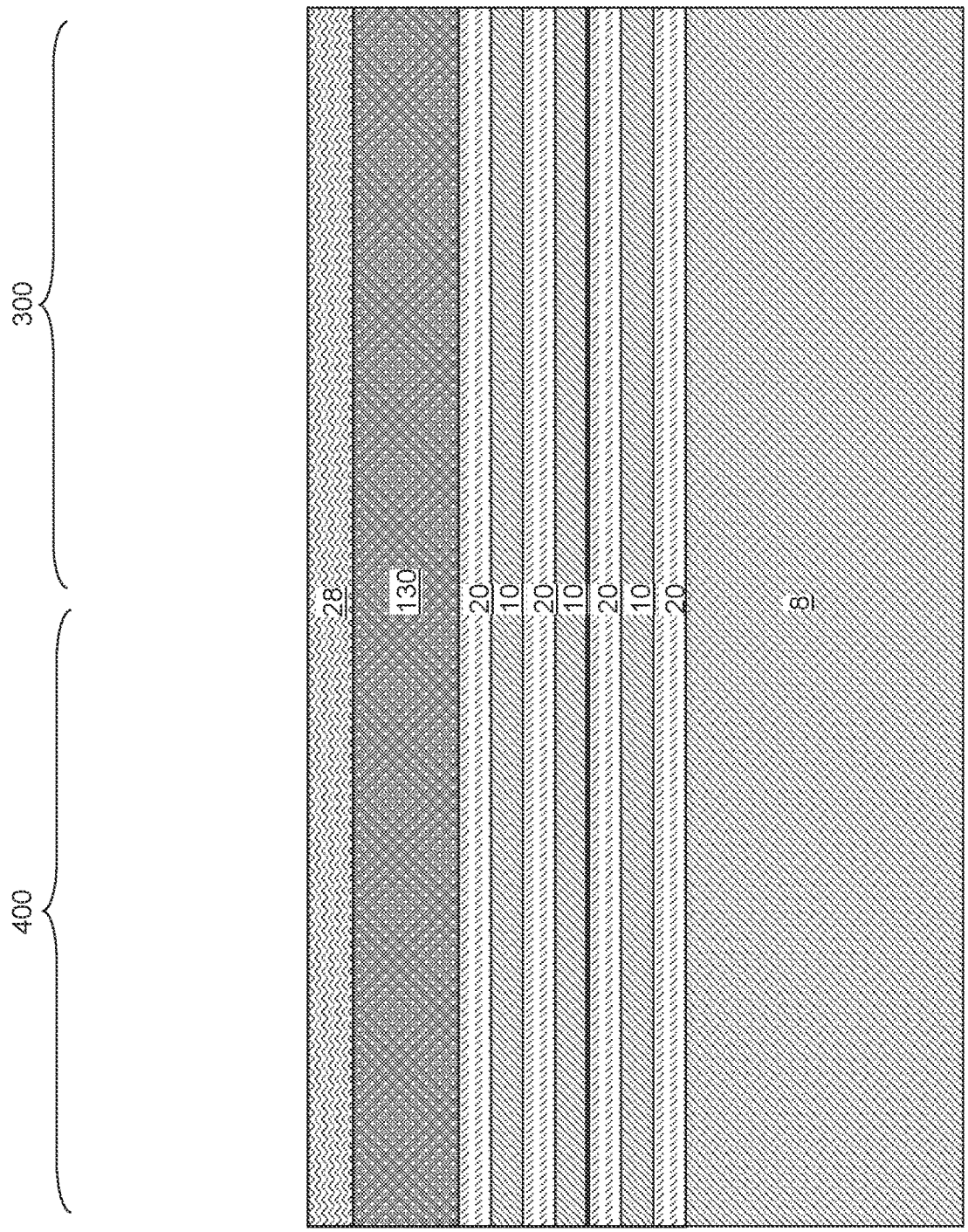
FIG. 2A is a vertical cross-sectional view of the exemplary structure after formation of cladding silicon-germanium alloy structures according to an embodiment of the present disclosure.
Figure 2B:
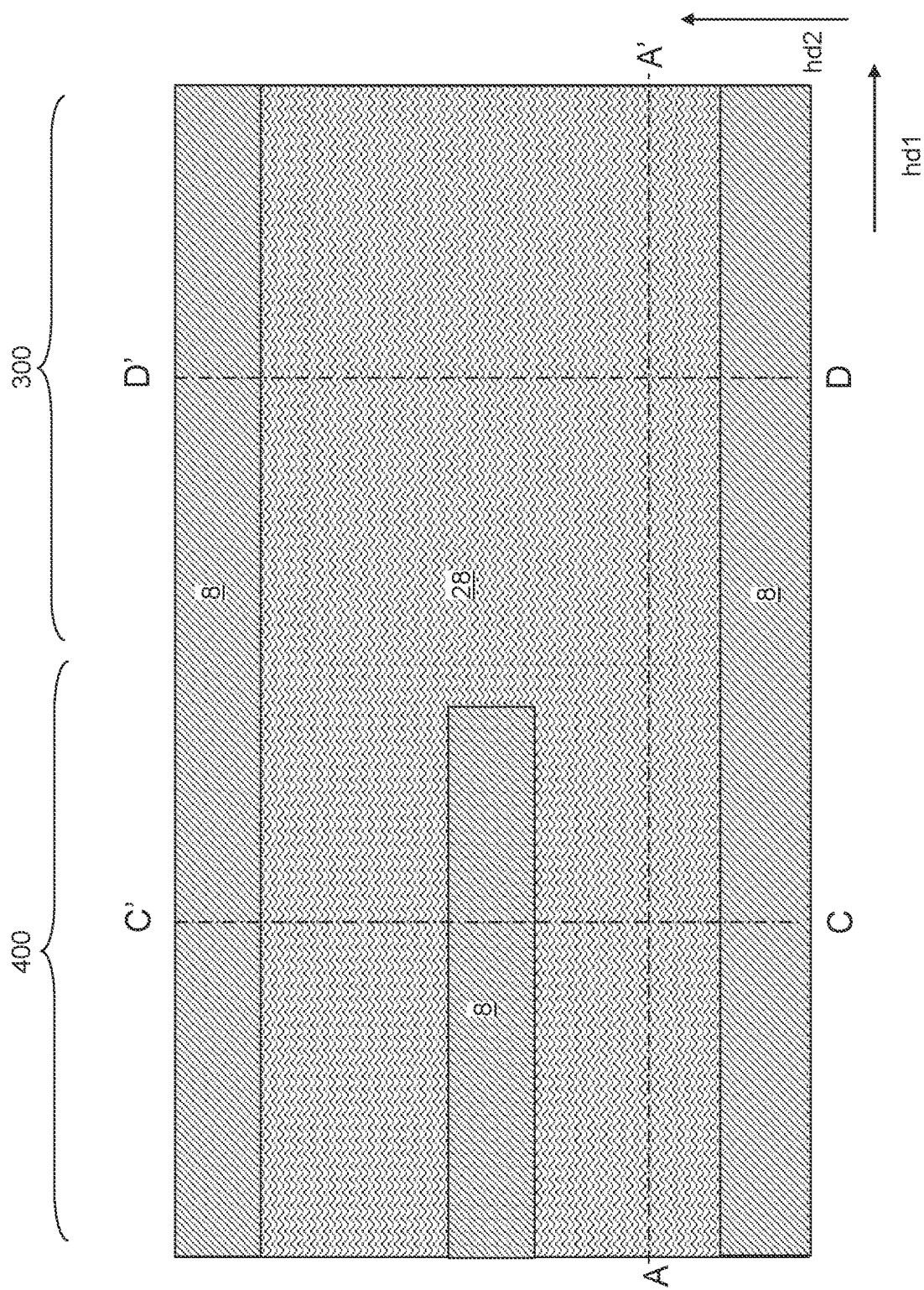
FIG. 2B is a top-down view of the exemplary structure of FIG. 2A. The vertical plane A-A' is the plane of the vertical cross-sectional view of FIG. 2A.

FIG. 2A is a vertical cross-sectional view of the exemplary structure after formation of cladding silicon-germanium alloy structures according to an embodiment of the present disclosure. FIG. 2B is a top-down view of the exemplary structure of FIG. 2A. The vertical plane A-A' is the plane of the vertical cross-sectional view of FIG. 2A. FIG. 2C is a vertical cross-sectional view along the vertical plane C-C' of FIG. 2A. FIG. 2D is a vertical cross-sectional view along the vertical plane D-C' of FIG. 2A. Referring to FIGS. 2A-2D, a silicon-germanium alloy may be anisotropically deposited by an anisotropic deposition process such as a plasma-enhanced physical vapor deposition (PECVD) process. A silicon-germanium alloy layer is deposited with a greater thickness over the top surfaces of the hard mask plates 130 than on the top surfaces of the substrate single crystalline semiconductor layer due to the anisotropic nature of the deposition process. The silicon-germanium alloy layer may include germanium at an atomic concentration in a range from 25% to 45%, such as from 30% to 40%, although lesser and greater thicknesses may also be used. In one embodiment, the atomic percentage of germanium in the silicon-germanium alloy layer may be higher than the atomic concentration of germanium in the silicon-germanium plates 20 to provide selective lateral recessing of the material of the silicon-germanium alloy layer relative to the silicon-germanium plates 20. The silicon-germanium alloy layer may be polycrystalline. In one embodiment, the anisotropic deposition process may be depletive to facilitate deposition of a thicker film on the top surfaces of the hard mask plates 130 than on the top surfaces of the substrate single crystalline semiconductor layer 8. The silicon-germanium alloy may be formed on sidewalls of the semiconductor plate stacks (10, 20) and the hard mask plates 130.

An anisotropic etch process may be performed to vertically recess horizontal portions of the deposited silicon-germanium alloy layer. The duration of the anisotropic etch process may be selected such that horizontal portions of the silicon-germanium alloy layer located on top of the substrate single crystalline semiconductor layer 8 are removed, while horizontal portions of the silicon-germanium alloy layer overlying the top surfaces of the hard mask plates 130 are not completely removed. Each continuous remaining portion of the silicon-germanium alloy layer is herein referred to as a cladding silicon-germanium alloy structure 28. Each cladding silicon-germanium alloy structure 28 may have an inverted U-shaped vertical cross-sectional profile. Each sidewall of the cladding silicon-germanium alloy structures 28 may have a lateral thickness in a range from 6 nm to 20 nm, although lesser and greater thicknesses may also be used. The vertical thickness of the horizontal top portion of each cladding silicon-germanium alloy structure 28 may be in a range from 6 nm to 20 nm, although lesser and greater vertical thicknesses may also be used.

Figure 3A:
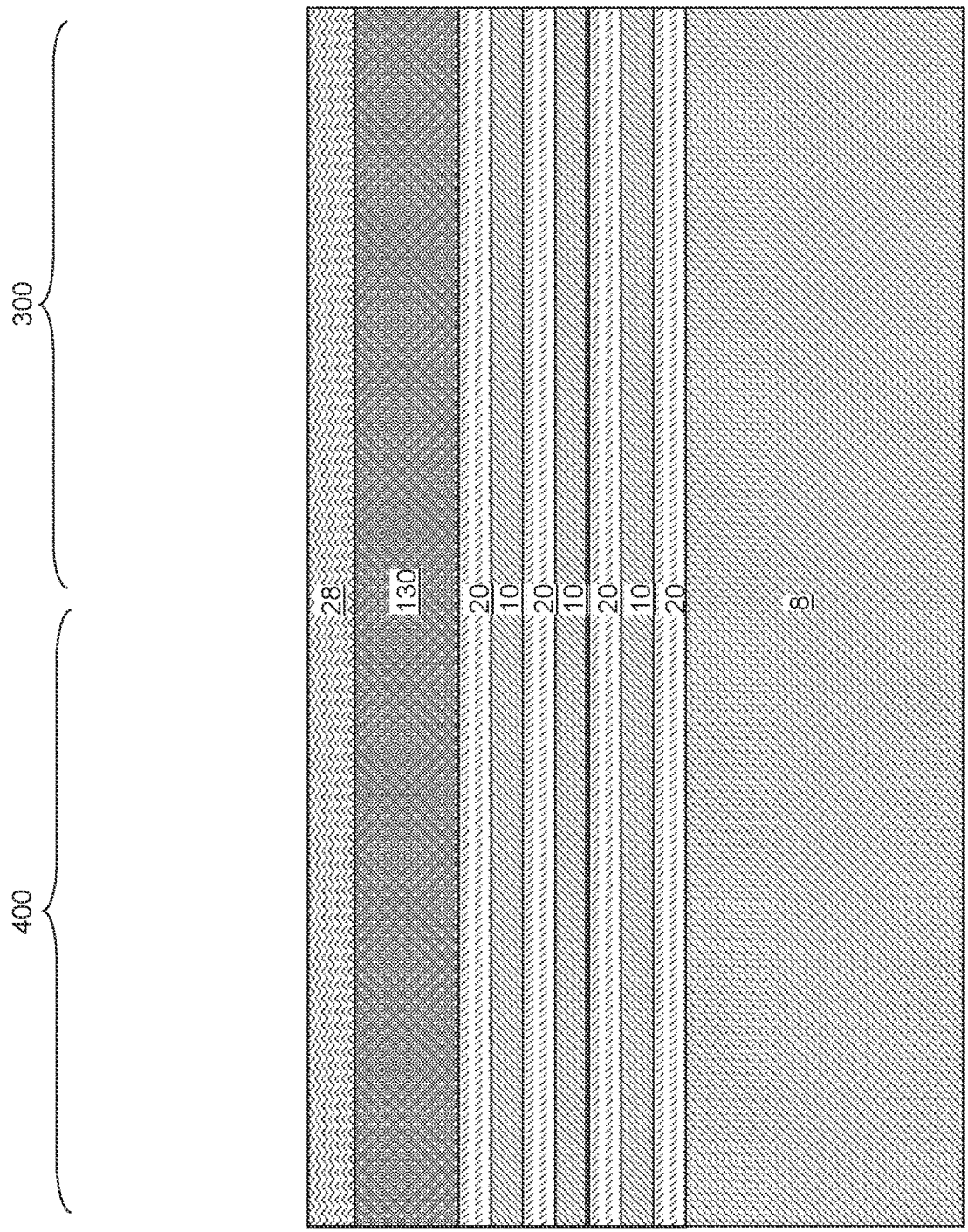
FIG. 3A is a vertical cross-sectional view of the exemplary structure after formation of hybrid dielectric fins and etch stop dielectric fins according to an embodiment of the present disclosure.
Figure 3B:
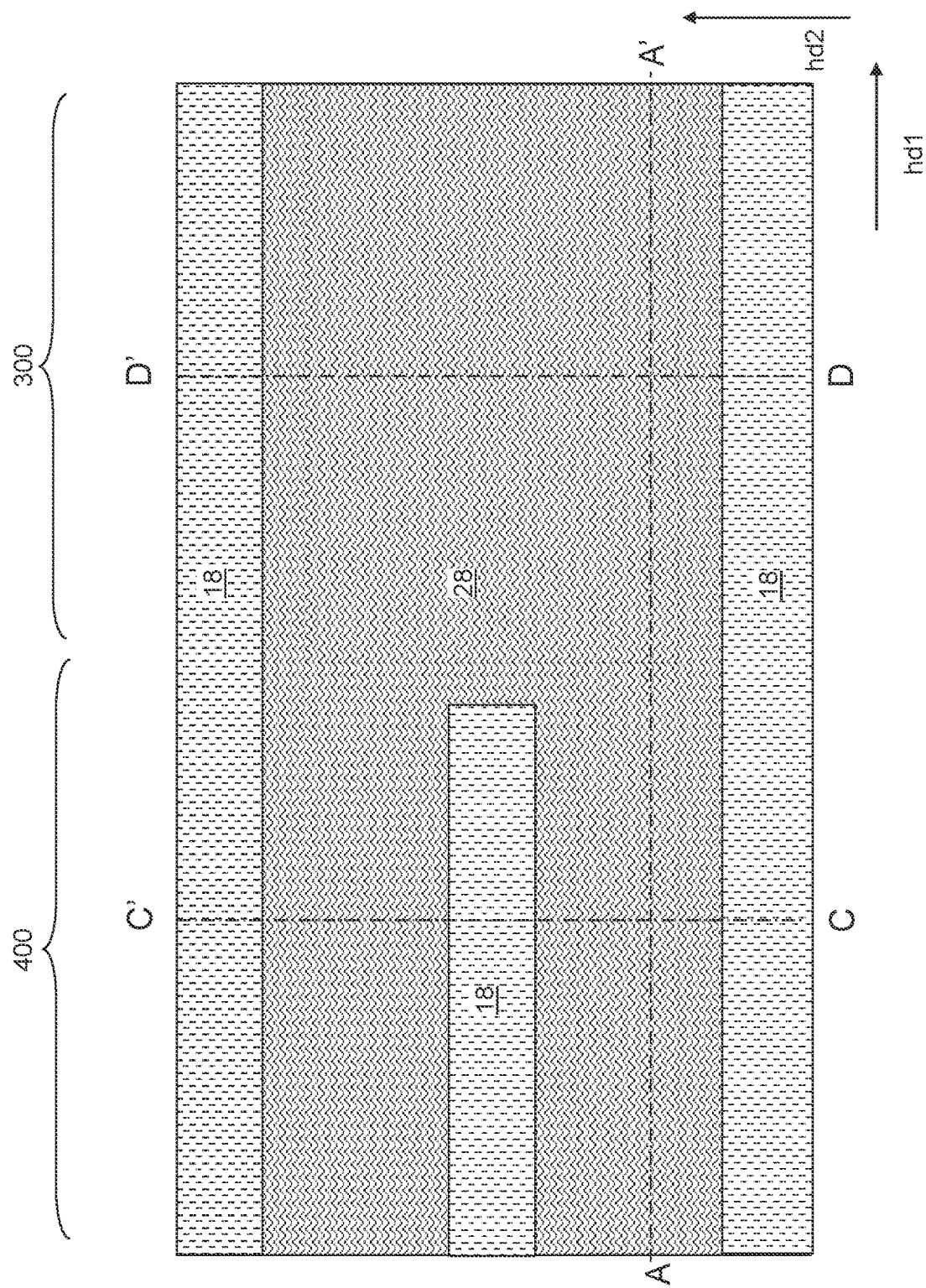
FIG. 3B is a top-down view of the exemplary structure of FIG. 3A. The vertical plane A-A' is the plane of the vertical cross-sectional view of FIG. 3A.
Figure 3D:
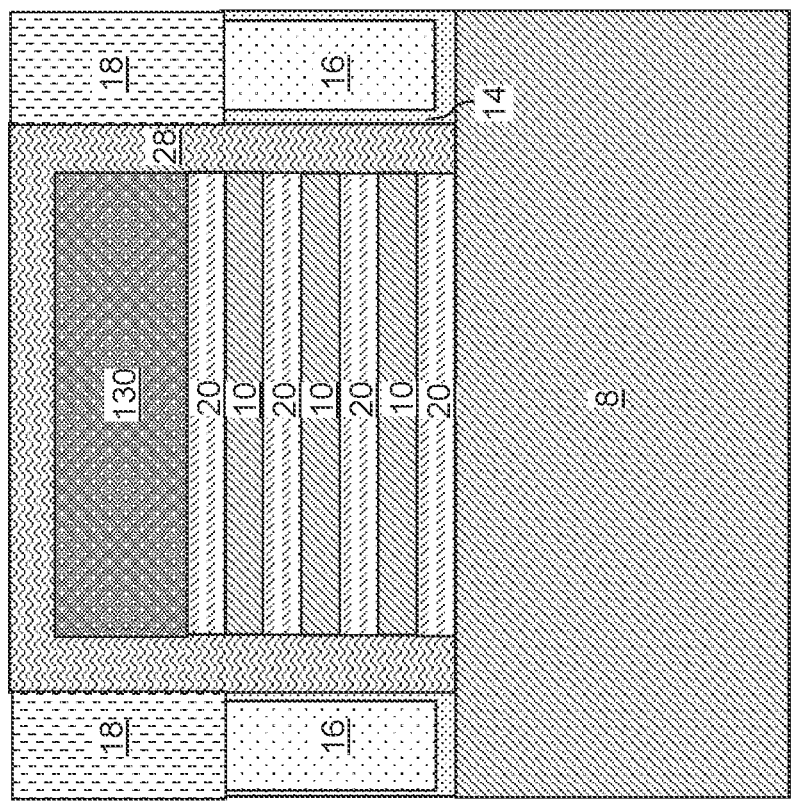
FIG. 3D is a vertical cross-sectional view along the vertical plane D-C' of FIG. 3A.
Figure 3C:
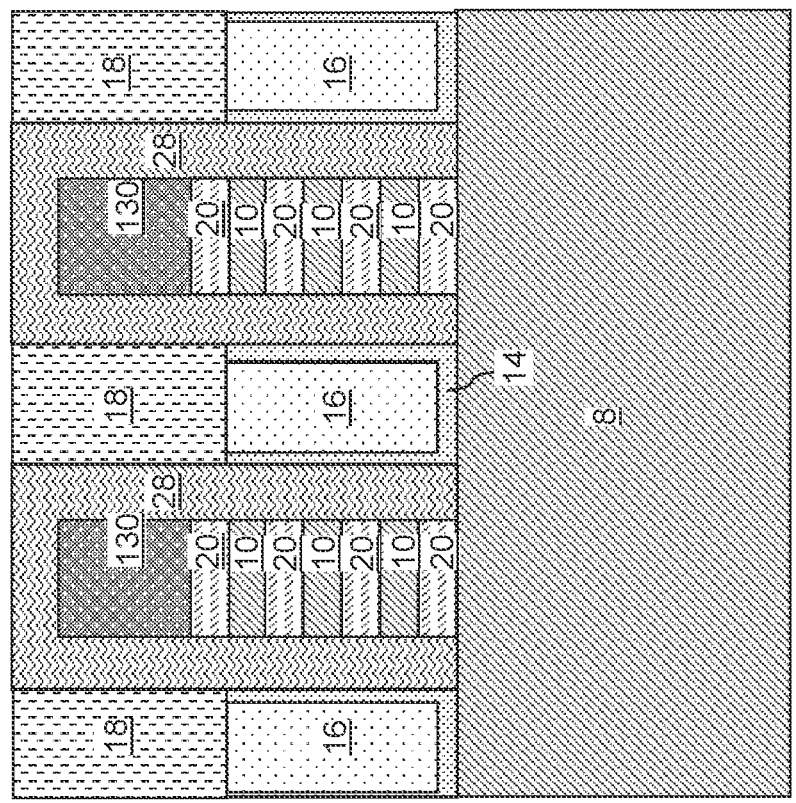
FIG. 3C is a vertical cross-sectional view along the vertical plane C-C' of FIG. 3A.

FIG. 3A is a vertical cross-sectional view of the exemplary structure after formation of hybrid dielectric fins and etch stop dielectric fins according to an embodiment of the present disclosure. FIG. 3B is a top-down view of the exemplary structure of FIG. 3A. The vertical plane A-A' is the plane of the vertical cross-sectional view of FIG. 3A. FIG. 3C is a vertical cross-sectional view along the vertical plane C-C' of FIG. 3A. FIG. 3D is a vertical cross-sectional view along the vertical plane D-C' of FIG. 3A. Referring to FIGS. 3A-3D, hybrid dielectric fins (14, 16) are formed in the trenches between cladding silicon-germanium alloy structures 28. Each hybrid dielectric fin (14, 16) may include a dielectric fin liner 14 and a dielectric fill material portion 16. The hybrid dielectric fins (14, 16) may be formed by conformally depositing a dielectric fin liner layer and a silicon oxide fill material, and by removing portions of the dielectric fin liner layer and the silicon oxide fill material from above the horizontal plane including the top surfaces of the cladding silicon-germanium alloy structures 28. Each dielectric fin liner 14 includes a dielectric material having a dielectric constant not greater than 7.9. For example, each dielectric fin liner 14 may include a material such as silicon nitride, silicon carbide nitride, or silicon carbide oxynitride. The thickness of each dielectric fin liner 14 may be in a range from 5 nm to 10 nm, although lesser and greater thicknesses may also be used. Each dielectric fill material portion 16 may include undoped silicate glass or a doped silicate glass. Each hybrid dielectric fin (14, 16) laterally extends along the first horizontal direction hd1.

The top surfaces of the hybrid dielectric fins (14, 16) may be vertically recessed by performing at least one etch process, which may include at least one isotropic etch process (such as a wet etch process) and/or at least one anisotropic etch process (such as a reactive ion etch process). The top surfaces of the recessed hybrid dielectric fins (14,16) may be located between the horizontal plane including the interface between the topmost silicon-germanium plates 20 and the hard mask plates 130 and the horizontal plane including the interface between the topmost silicon-germanium plates 20 and the topmost semiconductor channel plates 10.

An etch stop dielectric material may be deposited in the trenches overlying the hybrid dielectric fins (14, 16) between each neighboring pair of cladding silicon-germanium alloy structures 28. The etch stop dielectric material includes a dielectric material that may be subsequently used as an etch stop material. For example, the etch stop dielectric material may include aluminum oxide, hafnium oxide, lanthanum oxide, or silicon carbide nitride. Other suitable dielectric materials are within the contemplated scope of disclosure. In one embodiment, the etch stop dielectric material may include a metal oxide dielectric material having a dielectric constant greater than 7.9. Optionally, a silicon oxide material layer may be deposited over the etch stop dielectric material to facilitate a subsequent chemical mechanical planarization (CMP), which is performed to remove the silicon oxide material layer and excess portions of the etch stop dielectric material from above the horizontal plane including the top surfaces of the cladding silicon-germanium alloy structures 28. Each remaining portion of the etch stop dielectric material comprises an etch stop dielectric fin 18. The top surfaces of the etch stop dielectric fins 18 may be in the same horizontal plane as the top surfaces of the cladding silicon-germanium alloy structures 28.

Figure 4A:
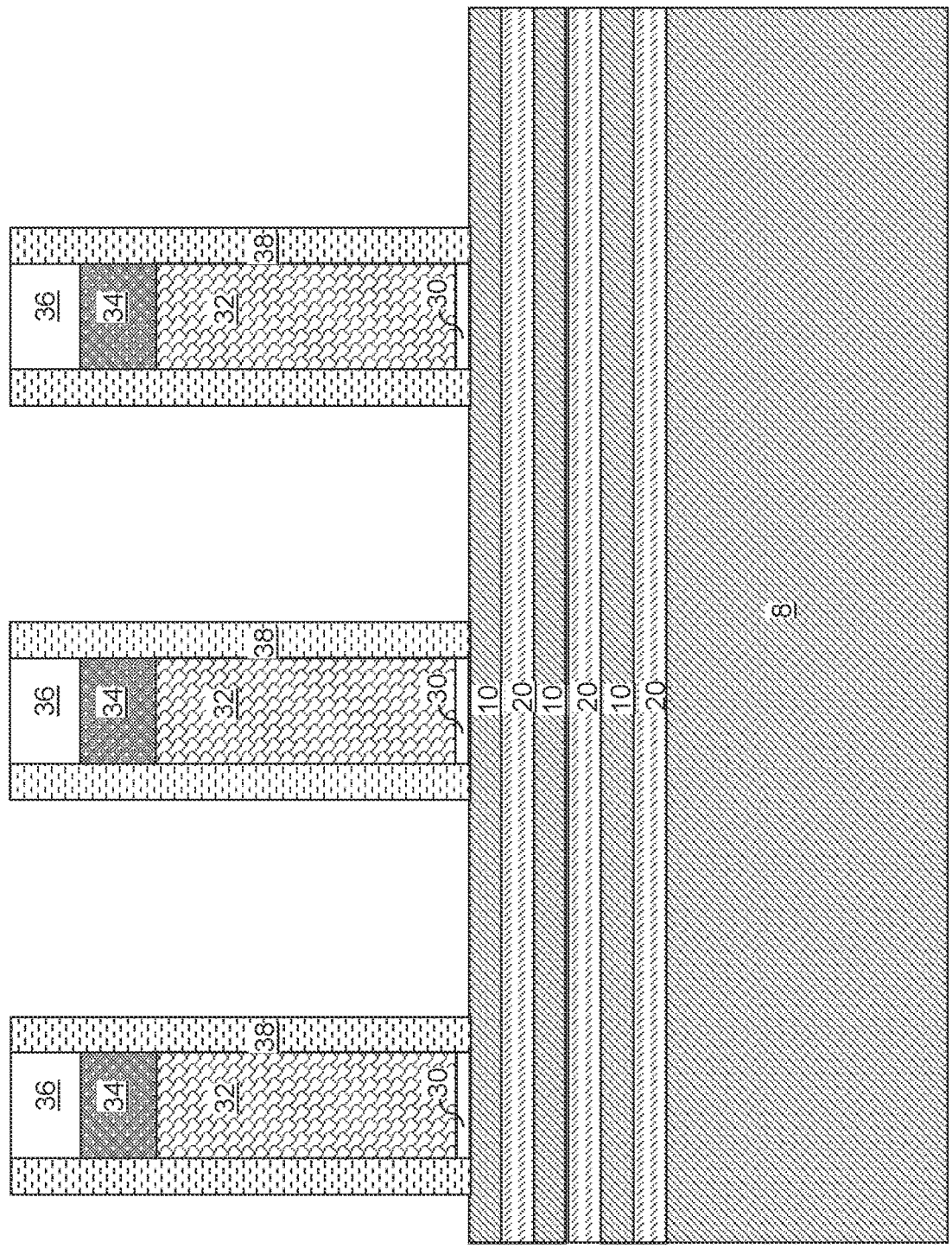
FIG. 4A is a vertical cross-sectional view of the exemplary structure after removal of hard mask fins and upper portions of the cladding silicon-germanium alloy structures, formation of gate template structures including a respective set of a sacrificial gate liner, a sacrificial gate structure, a sacrificial gate cap, and a gate mask structure, and formation of gate template spacers according to an embodiment of the present disclosure.
Figure 4B:
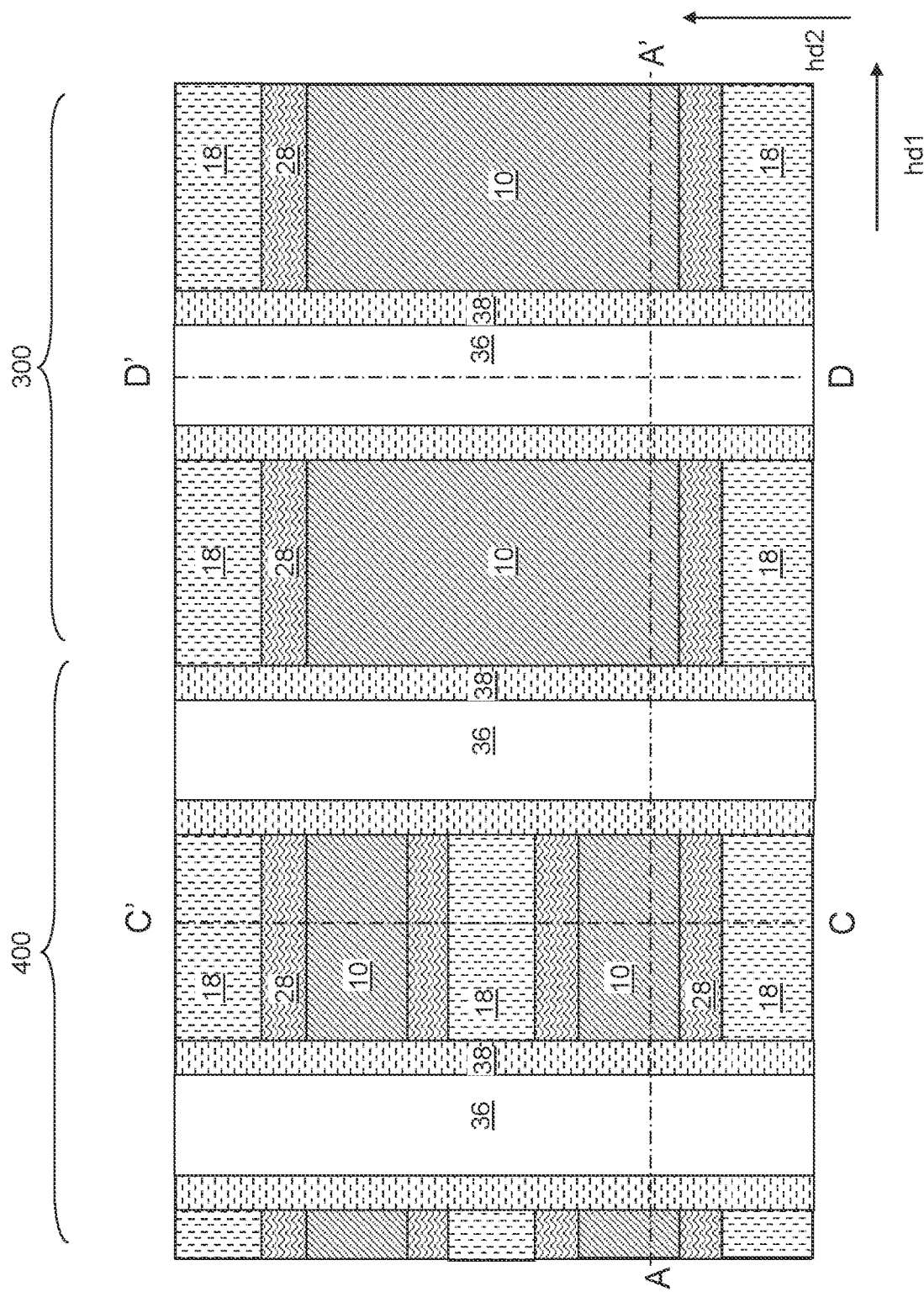
FIG. 4B is a top-down view of the exemplary structure of FIG. 4A. The vertical plane A-A' is the plane of the vertical cross-sectional view of FIG. 4A.
Figure 4D:
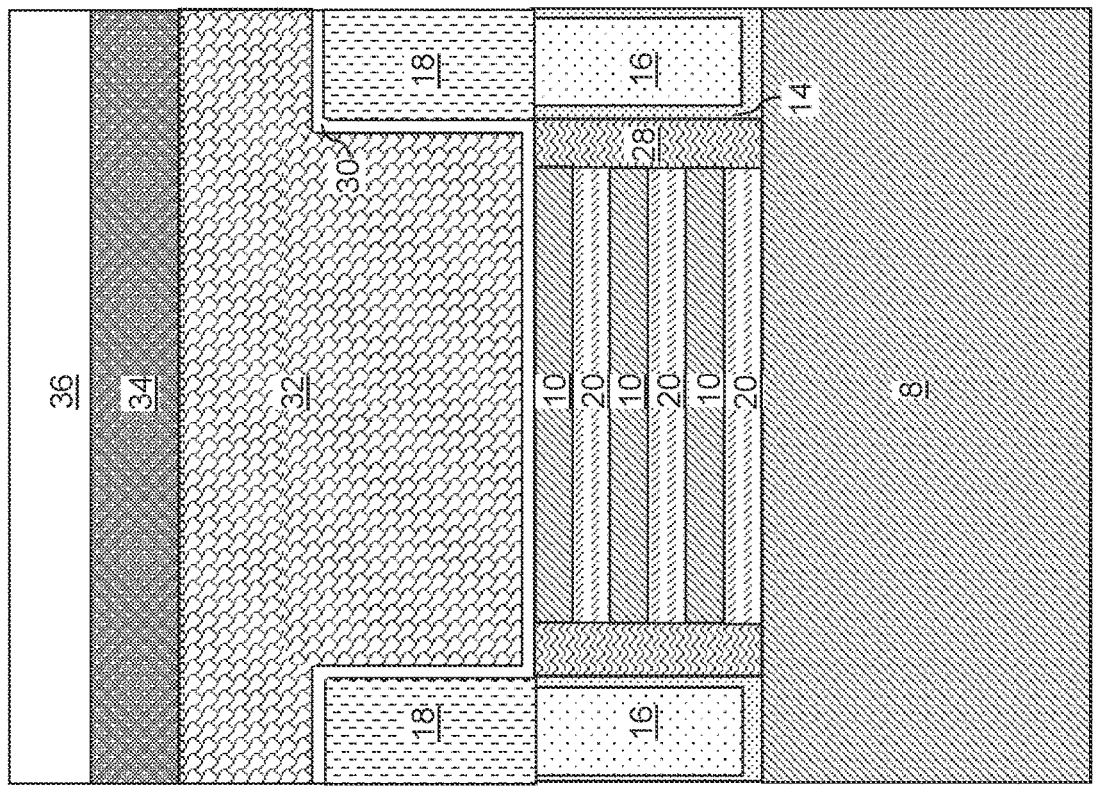
FIG. 4D is a vertical cross-sectional view along the vertical plane D-C' of FIG. 4A.
Figure 4C:
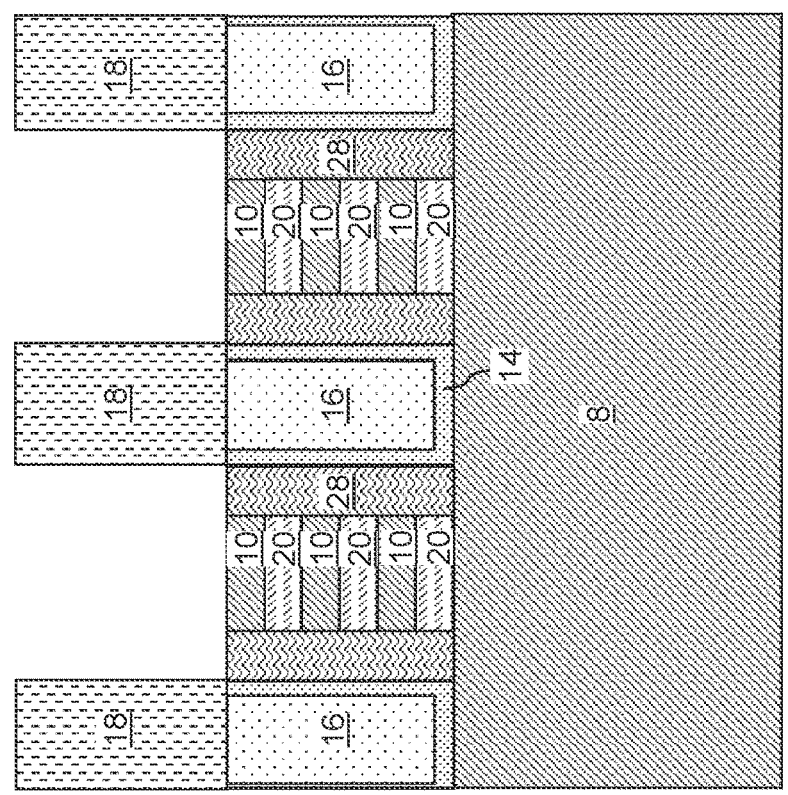
FIG. 4C is a vertical cross-sectional view along the vertical plane C-C' of FIG. 4A.

FIG. 4A is a vertical cross-sectional view of the exemplary structure after removal of hard mask fins and upper portions of the cladding silicon-germanium alloy structures, formation of gate template structures including a respective set of a sacrificial gate liner, a sacrificial gate structure, a sacrificial gate cap, and a gate mask structure, and formation of gate template spacers according to an embodiment of the present disclosure. FIG. 4B is a top-down view of the exemplary structure of FIG. 4A. The vertical plane A-A' is the plane of the vertical cross-sectional view of FIG. 4A. FIG. 4C is a vertical cross-sectional view along the vertical plane C-C' of FIG. 4A. FIG. 4D is a vertical cross-sectional view along the vertical plane D-C' of FIG. 4A. Referring to FIGS. 4A-4D, top portions of the cladding silicon-germanium alloy structures 28 may be removed, for example, by performing a wet etch process. In an illustrative example, the wet etch process may use a mixture of ammonium hydroxide and hydrogen peroxide, or a mixture of hydrofluoric acid, nitric acid, acetic acid, glycerin, and/or water.

Subsequently, the hard mask plates 130 may be removed selectively by an isotropic etch process. For example, a wet etch process using hot phosphoric acid may be performed to remove the hard mask plates 130. Physically exposed sidewall portions of the cladding silicon-germanium alloy structures 28 may be subsequently removed by performing another wet etch process. Each topmost silicon-germanium plate 20 may be collaterally etched by the wet etch process simultaneously with removal of the physically exposed sidewall portions of the cladding silicon-germanium alloy structures 28. Remaining portions of the cladding silicon-germanium alloy structures 28 may be located below the horizontal plane including the top surfaces of the topmost semiconductor channel plates 10. Inter-fin recesses may be formed between neighboring pairs of etch stop dielectric fins 18.

Gate template structures (30, 32, 34, 36) including a respective set of a sacrificial gate liner 30, a sacrificial gate structure 32, a sacrificial gate cap 34, and a gate mask structure 36 may be formed over the etch stop dielectric fins 18, the semiconductor plate stacks (10, 20), and the cladding silicon-germanium alloy structures 28, For example, a continuous sacrificial gate liner layer and a continuous sacrificial gate structure material layer may be deposited and planarized to provide a horizontal planar surface. The continuous sacrificial gate liner layer may include a conformal silicon oxide liner having a thickness in a range from 5 nm to 10 nm, although lesser and greater thicknesses may also be used. The continuous sacrificial gate structure material layer includes a sacrificial material that may be removed selective to the material of the continuous sacrificial gate liner layer. For example, the continuous sacrificial gate structure material layer may include, for example, polysilicon. The top surface of the continuous sacrificial gate structure material layer may be planarized by chemical mechanical planarization. The vertical thickness of the continuous sacrificial gate structure material layer over the etch stop dielectric fins 18 may be in a range from 100 nm to 200 nm, although lesser and greater thicknesses may also be used.

A continuous sacrificial gate cap material layer may be subsequently deposited over the continuous sacrificial gate structure material layer. The continuous sacrificial gate cap material layer may include, for example, silicon nitride. The thickness of the continuous sacrificial gate cap material layer may be in a range from 20 nm to 40 nm, although lesser and greater thicknesses may also be used. A continuous gate mask material layer may be deposited over the continuous sacrificial gate cap material layer. The continuous gate mask material layer includes a hard gate mask material such as silicon oxide. The thickness of the continuous gate mask material layer may be in a range from 20 nm to 40 nm, although lesser and greater thicknesses may also be used.

The layer stack of the continuous gate mask material layer, the continuous sacrificial gate cap material layer, the continuous sacrificial gate structure material layer, and the continuous sacrificial gate liner layer may be patterned into the gate template structures (30, 32, 34, 36), for example, by applying and patterning a photoresist layer (not shown) thereabove, and by performing an anisotropic etch process that transfers the pattern in the photoresist material layer thorough the layer stack. The pattern in the photoresist layer may be a line and space pattern in which each line laterally extends along the second horizontal direction hd2, and each space laterally extends along the second horizontal direction hd2. The anisotropic etch process may include multiple anisotropic etch processes for removing the various material layers in the layer stack. The terminal step of the anisotropic etch process may etch through unmasked portions of the continuous sacrificial gate liner layer. Alternatively, the unmasked portions of the continuous sacrificial gate liner layer may be removed by an isotropic etch process such as a wet etch process using dilute hydrofluoric acid. The photoresist layer may be subsequently removed, for example, by ashing.

Each patterned portion of the continuous sacrificial gate liner layer comprises a sacrificial gate liner 30. Each patterned portion of the continuous sacrificial gate structure material layer comprises a sacrificial gate structure 32. Each patterned portion of the continuous sacrificial gate cap material layer comprises a sacrificial gate cap 34. Each patterned portion of the continuous gate mask material layer comprises a gate mask structure 36. Each gate template structures (30, 32, 34, 36) may have a uniform width along the first horizontal direction hd1, which may be in a range from 10 nm to 200 nm, such as from 20 nm to 100 nm, although lesser and greater widths may also be used. The spacing between a neighboring pair of gate template structures (30, 32, 34, 36) may be in a range from 40 nm to 400 nm, such as from 80 nm to 200 nm, although lesser and greater spacings may also be used.

A dielectric gate spacer material layer may be conformally deposited over the gate template structures (30, 32, 34, 36). The dielectric gate spacer material layer includes a dielectric material such as silicon nitride or silicon carbide nitride. The thickness of the dielectric gate spacer material layer may be in a range from 5 nm to 15 nm, although lesser and greater thicknesses may also be used. An anisotropic etch process may be performed to etch horizontal portions of the dielectric gate spacer material layer. Each remaining vertical portion of the dielectric gate spacer material layer comprises a dielectric gate spacer 38. Each dielectric gate spacer 38 may contact a sidewall of a respective gate template structure (30, 32, 34, 36), and may have laterally extend along the second horizontal direction hd2 with a uniform thickness, which may be in a range from 5 nm to 15 nm, though lesser and greater thicknesses may also be used.

Figure 5A:
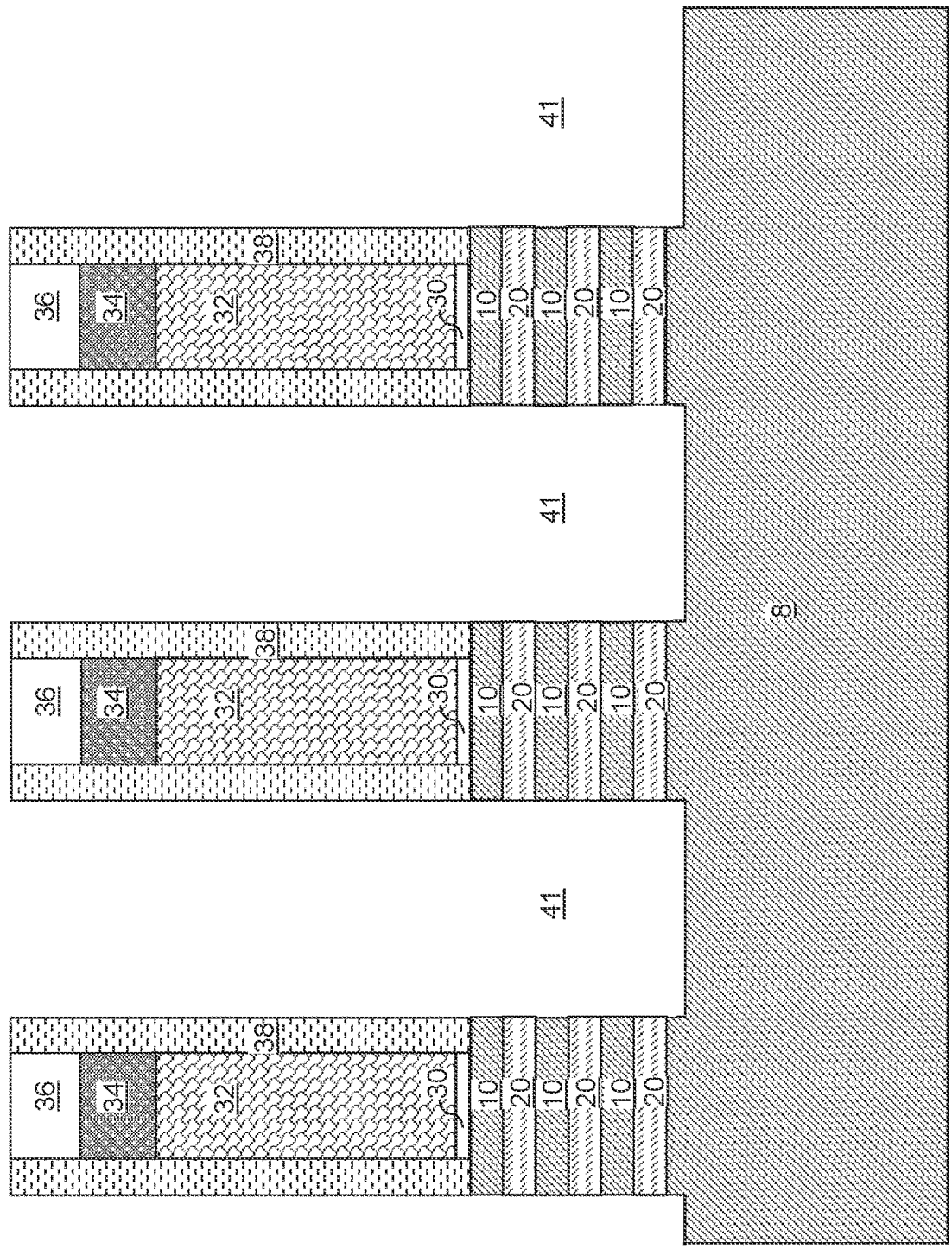
FIG. 5A is a vertical cross-sectional view of the exemplary structure after removing end portions of semiconductor fin stacks according to an embodiment of the present disclosure.
Figure 5B:
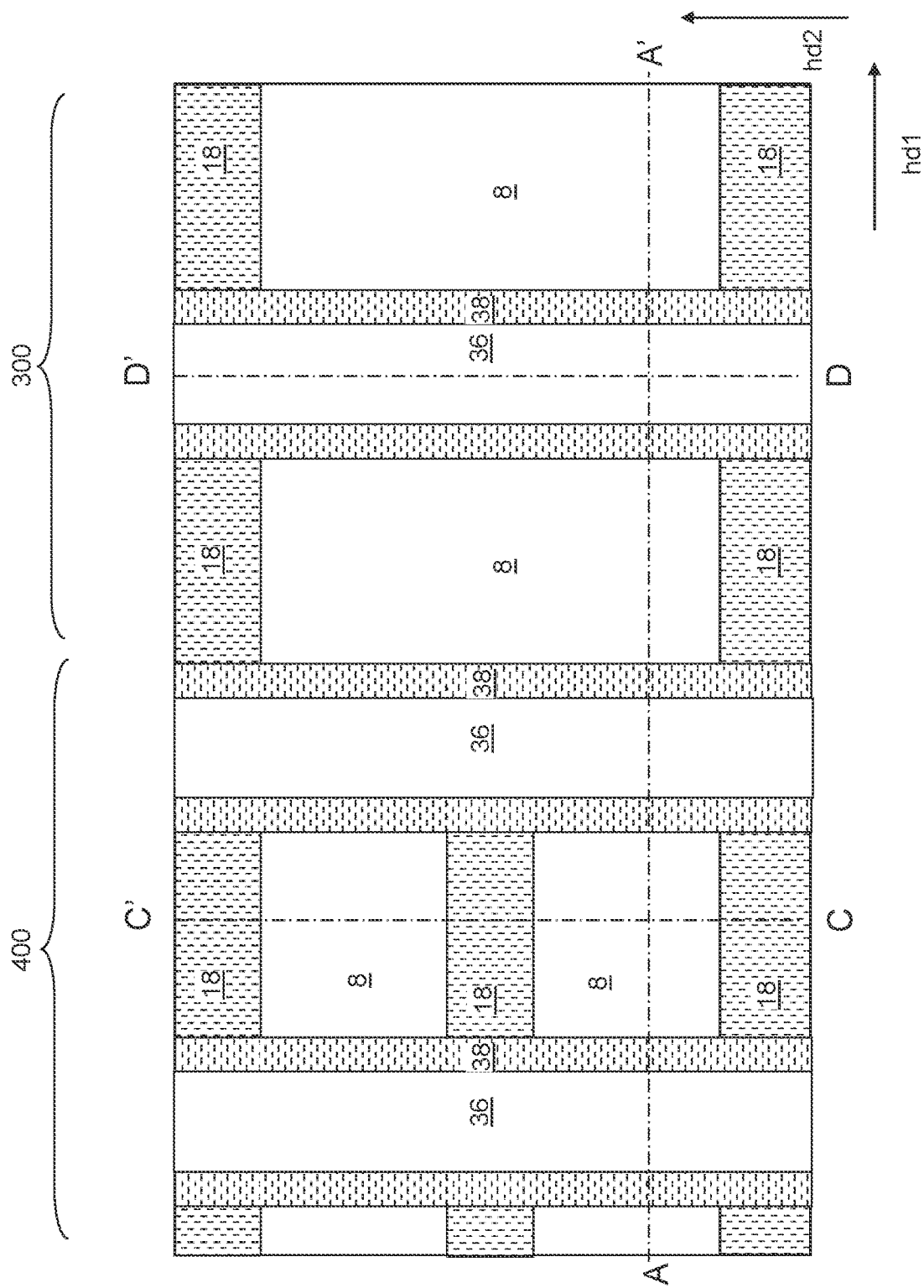
FIG. 5B is a top-down view of the exemplary structure of FIG. 5A. The vertical plane A-A' is the plane of the vertical cross-sectional view of FIG. 5A.
Figure 5D:
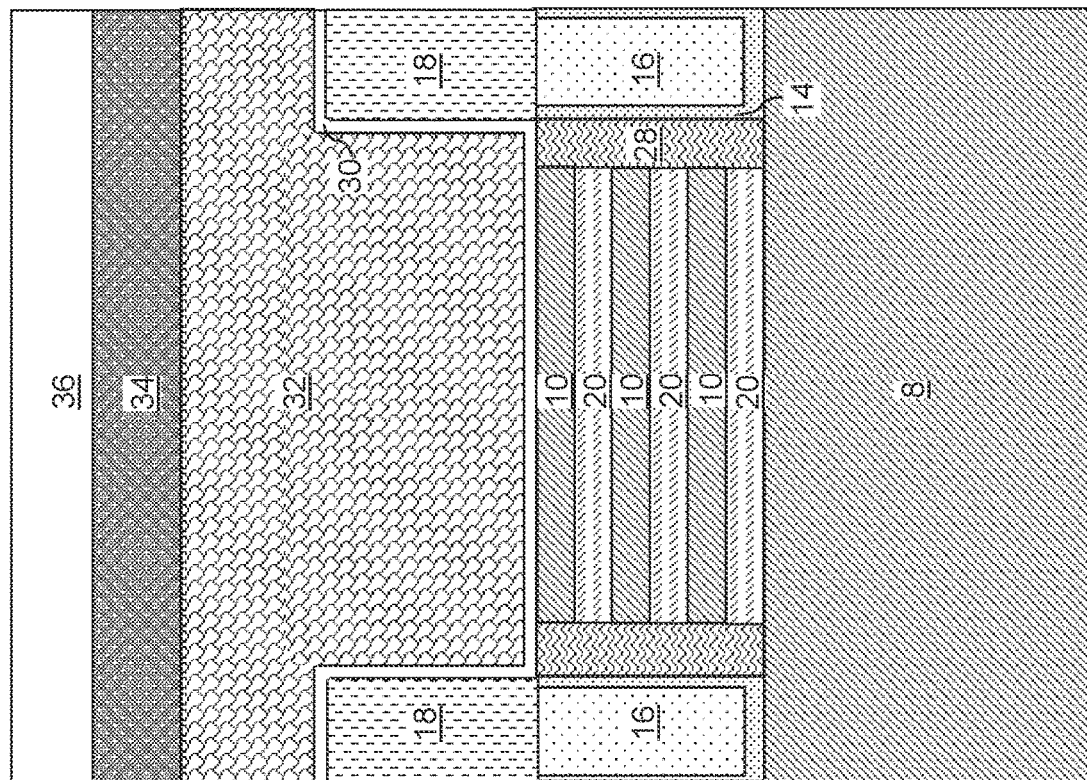
FIG. 5D is a vertical cross-sectional view along the vertical plane D-D' of FIG. 11B.
Figure 5C:
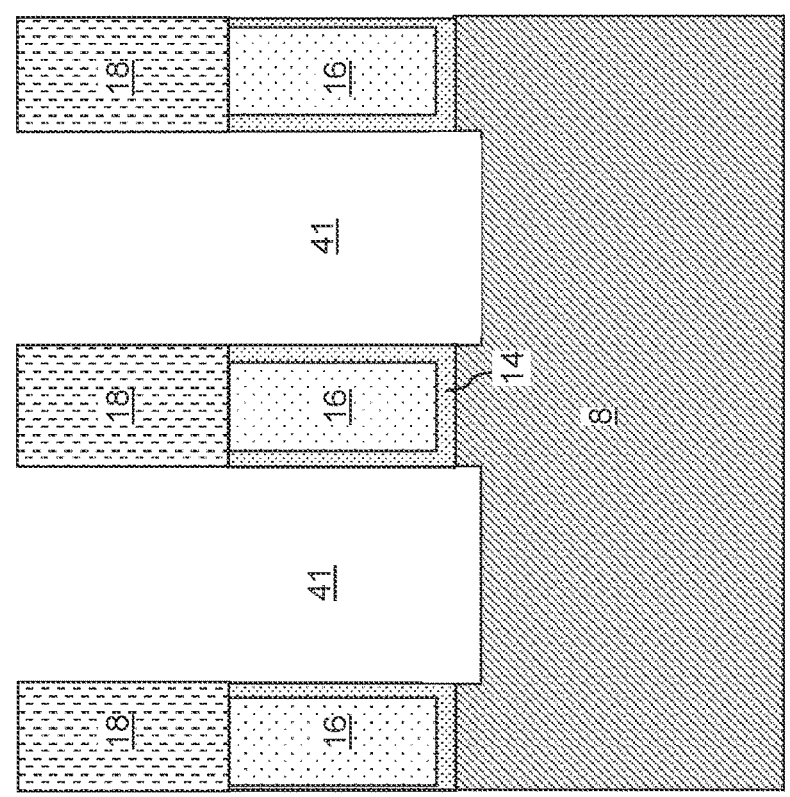
FIG. 5C is a vertical cross-sectional view along the vertical plane C-C' of FIG. 5B.

FIG. 5A is a vertical cross-sectional view of the exemplary structure after removing end portions of semiconductor fin stacks according to an embodiment of the present disclosure. FIG. 5B is a top-down view of the exemplary structure of FIG. 5A. The vertical plane A-A' is the plane of the vertical cross-sectional view of FIG. 5A. FIG. 5C is a vertical cross-sectional view along the vertical plane C-C' of FIG. 5B. FIG. 5D is a vertical cross-sectional view along the vertical plane D-D' of FIG. 11B. Referring to FIGS. 5A-5D, an anisotropic etch process may be performed to etch portions of the semiconductor plate stacks (10, 20) and the cladding silicon-germanium alloy structures 28 that are not masked by the gate template structure (30, 32, 34, 36), the dielectric gate spacers 38, or the etch stop dielectric fins 18 are removed by the anisotropic etch process. The anisotropic etch formed a source/drain cavity 41 in volumes from which portions of the semiconductor plate stacks (10, 20) and the cladding silicon-germanium alloy structures 28 are removed. The source/drain cavities 41 collectively refer to source cavities and drain cavities. A top surface of the substrate single crystalline semiconductor layer 8 may be physically exposed at the bottom each source/drain cavity 41.

Each semiconductor plate stack (10, 20) may be divided into multiple discrete semiconductor plate stacks (10, 20) that underlie a respective one of the gate template structures (30, 32, 34, 36). Each semiconductor plate stack (10, 20) may have vertical sidewalls that are vertically coincident with overlying sidewalls of the dielectric gate spacers 38. Further, each cladding silicon-germanium alloy structure 28 may be divided into a plurality of cladding silicon-germanium alloy structures 28 that underlie a respective one of the gate template structures (30, 32, 34, 36). Sidewall of the plurality of cladding silicon-germanium alloy structures 28 may be vertically coincident with sidewalls of the gate template structures (30, 32, 34, 36).

Figure 6A:
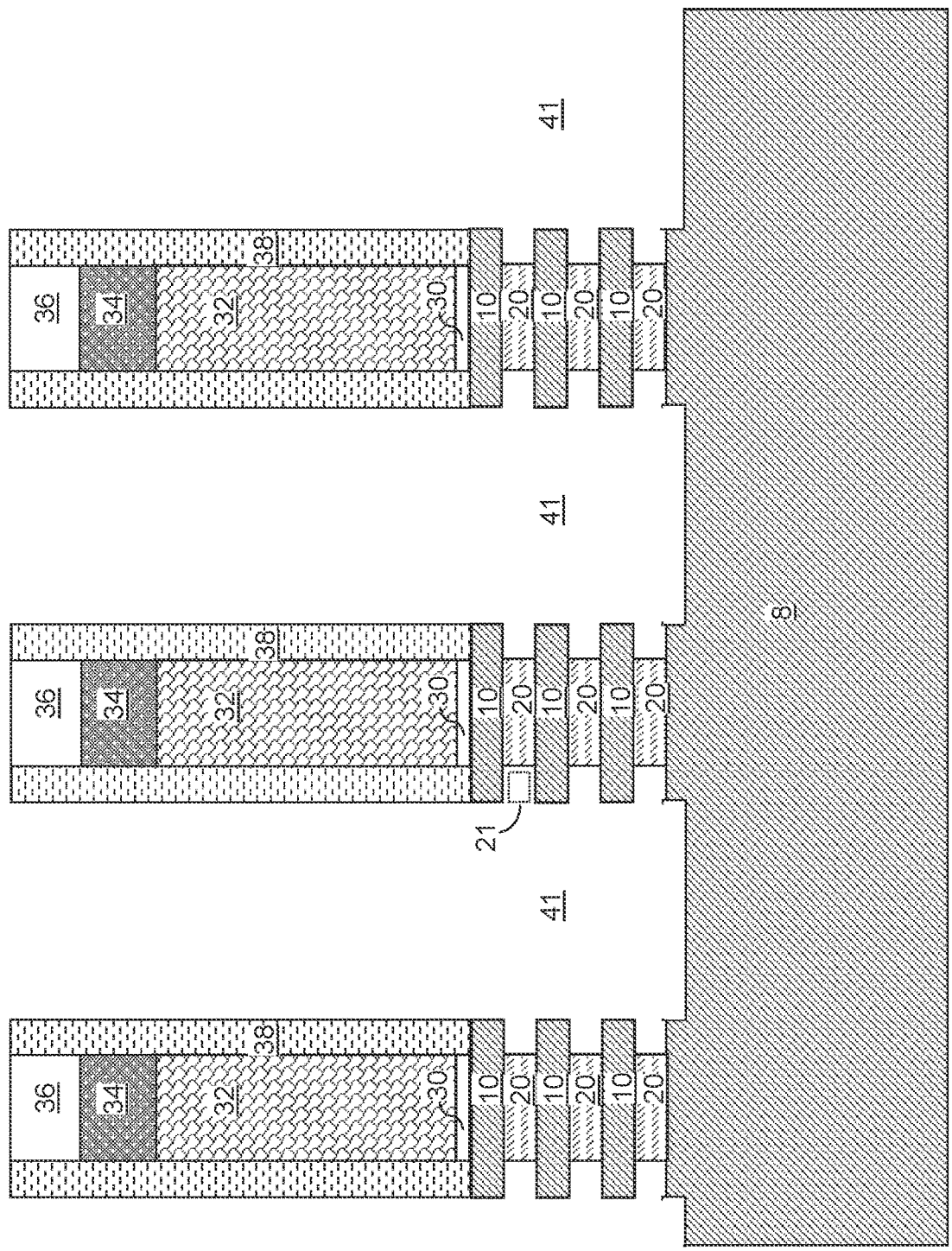
FIG. 6A is a vertical cross-sectional view of the exemplary structure after laterally recessing cladding silicon-germanium alloy structures and silicon-germanium plates according to an embodiment of the present disclosure.
Figure 6B:
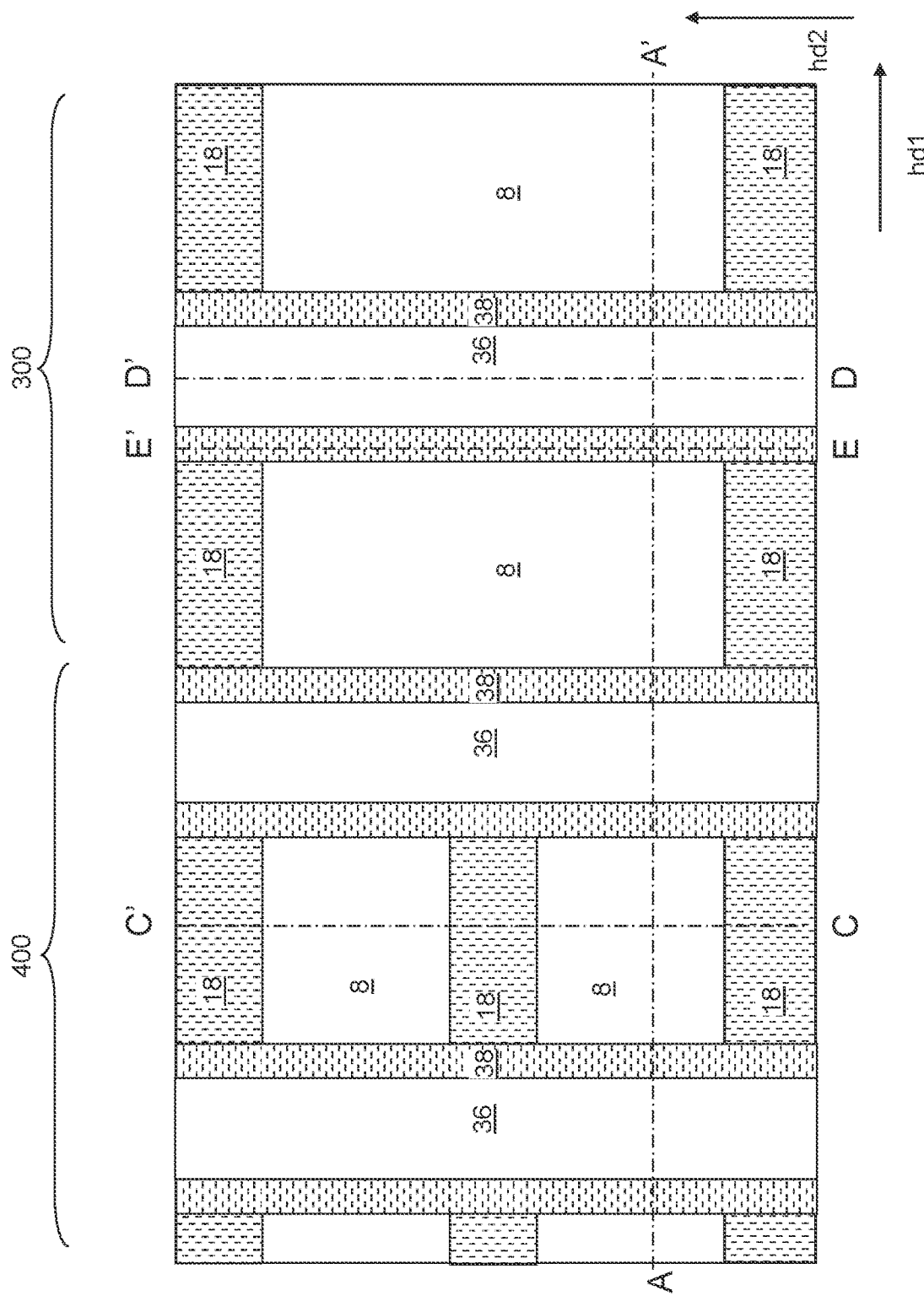
FIG. 6B is a top-down view of the exemplary structure of FIG. 6A. The vertical plane A-A' is the plane of the vertical cross-sectional view of FIG. 6A.
Figure 6E:
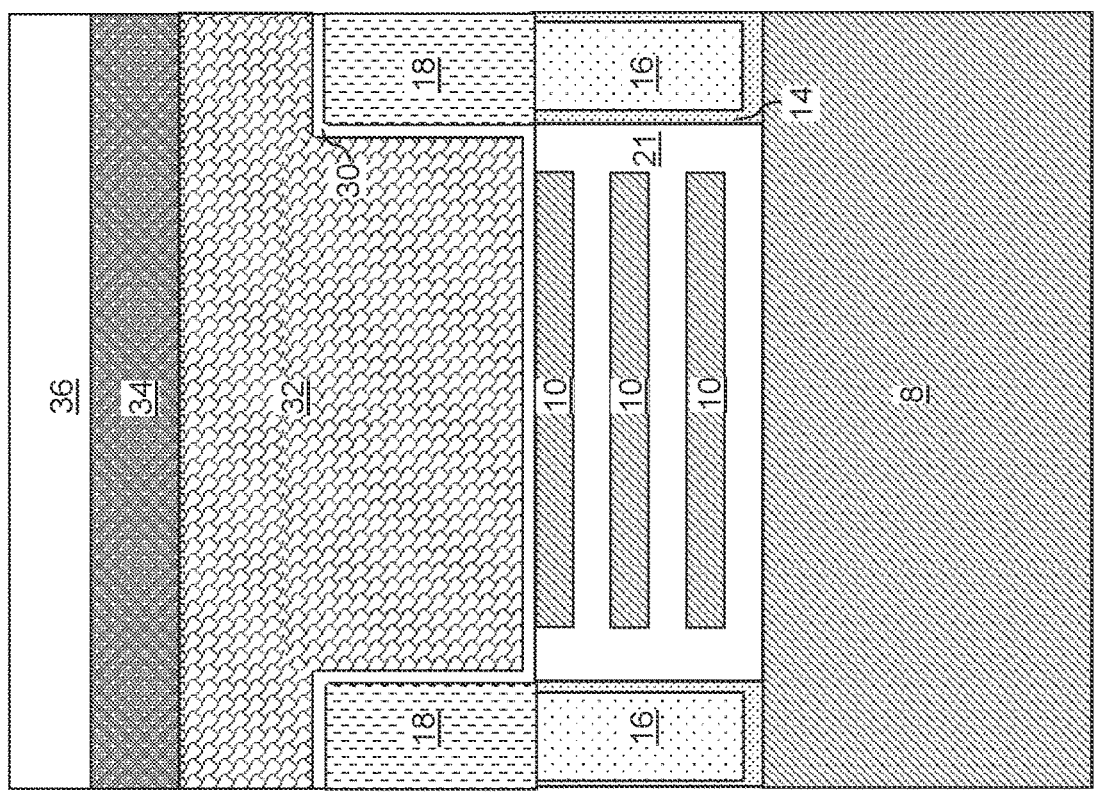
FIG. 6E is a vertical cross-sectional view along the vertical plane E-E' of FIG. 6B.

FIG. 6A is a vertical cross-sectional view of the exemplary structure after laterally recessing cladding silicon-germanium alloy structures and silicon-germanium plates according to an embodiment of the present disclosure. FIG. 6B is a top-down view of the exemplary structure of FIG. 6A. The vertical plane A-A' is the plane of the vertical cross-sectional view of FIG. 6A. FIG. 6C is a vertical cross-sectional view along the vertical plane C-C' of FIG. 6B. FIG. 6D is a vertical cross-sectional view along the vertical plane D-D' of FIG. 6B. FIG. 6E is a vertical cross-sectional view along the vertical plane E-E' of FIG. 6B. Referring to FIGS. 6A-6E, the cladding silicon-germanium alloy structures 28 and the silicon-germanium plates 20 may be laterally recessed by performing at least one isotropic etch process. Each isotropic etch process may laterally recess the polycrystalline material of the cladding silicon-germanium alloy structure 28 and/or the single crystalline material of the silicon-germanium plates 20 selective to the materials of the semiconductor channel plates 10. For example, each isotropic etch process may include a wet etch process using a mixture of ammonium hydroxide and hydrogen peroxide. Recess cavities 21 may be formed in volumes from which the materials of the cladding silicon-germanium alloy structures 28 and the silicon-germanium plates 20 are removed. The recessed sidewalls of the cladding silicon-germanium alloy structures 28 and the silicon-germanium plates 20 may be at, or about, a vertical plane including an overlying interface between a gate template structure (30, 32, 34, 36) and a dielectric gate spacer 38.

Figure 7A:
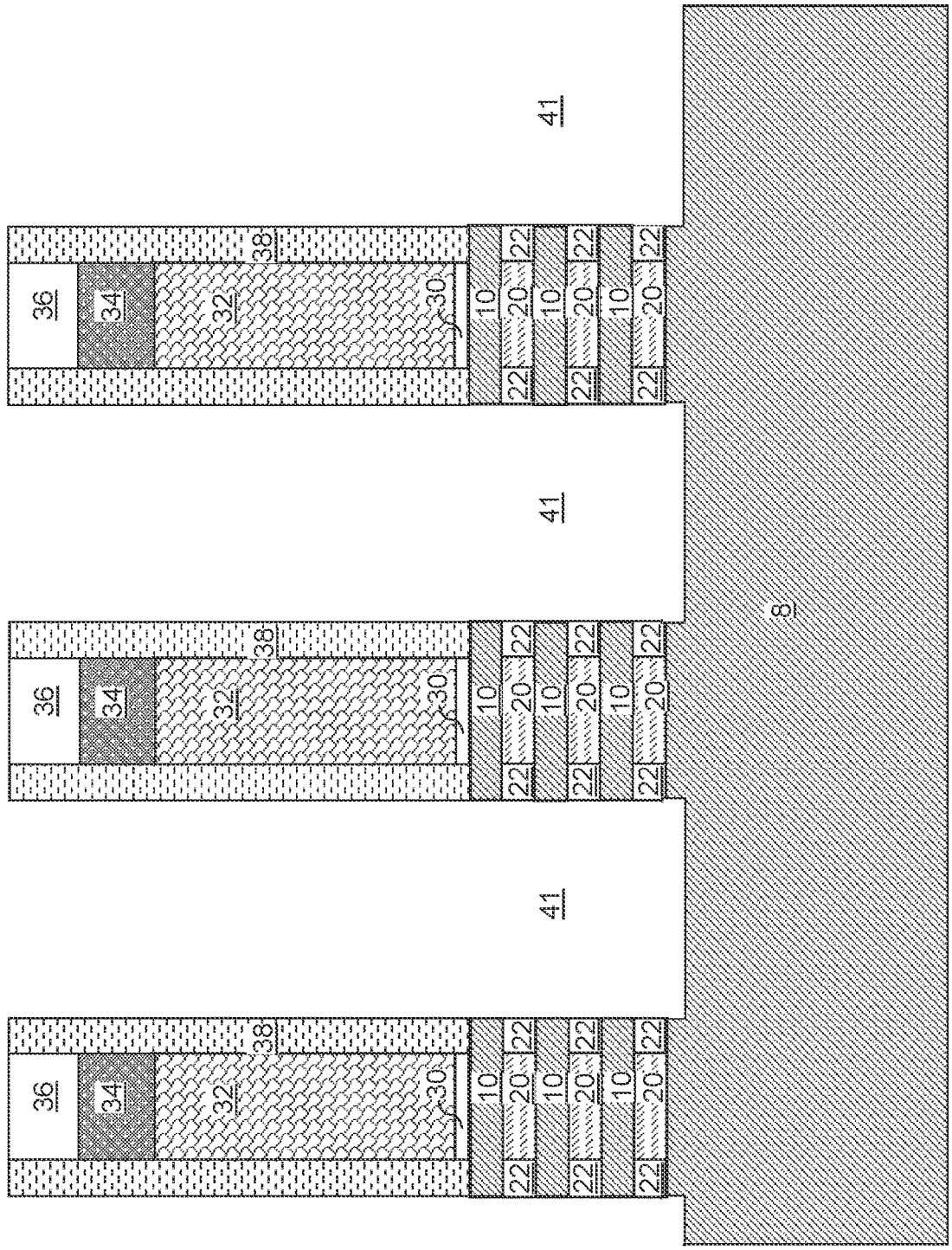
FIG. 7A is a vertical cross-sectional view of the exemplary structure after formation of dielectric channel spacers according to an embodiment of the present disclosure.
Figure 7B:
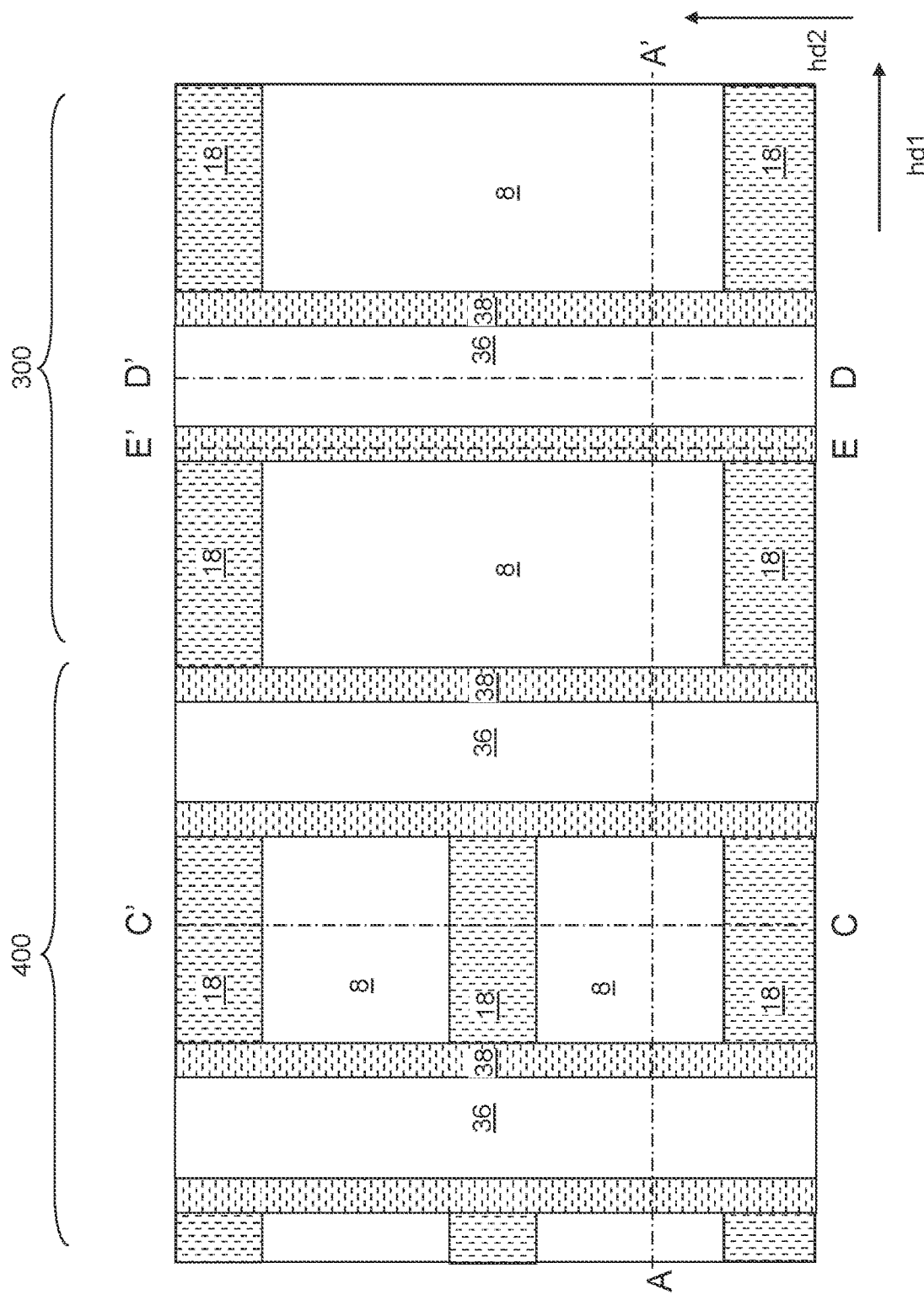
FIG. 7B is a top-down view of the exemplary structure of FIG. 7A. The vertical plane A-A' is the plane of the vertical cross-sectional view of FIG. 7A.
Figure 7D:
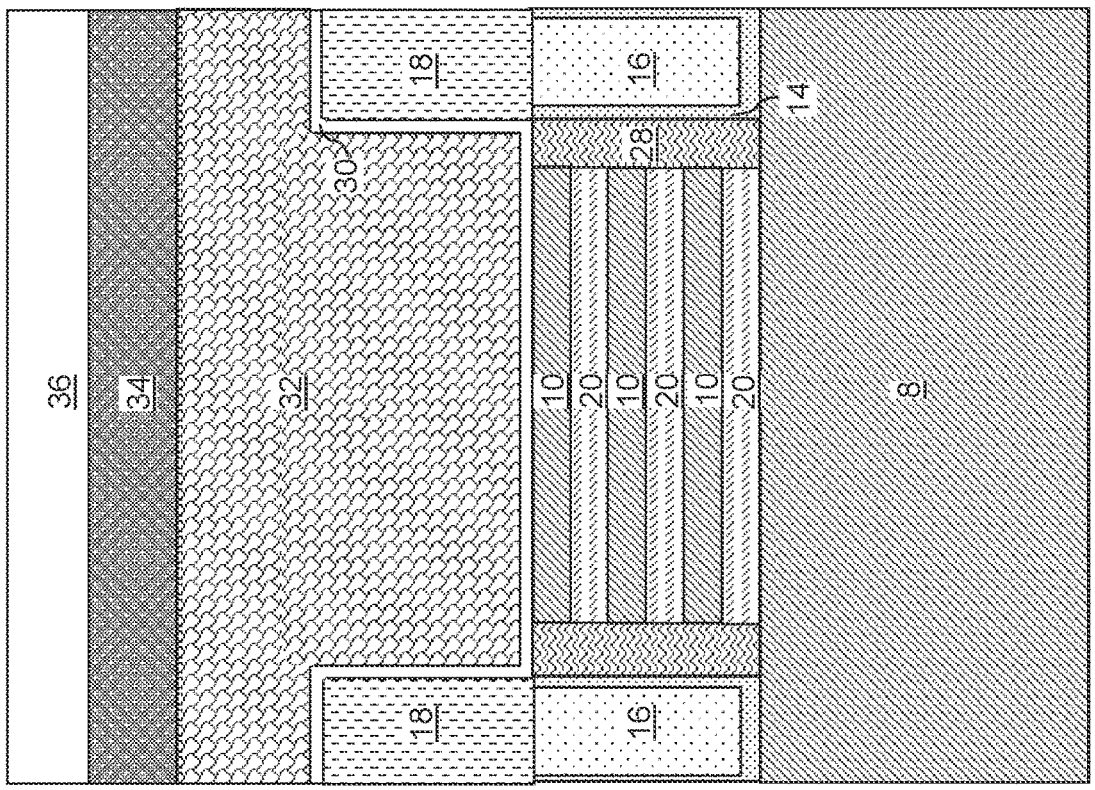
FIG. 7D is a vertical cross-sectional view along the vertical plane D-D' of FIG. 7B.
Figure 7C:
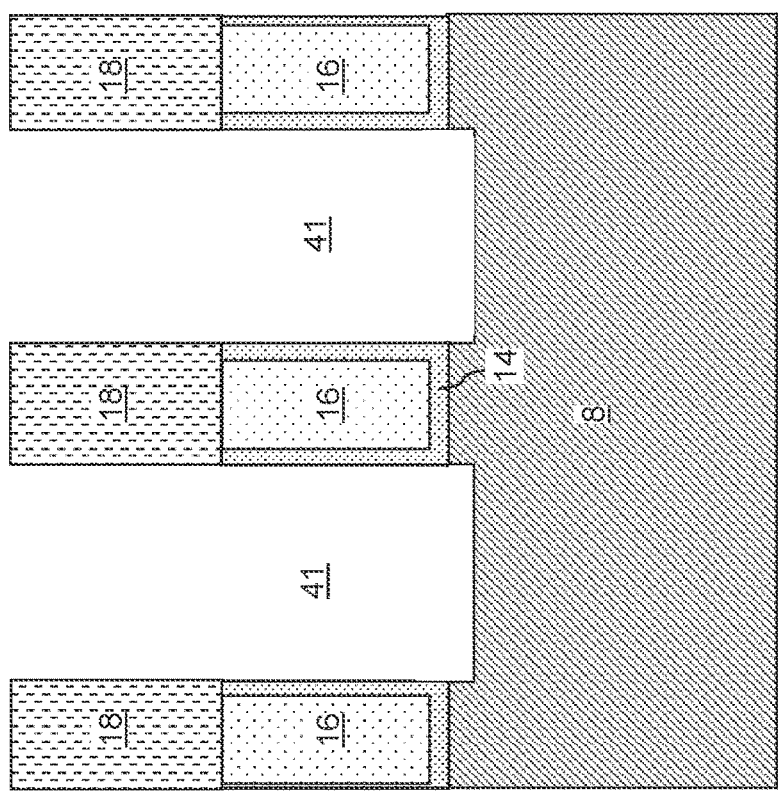
FIG. 7C is a vertical cross-sectional view along the vertical plane C-C' of FIG. 7B.
Figure 7E:
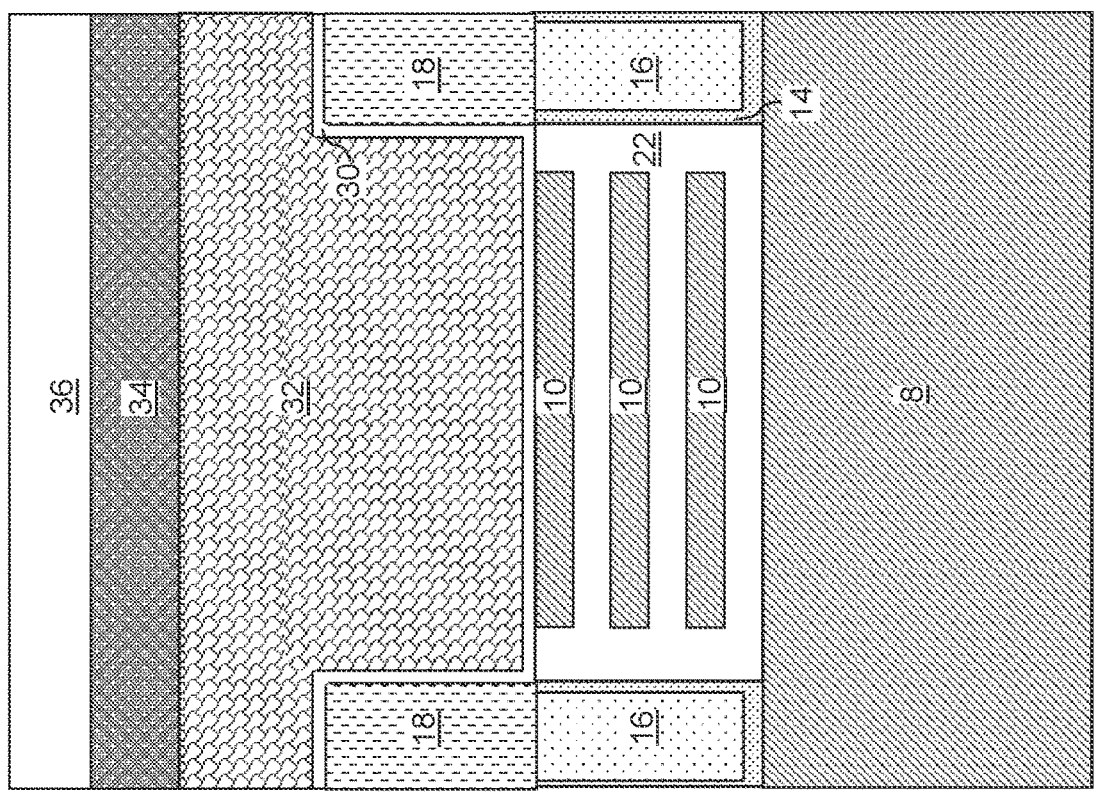
FIG. 7E is a vertical cross-sectional view along the vertical plane E-E' of FIG. 13B.

FIG. 7A is a vertical cross-sectional view of the exemplary structure after formation of dielectric channel spacers according to an embodiment of the present disclosure. FIG. 7B is a top-down view of the exemplary structure of FIG. 7A. The vertical plane A-A' is the plane of the vertical cross-sectional view of FIG. 7A. FIG. 7C is a vertical cross-sectional view along the vertical plane C-C' of FIG. 7B. FIG. 7D is a vertical cross-sectional view along the vertical plane D-D' of FIG. 7B. FIG. 7E is a vertical cross-sectional view along the vertical plane E-E' of FIG. 13B. Referring to FIGS. 7A-7E, a dielectric fill material such as silicon oxide may be conformally deposited to fill the recess cavities 21. Portions of the dielectric fill material deposited outer side the recess cavities 21 may be removed by an anisotropic etch process. Each remaining vertical portion of the dielectric fill material that fills a respective one of the recess cavities 21 comprises a dielectric channel spacer 22.

Figure 8A:
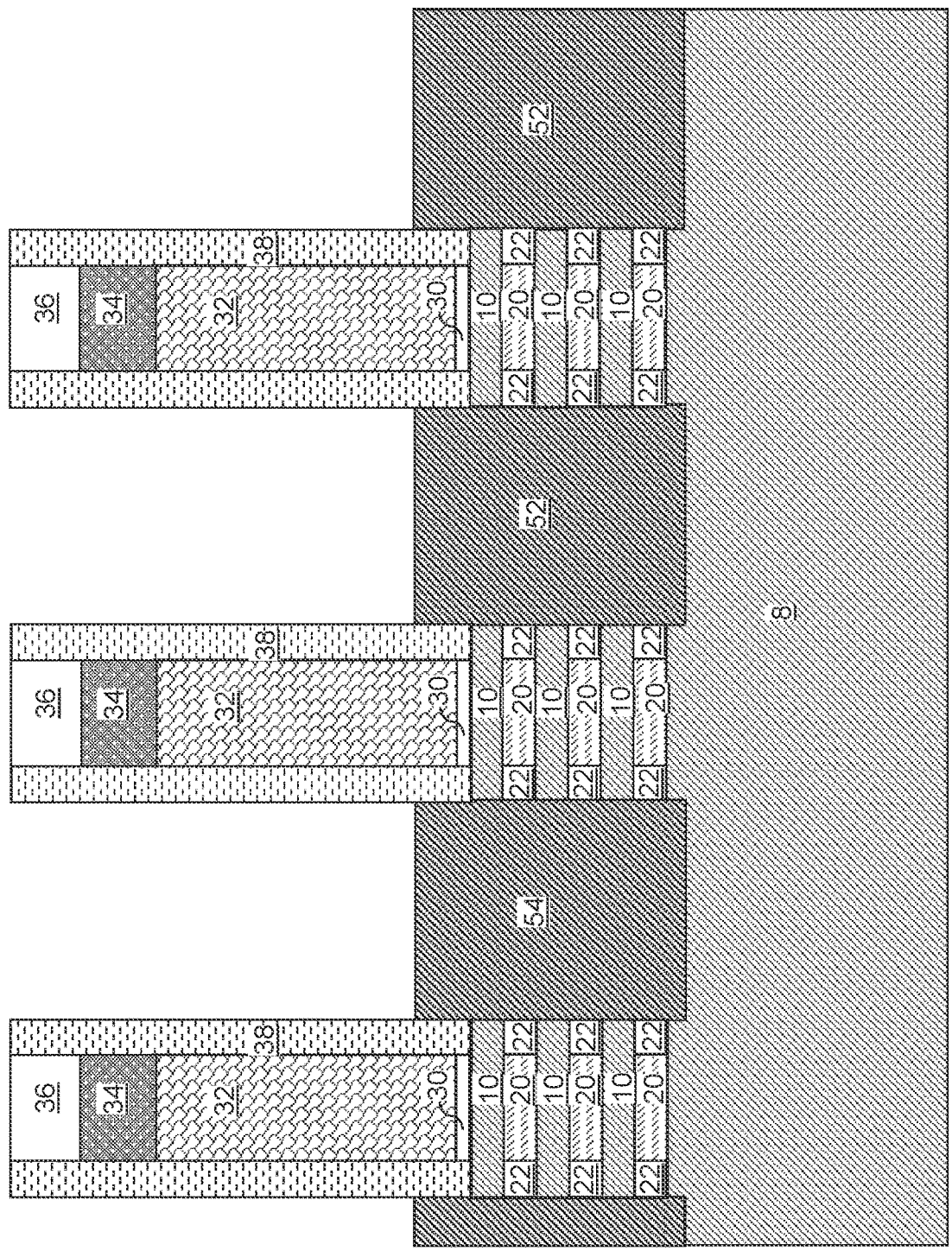
FIG. 8A is a vertical cross-sectional view of the exemplary structure after formation of source/drain regions according to an embodiment of the present disclosure.
Figure 8B:
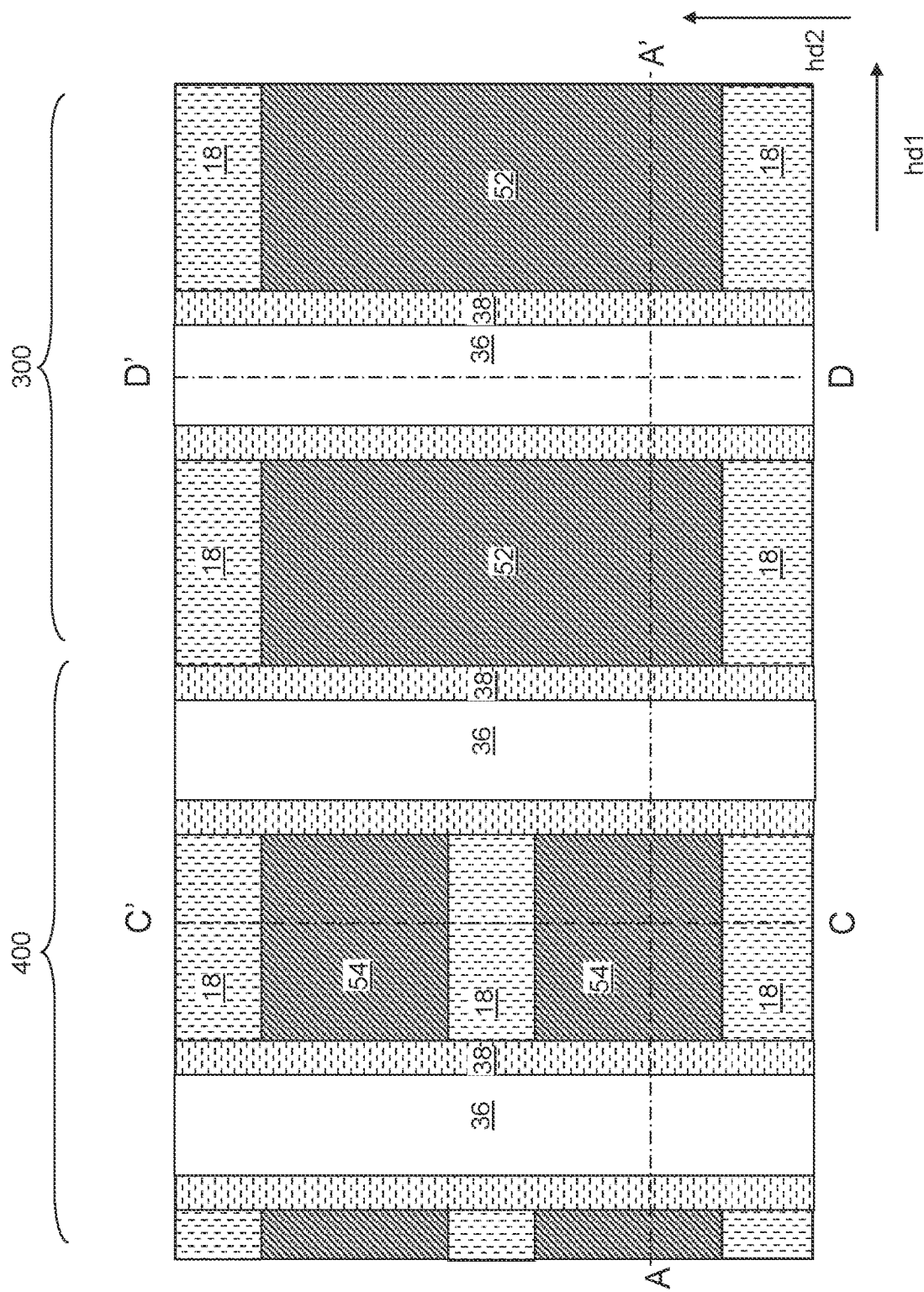
FIG. 8B is a top-down view of the exemplary structure of FIG. 8A. The vertical plane A-A' is the plane of the vertical cross-sectional view of FIG. 8A.
Figure 8D:
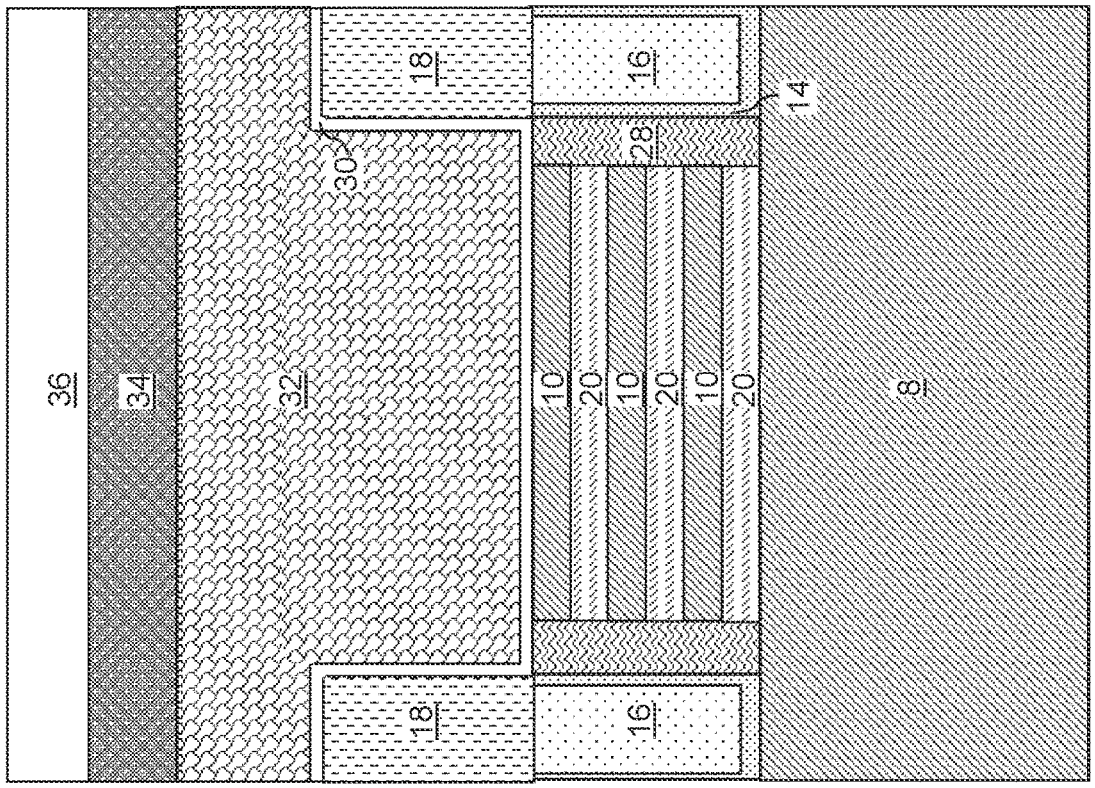
FIG. 8D is a vertical cross-sectional view along the vertical plane D-D' of FIG. 8B.
Figure 8C:
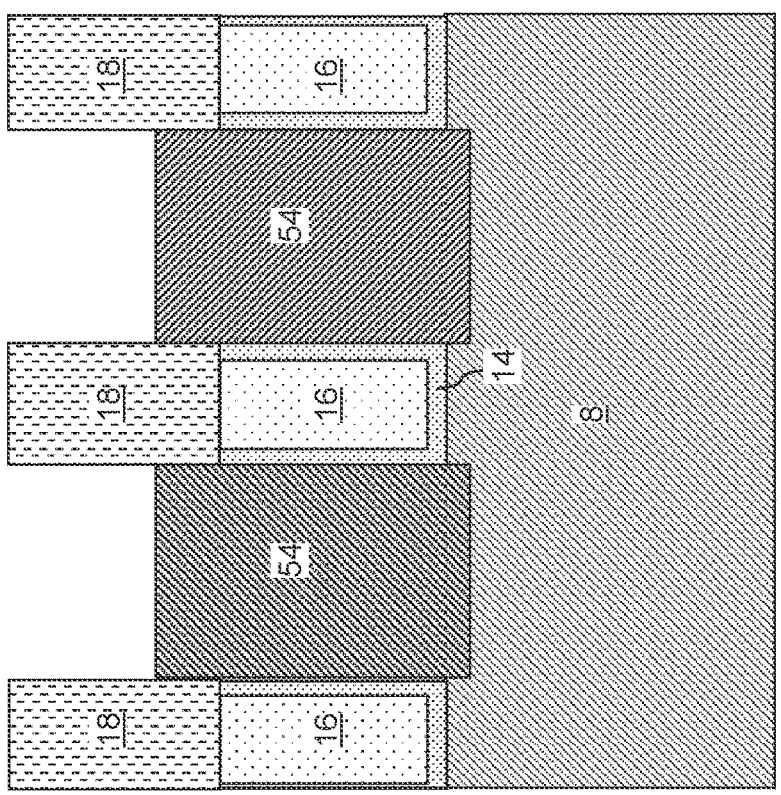
FIG. 8C is a vertical cross-sectional view along the vertical plane C-C' of FIG. 8B.

FIG. 8A is a vertical cross-sectional view of the exemplary structure after formation of source/drain regions according to an embodiment of the present disclosure. FIG. 8B is a top-down view of the exemplary structure of FIG. 8A. The vertical plane A-A' is the plane of the vertical cross-sectional view of FIG. 8A. FIG. 8C is a vertical cross-sectional view along the vertical plane C-C' of FIG. 8B. FIG. 8D is a vertical cross-sectional view along the vertical plane D-D' of FIG. 8B. Referring to FIGS. 8A-8D, an selective epitaxy process may be performed to epitaxially grow source/drain regions 52 and epitaxial semiconductor material portions 54 from physically exposed semiconductor surfaces of the semiconductor channel plates 10, the silicon-germanium plates 20, and the substrate single crystalline semiconductor layer 8. The source/drain regions 52 are formed in the field effect transistor regions 300, and are used as source regions or drain regions of a respective field effect transistor. A source/drain region 52 may be a source region or a drain region depending on the operational voltage applied thereto. The epitaxial semiconductor material portions 54 include the same material as the source/drain regions 52.

For example, the exemplary structure may be placed in an epitaxial deposition process chamber, and a silicon-containing precursor gas (such as silane, disilane, dichlorosilane, or trichlorosilane) may be flowed concurrent with an etchant gas (such as hydrogen chloride gas) to grow a silicon-containing semiconductor material from the physically exposed semiconductor surfaces. In one embodiment, at least one electrical dopant gas (such as phosphine, arsine, stibine, or diborane) may be concurrently flowed into the epitaxial deposition process chamber to provide in-situ doping of the source/drain regions 52. For example, the semiconductor channel plates 10 may have a doping of a first conductivity type (such as p-type), and the source/drain regions 52 may have a doping of a second conductivity type (such as n-type) that is the opposite of the first conductivity type. In this embodiment, the atomic concentration of dopants of the second conductivity type in the source/drain regions 52 may be in a range from $5.0 \times 10^{19}/cm^3$ to $2.0 \times 10^{21}/cm^3$, although lesser and greater atomic concentrations may also be used. The thickness of the source/drain regions 52 may be in a range from 10 nm to 50 nm, although lesser and greater thicknesses may also be used. In some embodiments, hard mask layers (not shown) may be used to perform different epitaxial deposition processes in different regions to provide formation of source/drain regions having different types of electrical doping (i.e., p-type doping and n-type doping). Optionally, the source/drain regions 52 may be patterned as needed to provide electrical isolation between adjacent source/drain regions 52 of neighboring gate-all-around field effect transistors.

Figure 9A:
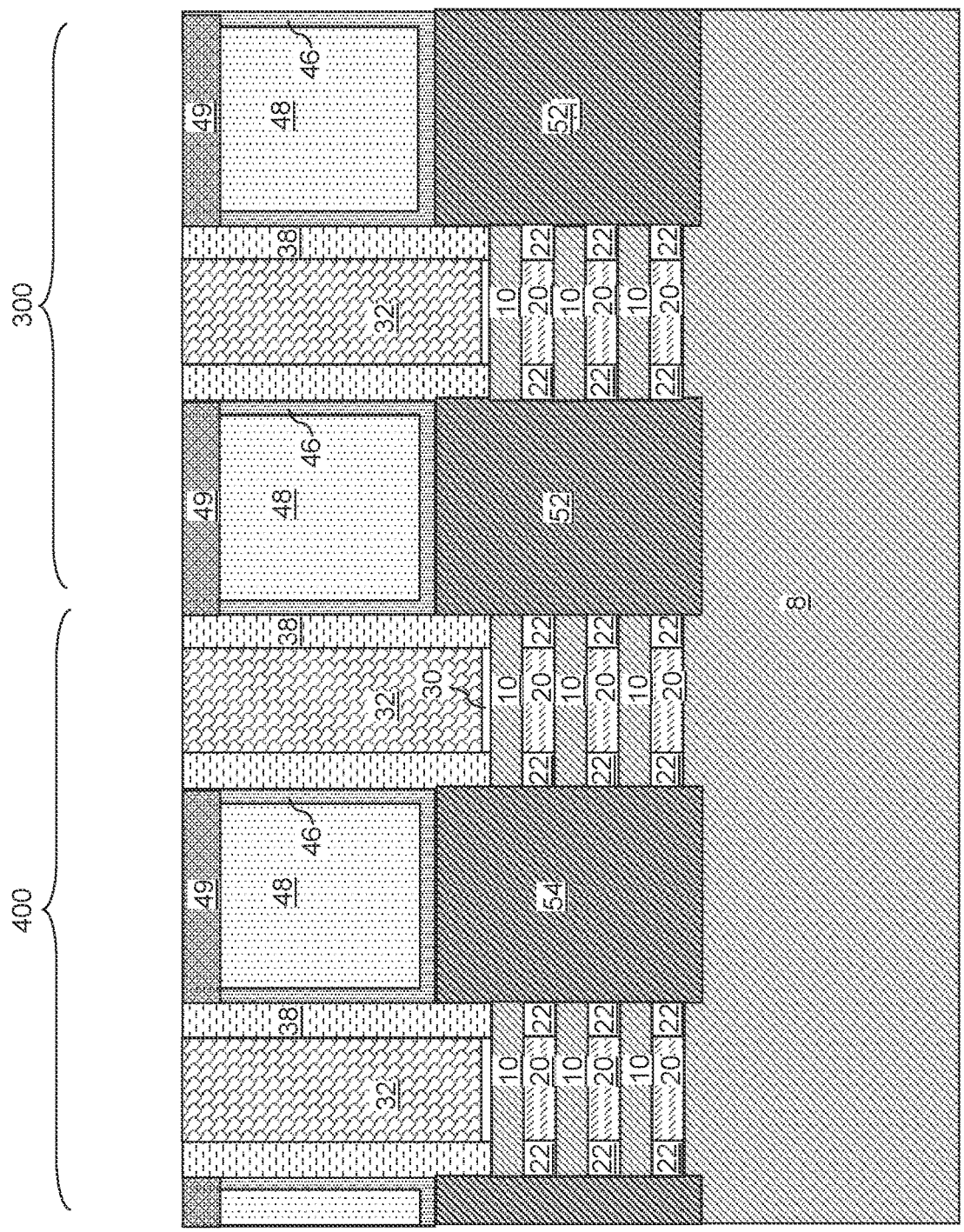
FIG. 9A is a vertical cross-sectional view of the exemplary structure after formation of inter-device isolation structures according to an embodiment of the present disclosure.
Figure 9B:
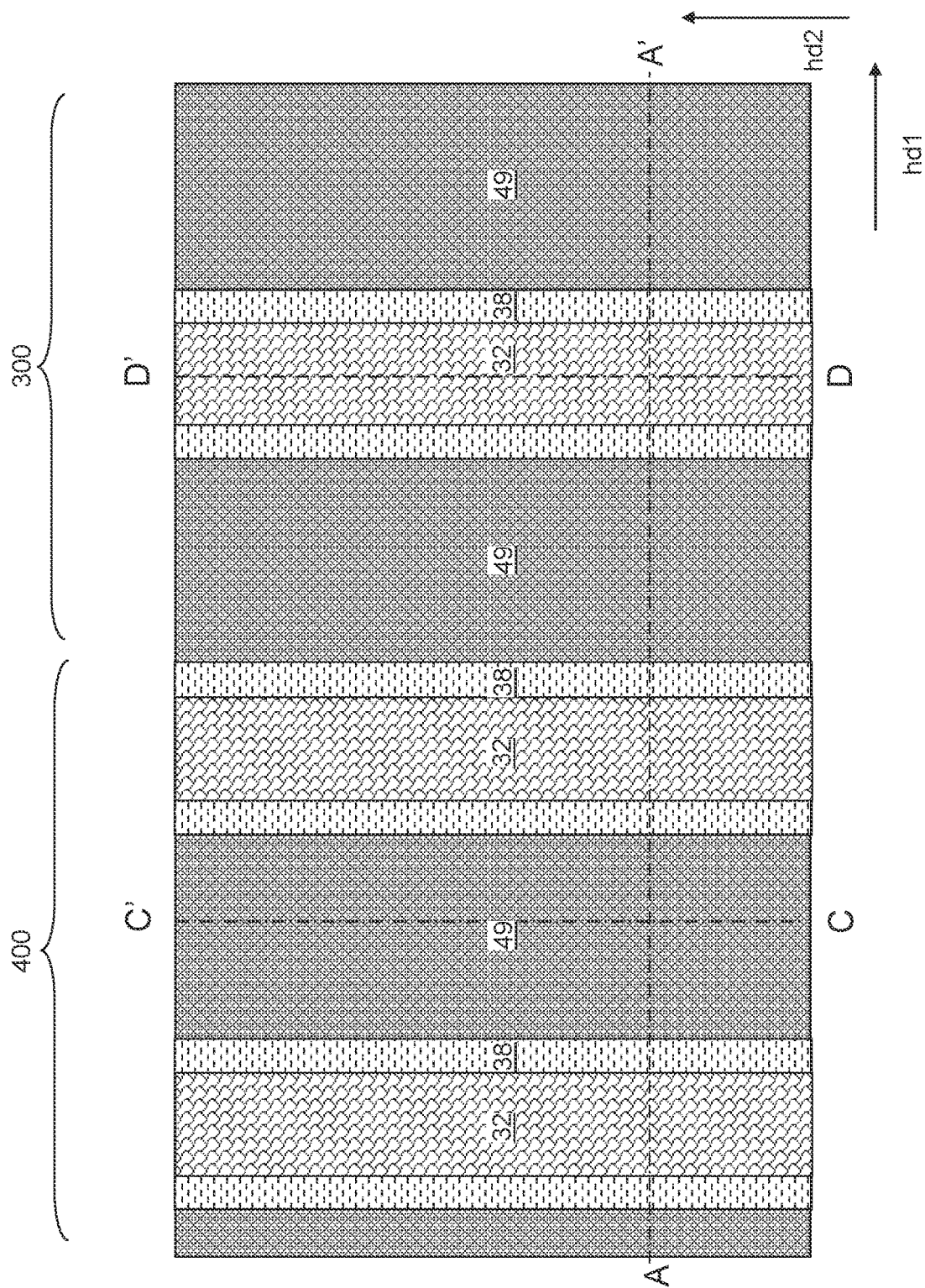
FIG. 9B is a top-down view of the exemplary structure of FIG. 9A. The vertical plane A-A' is the plane of the vertical cross-sectional view of FIG. 9A.
Figure 9C:
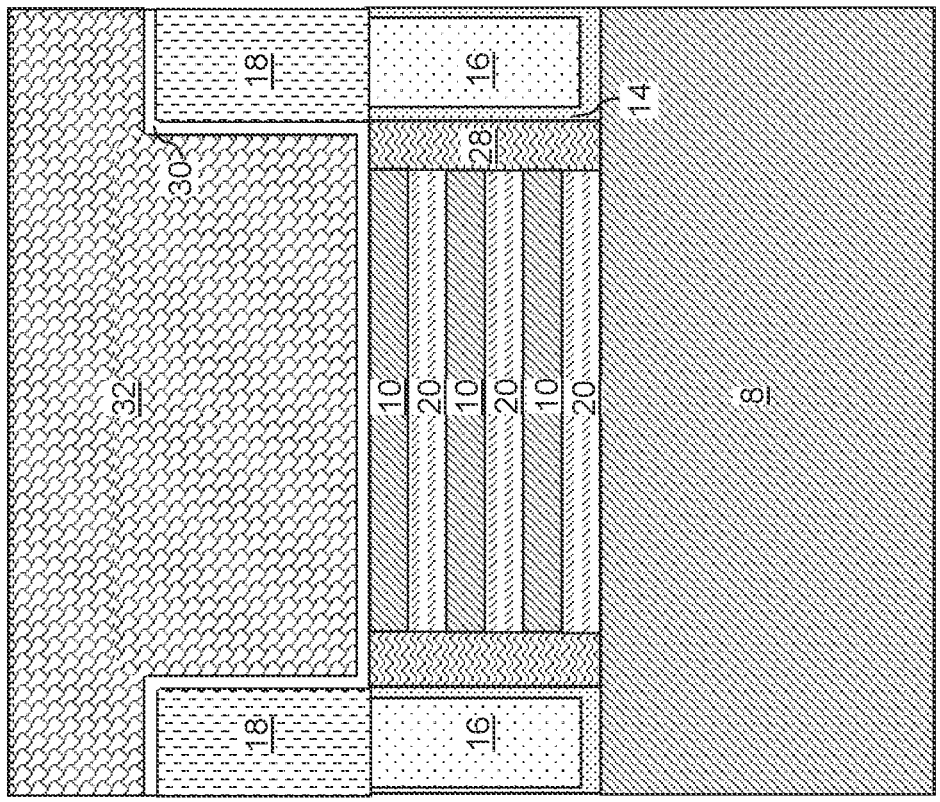
FIG. 9C is a vertical cross-sectional view along the vertical plane C-C' of FIG. 9B.
Figure 9D:
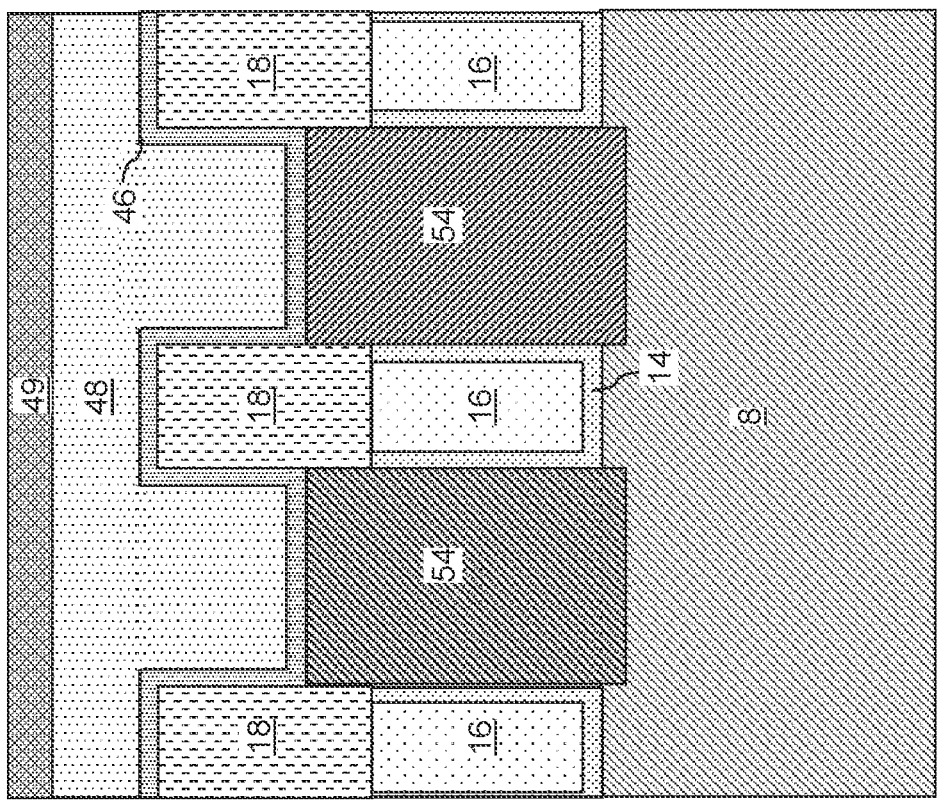
FIG. 9D is a vertical cross-sectional view along the vertical plane D-D' of FIG. 9B.

FIG. 9A is a vertical cross-sectional view of the exemplary structure after formation of inter-device isolation structures according to an embodiment of the present disclosure. FIG. 9B is a top-down view of the exemplary structure of FIG. 9A. The vertical plane A-A' is the plane of the vertical cross-sectional view of FIG. 9A. FIG. 9C is a vertical cross-sectional view along the vertical plane C-C' of FIG. 9B. FIG. 9D is a vertical cross-sectional view along the vertical plane D-D' of FIG. 9B. Referring to FIGS. 9A-9D, inter-device isolation structures (46, 48, 49) may be formed between neighboring pairs of semiconductor plate stacks (10, 20). For example, a continuous isolation dielectric liner including an etch stop dielectric material may be deposited. The continuous isolation dielectric liner may include a dielectric material such as aluminum oxide, hafnium oxide, or silicon carbide nitride. The thickness of the continuous isolation dielectric liner may be in a range from 10 nm to 50 nm, although lesser and greater thicknesses may also be used.

A dielectric fill material such as undoped silicate glass or a doped silicate glass may be deposited over the isolation dielectric liner to fill cavities between neighboring pairs of gate template structures (30, 32, 34, 36). A chemical mechanical planarization (CMP) process may be performed to remove the gate mask structures 36, the sacrificial gate caps 34, and portions of the dielectric fill material, the continuous isolation dielectric liner, and the dielectric gate spacers 38 that are located above the horizontal plane including the top surface of the sacrificial gate structures 32. Each remaining portion of the continuous isolation dielectric liner comprises an isolation dielectric liner 46. Each remaining portion of the dielectric fill material comprises an isolation dielectric fill material portion 48.

Top portions of the isolation dielectric liners 46 and the isolation dielectric fill material portions 48 may be vertically recessed. At least one isotropic etch process may be used to vertically recess the isolation dielectric liners 46 and the isolation dielectric fill material portions 48. An etch stop dielectric material such as silicon nitride may be deposited in the recesses overlying the isolation dielectric liners 46 and the isolation dielectric fill material portions 48. Excess portions of the etch stop dielectric material may be removed from above the horizontal plane including the top surfaces of the sacrificial gate structures 32. Each remaining portion of the etch stop dielectric material that fills the recesses comprise isolation etch stop plate 49. The thickness of each isolation etch stop plate 49 may be in a range from 10 nm to 20 nm, although lesser and greater thicknesses may also be used. Each combination of an isolation dielectric liner 46, an isolation dielectric fill material portion 48, and an isolation etch stop plate 49 constitutes an inter-device isolation structures (46, 48, 49).

Figure 10A:
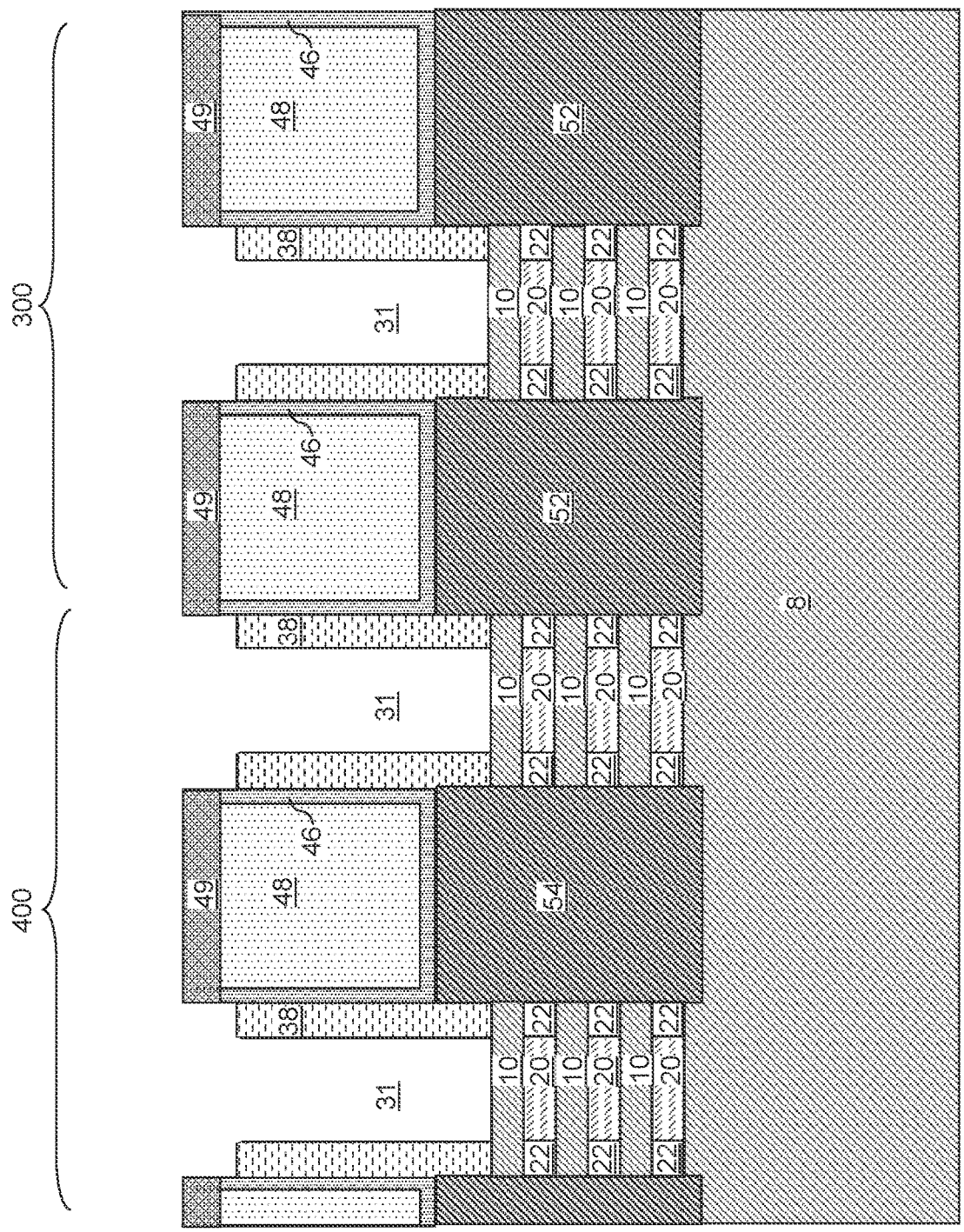
FIG. 10A is a vertical cross-sectional view of the exemplary structure after removal of sacrificial gate structures and sacrificial gate liners according to an embodiment of the present disclosure.
Figure 10B:
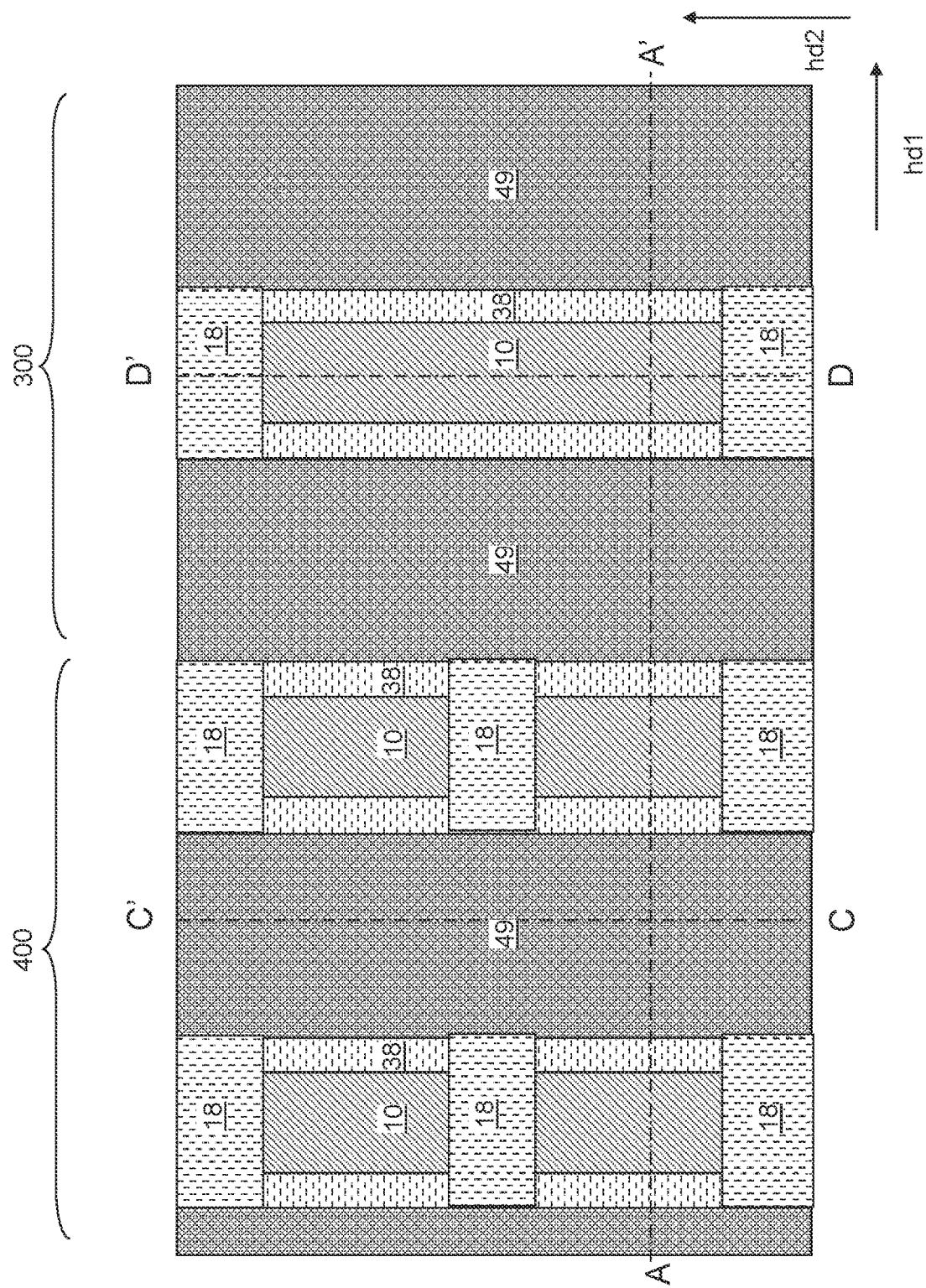
FIG. 10B is a top-down view of the exemplary structure of FIG. 10A. The vertical plane A-A' is the plane of the vertical cross-sectional view of FIG. 10A.
Figures 10C, 10D:
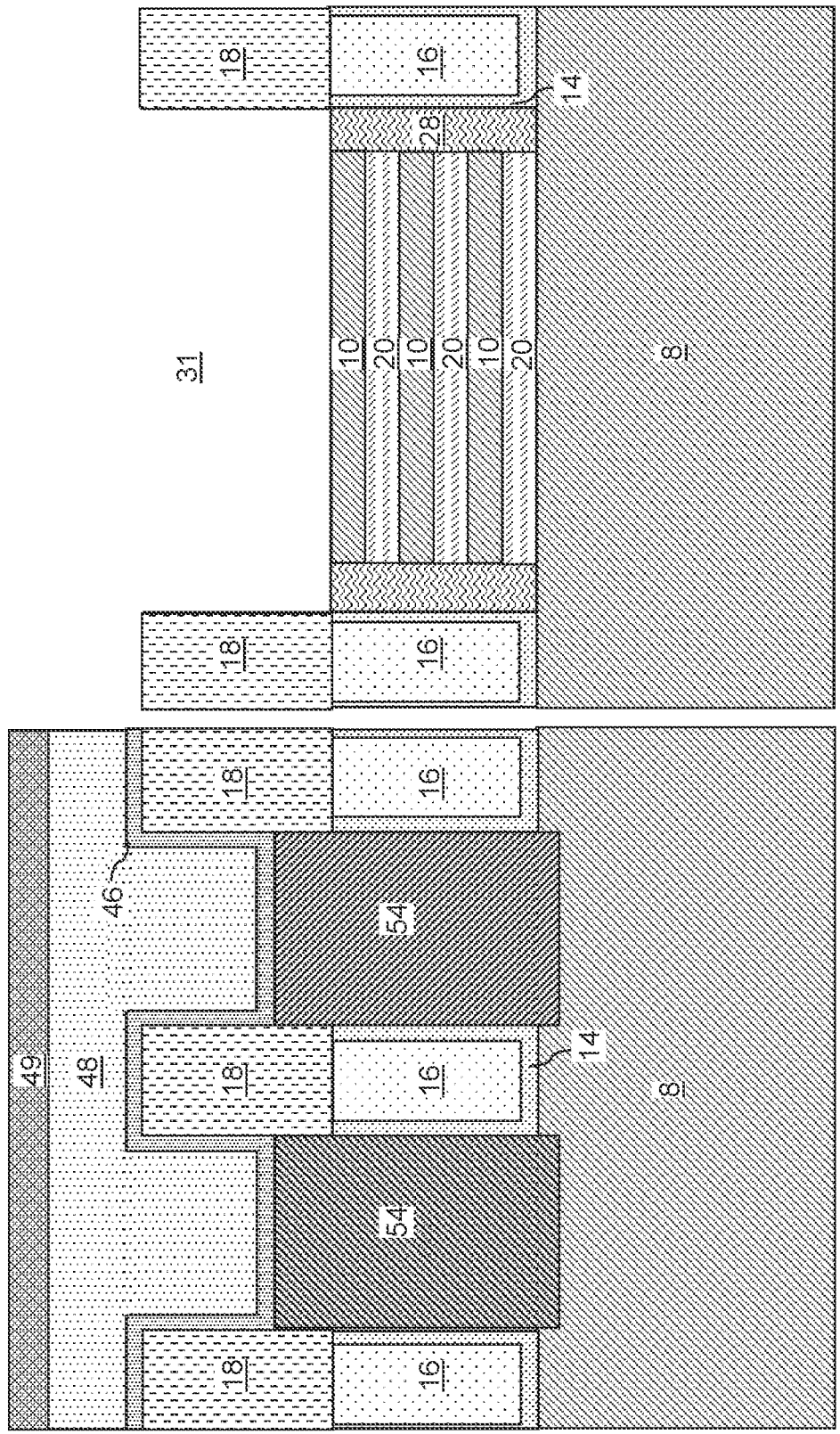
FIG. 10C is a vertical cross-sectional view along the vertical plane C-C' of FIG. 10B.
FIG. 10D is a vertical cross-sectional view along the vertical plane D-D' of FIG. 10B.

FIG. 10A is a vertical cross-sectional view of the exemplary structure after removal of sacrificial gate structures and sacrificial gate liners according to an embodiment of the present disclosure. FIG. 10B is a top-down view of the exemplary structure of FIG. 10A. The vertical plane A-A' is the plane of the vertical cross-sectional view of FIG. 10A. FIG. 10C is a vertical cross-sectional view along the vertical plane C-C' of FIG. 10B. FIG. 10D is a vertical cross-sectional view along the vertical plane D-D' of FIG. 10B. Referring to FIGS. 10A-10D, the sacrificial gate structures 32 may be removed by an etch process. For example, a wet etch process using nitric acid, ammonium fluoride, potassium hydroxide, and/or hydrofluoric acid may be used. The sacrificial gate liners 30 may be subsequently removed by an isotropic etch process such as a wet etch process using dilute hydrofluoric acid.

Figure 11A:
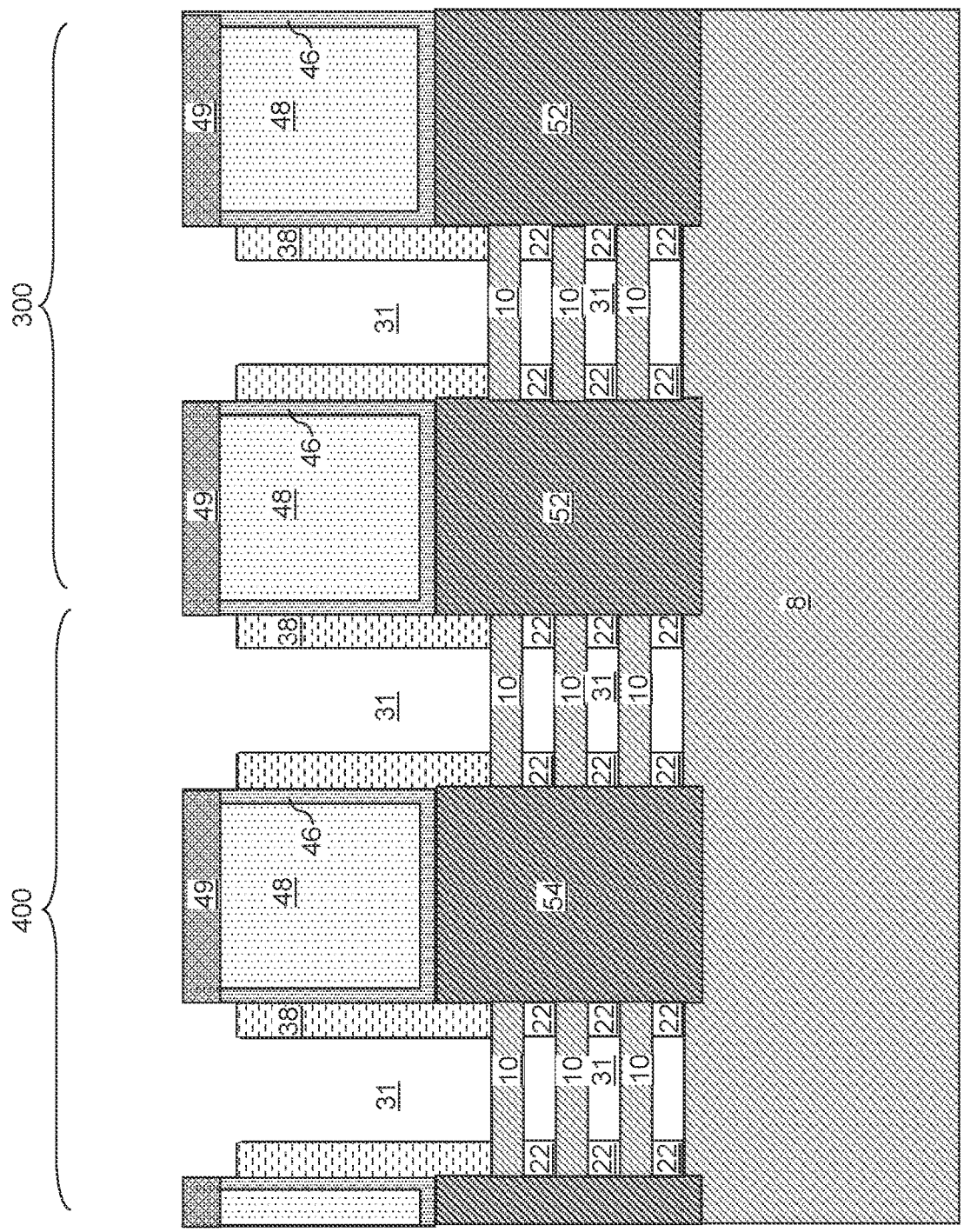
FIG. 11A is a vertical cross-sectional view of the exemplary structure after removal of silicon-germanium plates and formation of gate cavities according to an embodiment of the present disclosure.
Figure 11B:
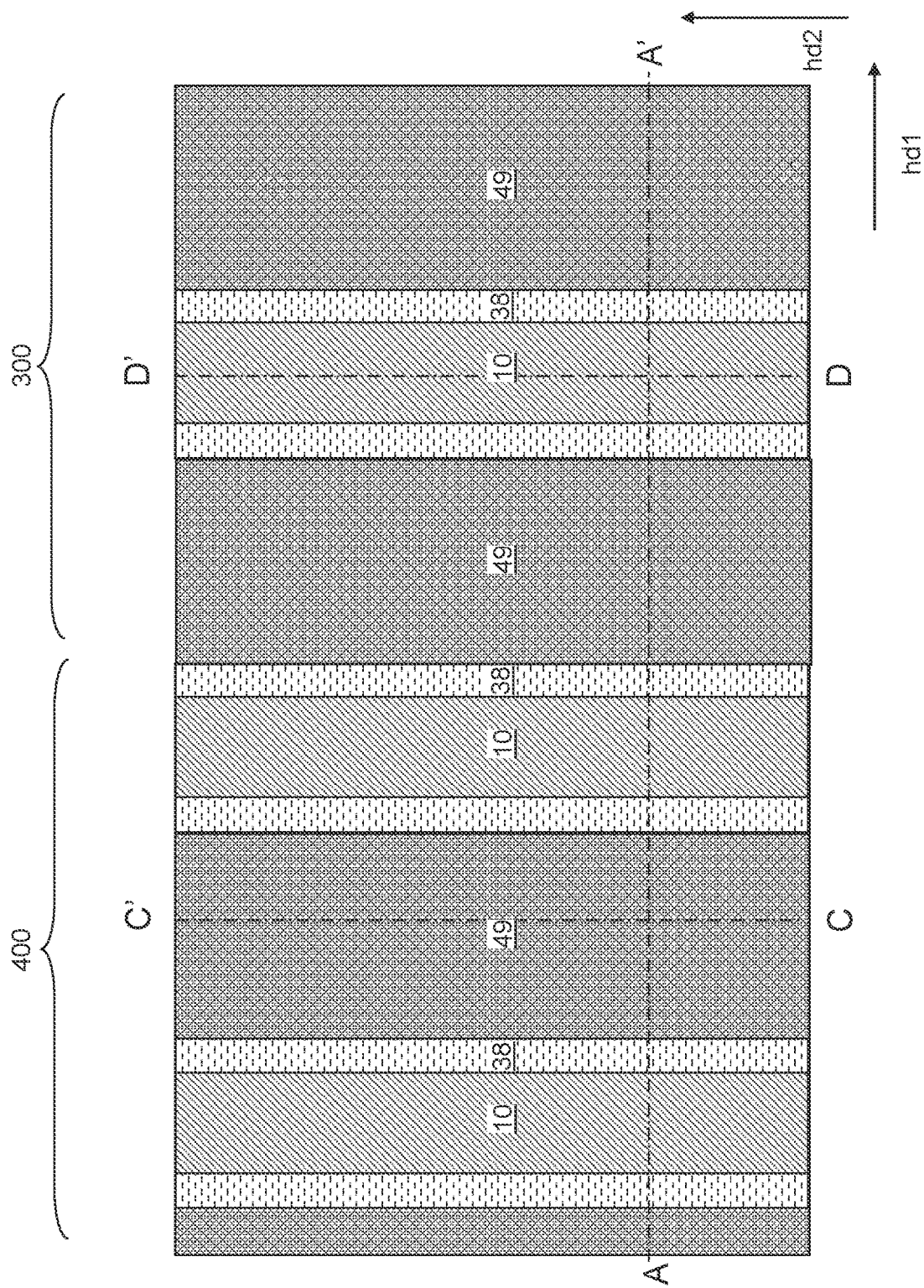
FIG. 11B is a top-down view of the exemplary structure of FIG. 11A. The vertical plane A-A' is the plane of the vertical cross-sectional view of FIG. 11A.

FIG. 11A is a vertical cross-sectional view of the exemplary structure after removal of silicon-germanium plates and formation of gate cavities according to an embodiment of the present disclosure. FIG. 11B is a top-down view of the exemplary structure of FIG. 11A. The vertical plane A-A' is the plane of the vertical cross-sectional view of FIG. 11A. FIG. 11C is a vertical cross-sectional view along the vertical plane C-C' of FIG. 11B. FIG. 11D is a vertical cross-sectional view along the vertical plane D-D' of FIG. 11B. Referring to FIGS. 11A-11D, a wet etch process that etches the material of the cladding silicon-germanium alloy structures 28 and the silicon-germanium plates 20 selective to the material of the semiconductor channel plates 10 may be performed. For example, if the silicon-germanium plates 20 include silicon-germanium plates, a wet etch process using a mixture of ammonium hydroxide and hydrogen peroxide may be used to remove the cladding silicon-germanium alloy structures 28 and the silicon-germanium plates 20. At least one suspended semiconductor channel plate 10, such as a plurality of suspended semiconductor channel plates 10, may be formed within each gate cavity 31. Each gate cavity 31 includes an empty volume formed by removal of the sacrificial gate structures 32, the sacrificial gate liners 30, the cladding silicon-germanium alloy structures 28, and the silicon-germanium plates 20, and underlies the horizontal plane including the top surfaces of the etch stop dielectric fins 18. Horizontal surfaces and vertical surfaces of the semiconductor channel plates 10 are physically exposed within each gate cavity 31. Each stack of semiconductor channel plates 10 located within a respective gate cavity comprises channel portions of a field effect transistor.

Figure 12A:
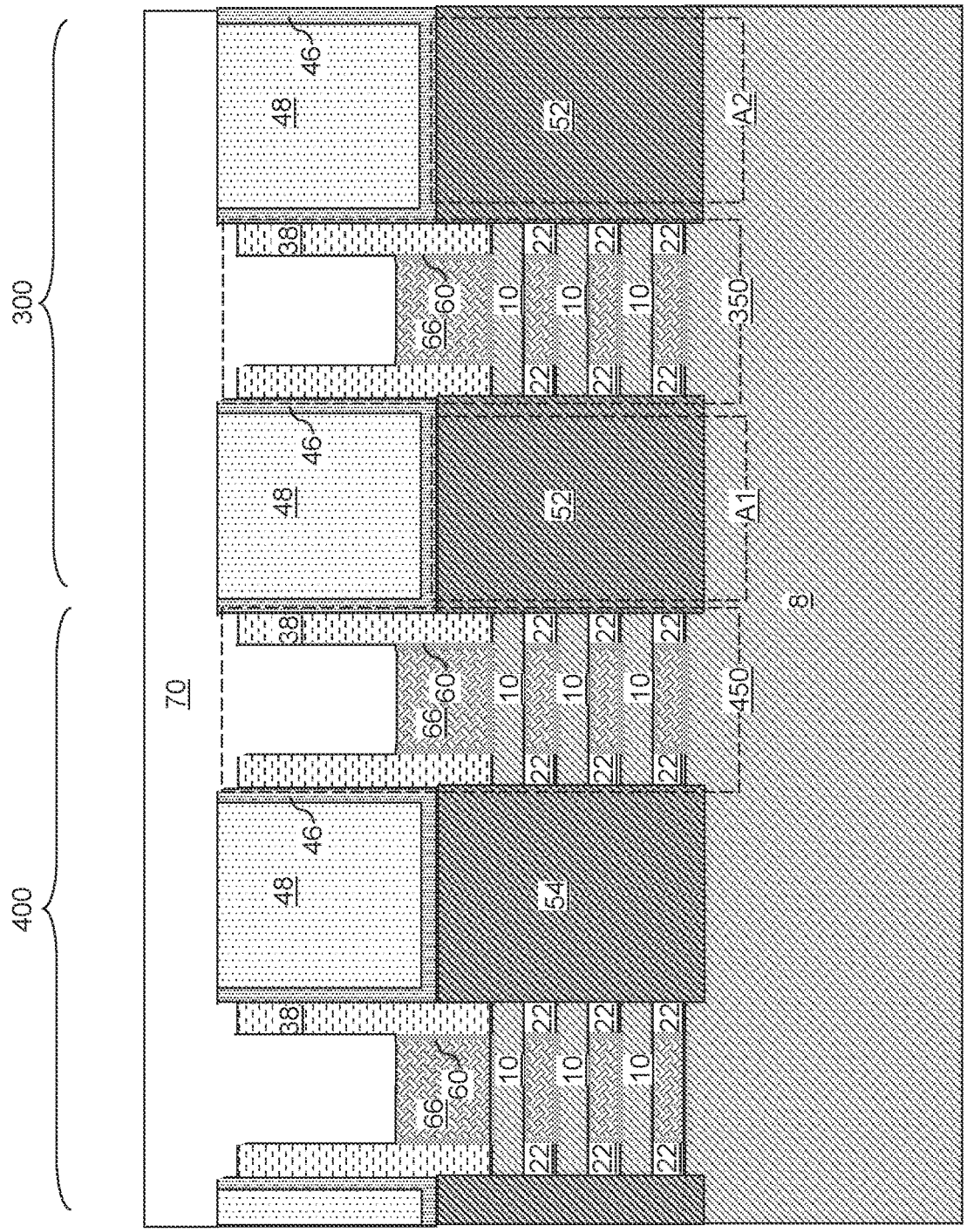
FIG. 12A is a vertical cross-sectional view of the exemplary structure after formation of gate stacks including a respective gate dielectric layer and a respective gate electrode, and a planarization dielectric layer according to an embodiment of the present disclosure.
Figure 12B:
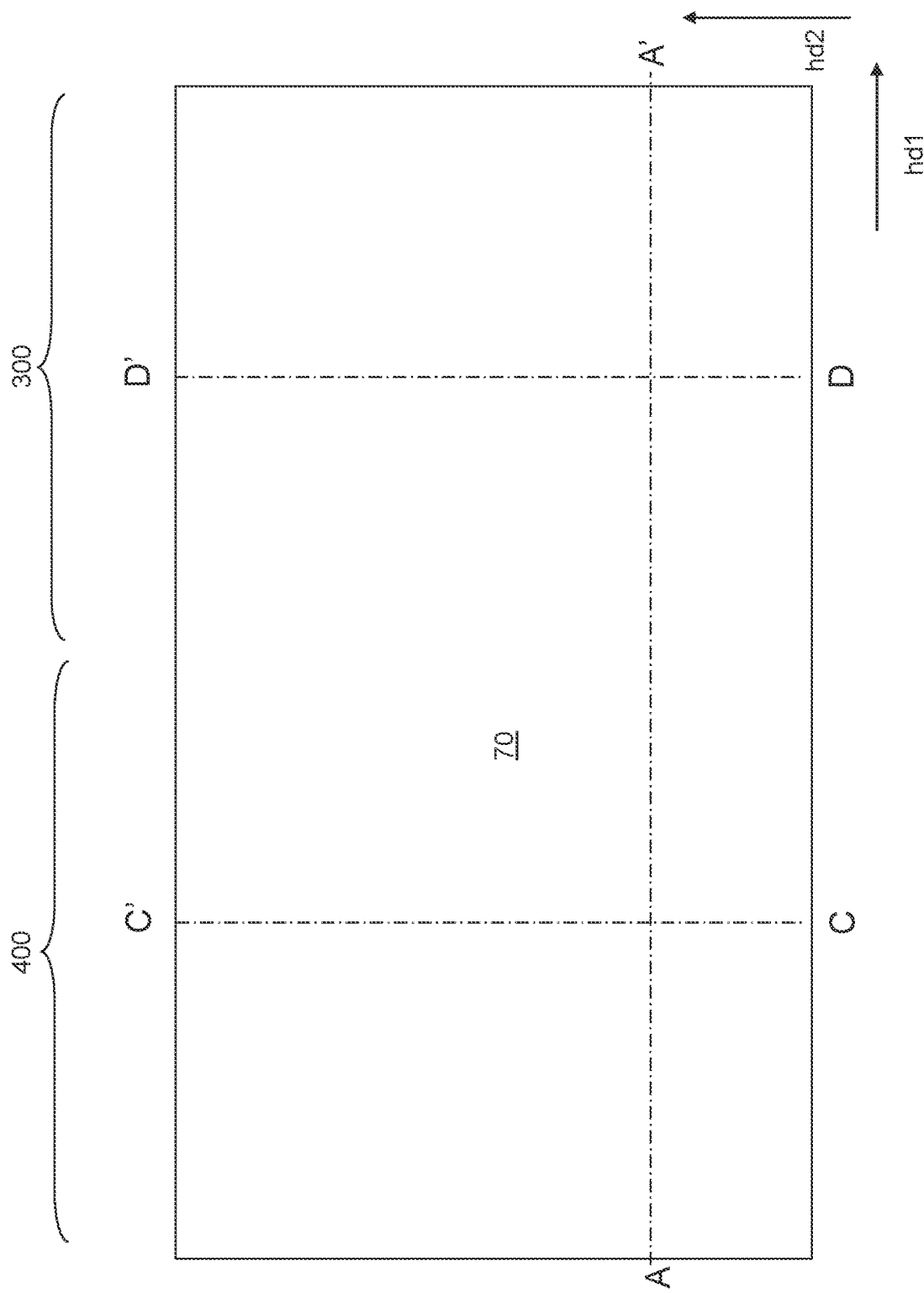
FIG. 12B is a top-down view of the exemplary structure of FIG. 12A. The vertical plane A-A' is the plane of the vertical cross-sectional view of FIG. 26A.
Figure 12C:
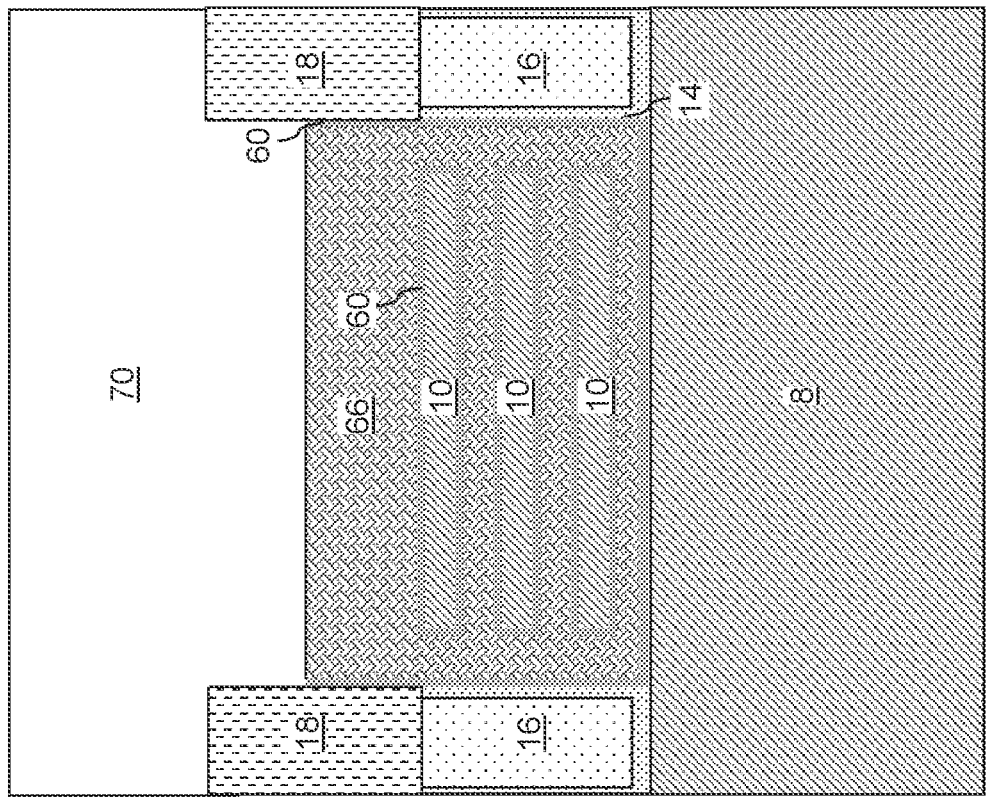
FIG. 12C is a vertical cross-sectional view along the vertical plane C-C' of FIG. 12B.
Figure 12D:
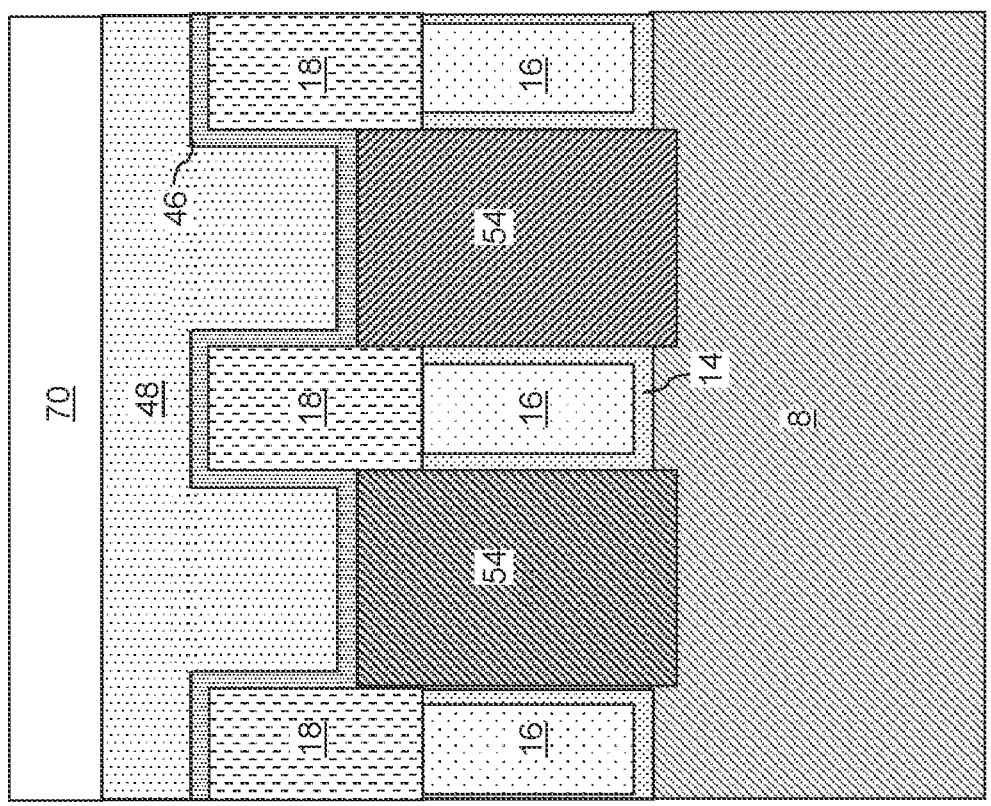
FIG. 12D is a vertical cross-sectional view along the vertical plane D-D' of FIG. 12B.

FIG. 12A is a vertical cross-sectional view of the exemplary structure after formation of gate stacks including a respective gate dielectric layer and a respective gate electrode, and a planarization dielectric layer according to an embodiment of the present disclosure. FIG. 12B is a top-down view of the exemplary structure of FIG. 12A. The vertical plane A-A' is the plane of the vertical cross-sectional view of FIG. 26A. FIG. 12C is a vertical cross-sectional view along the vertical plane C-C' of FIG. 12B. FIG. 12D is a vertical cross-sectional view along the vertical plane D-D' of FIG. 12B. Referring to FIGS. 12A-12D, a gate dielectric layer 60 and a gate electrode rail may be formed within each gate cavity 31. For example, a continuous gate dielectric material layer may be conformally deposited, for example, by atomic layer deposition. The continuous gate dielectric material layer may include a dielectric metal oxide material having a dielectric constant greater than 7.9. Dielectric metal oxide materials having a dielectric constant greater than 7.9 are referred to high dielectric constant (high-k) metal oxide materials. Exemplary high-k dielectric metal oxide materials include, but are not limited to, aluminum oxide, hafnium oxide, yttrium oxide, lanthanum oxide, zirconium oxide, tantalum oxide, and strontium oxide. Optionally, the continuous gate dielectric material layer may additionally include a silicon oxide layer. The thickness of the continuous gate dielectric material layer may be in a range from 1 nm to 6 nm, such as from 1.5 nm to 3 nm, although lesser and greater thicknesses may also be used. A continuous gate electrode metal layer may be deposited over the continuous gate dielectric material layer. The continuous gate electrode metal layer includes an optional metallic liner layer including a conductive metallic nitride material such as TiN, TaN, or WN, and a metallic fill material such as tungsten, ruthenium, molybdenum, cobalt, tantalum, or titanium. Other suitable metallic fill materials are within the contemplated scope of disclosure.

Excess portions of the continuous gate electrode metal layer and the continuous gate dielectric material layer may be removed from above the horizontal plane including the top surfaces of the etch stop dielectric fins 18. A chemical mechanical planarization (CMP) process may be performed in which the top surfaces of the etch stop dielectric fins 18 are used as stopping surfaces. The isolation etch stop plate 49 may be collaterally removed during the CMP process. Each remaining portion of the continuous gate dielectric material layer comprises a gate dielectric layer 60. Each remaining portion of the continuous gate electrode material layer comprises a gate electrode rail. Each gate dielectric layer 60 and each gate electrode rail may laterally extend along the second horizontal direction hd2 over multiple stacks of semiconductor channel plates 10. Generally, each combination of a sacrificial gate structures 32 and underlying middle portions of the silicon-germanium plates 20 is replaced with a combination of a gate dielectric layer 60 and a gate electrode rail, which is subsequently divided into multiple gate electrodes.

Portions of the gate electrode rails and the gate dielectric layers 60 that overlie the top surfaces of the inter-device isolation structures (46, 48) may be removed by performing an etch back process. The etch back process may use an anisotropic etch process or an isotropic etch process. In one embodiment, top portions of the dielectric gate spacers 38 may be vertically recessed collaterally during the etch back process. Each gate electrode rail is divided into multiple gate electrodes 66. Each gate dielectric layer 60 may be divided into multiple gate dielectric layers 60. A combination of a gate dielectric layer 60 and a gate electrode 66 may be formed in each gate cavity 31. Each gate dielectric layer 60 contacts, and surrounds, at least one semiconductor channel plate 10, which may include a plurality of semiconductor channel plates 10. A gate electrode 66 laterally surrounds each semiconductor channel plate 10 of a field effect transistor.

A planarization dielectric layer 70 may be deposited over the gate electrodes 66. The planarization dielectric layer 70 includes a dielectric fill material such as undoped silicate glass, a doped silicate glass, hafnium oxide, hafnium silicate, silicon oxide carbide, aluminum oxide, aluminum oxynitride, zirconium oxide, zirconium silicate, titanium oxide, zirconium aluminum oxide, zinc oxide, tantalum oxide, lanthanum oxide, yttrium oxide, tantalum carbide nitride, silicon nitride, zirconium nitride, silicon carbide nitride, or a dielectric compound of silicon, oxygen, carbon, and nitrogen. Other dielectric fill materials are within the contemplated scope of disclosure. The thickness of the planarization dielectric layer 70 over the inter-device isolation structures (46, 48) may be in a range from 5 nm to 100 nm, such as from 10 nm to 50 nm, although lesser and greater thicknesses may also be used. The dielectric fill material may be deposited by a conformal deposition process such as a chemical mechanical deposition process. The top surface of the planarization dielectric layer 70 may be planarized by performing a planarization process such as a chemical mechanical planarization process. The planarization dielectric layer 70 continuously extends over the etch stop dielectric fins 18 and the inter-device isolation structures (46, 48).

Generally, a semiconductor nanostructure and at least one epitaxial semiconductor material portion 54 may be formed on a front surface of a substrate. A semiconductor nanostructure refers to a semiconductor structure having at least one nanoscale dimension, i.e., a dimension greater than 1 nm and less than 1 micron. The semiconductor nanostructure may include a gate-all-around (GAA) transistor, a stacked channel transistor, a multi-bridge channel transistor, a nanowire transistor, a multi-nanowire transistor, and so forth. In one embodiment, the semiconductor nanostructure can include at least one semiconductor channel having a nanoscale dimension such as a channel having a width and/or a height greater than 1 nm and less than 1 micron, such as greater than 1 nm and less than 100 nm. In one embodiment, the semiconductor nanostructure can include a GAA transistor. The semiconductor nanostructure (such as the GAA transistor) may be formed in the field effect transistor region 300, and each epitaxial semiconductor material portion 54 may be formed in the through-device-level connection region 400. The gate-all-around (GAA) transistor includes at least one semiconductor channel plate 10, a gate structure 350 comprising a gate dielectric layer 60, a gate electrode 66, a dielectric gate spacer 38, and dielectric channel spacers 22, and a first active region A1 and a second active region A2 located at end portions of the at least one semiconductor channel plate 10 and comprising a source region and a drain region. A dummy gate structure 450 may be located on a sidewall of the first active region A1, and may comprise an additional gate dielectric layer 60, an additional gate electrode 66, an additional dielectric gate spacer 38, and additional dielectric channel spacers 22. While the present disclosure is described employing an embodiment in which the semiconductor nanostructure comprises a GAA transistor, embodiments are expressly contemplated herein in which the semiconductor nanostructure comprises a stacked channel transistor, a multi-bridge channel transistor, a nanowire transistor, a multi-nanowire transistor, or other types of field effect transistors including a nanoscale semiconductor channel.

An epitaxial semiconductor material portion 54 may be laterally spaced from the GAA transistor. The epitaxial semiconductor material portion 54 contacts the additional dielectric gate spacer 38 and one of the additional dielectric channel spacers 22. Hybrid dielectric fins (14, 16) comprising a respective dielectric fin liner 14 embedding a respective dielectric fill material portion 16. The hybrid dielectric fins (14, 16) contact the gate structure 350, the first active region A1, the dummy gate structure 450, and the epitaxial semiconductor material portion 54.

Figure 13A:
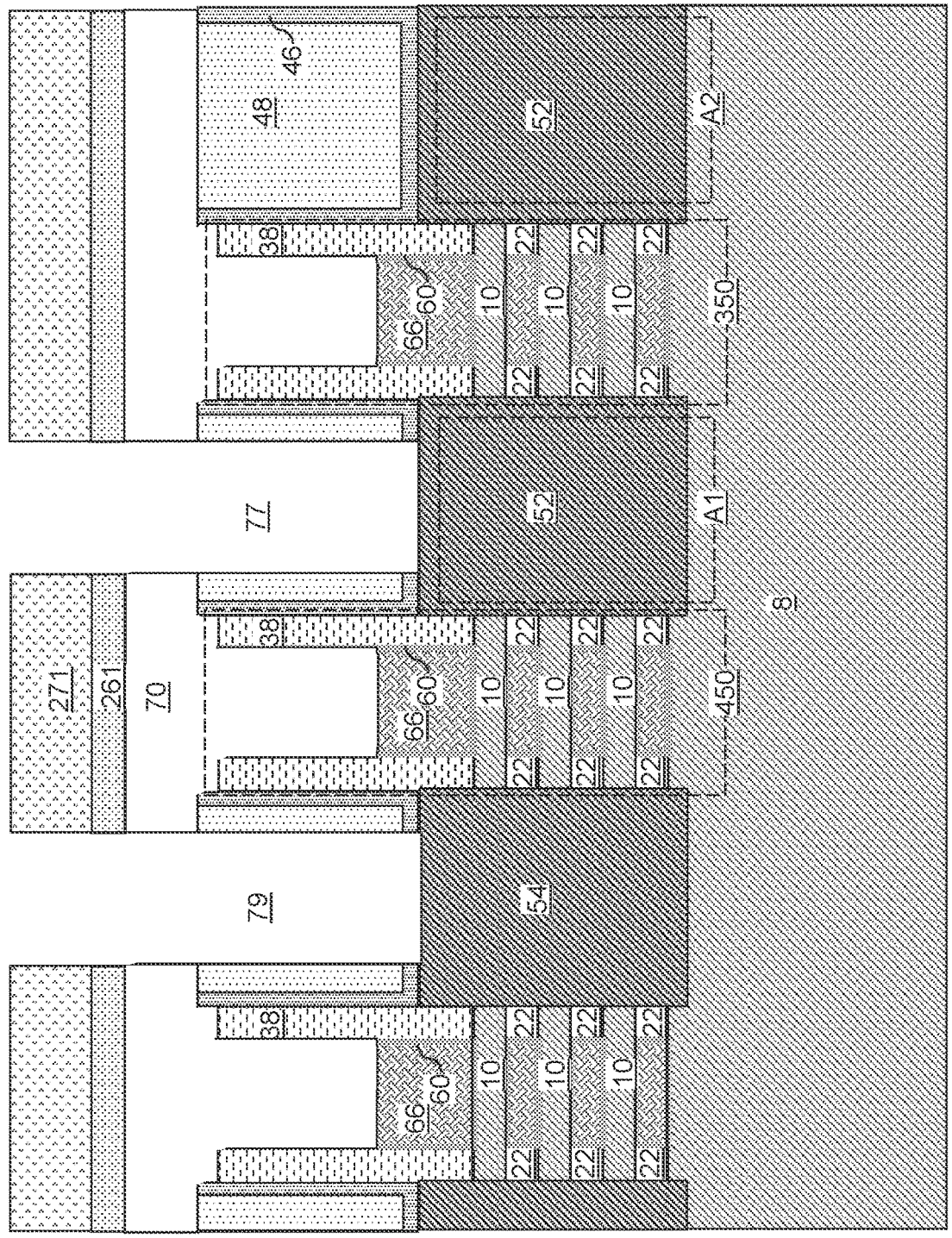
FIG. 13A is a vertical cross-sectional view of the exemplary structure after formation of recess cavities according to an embodiment of the present disclosure.
Figure 13B:
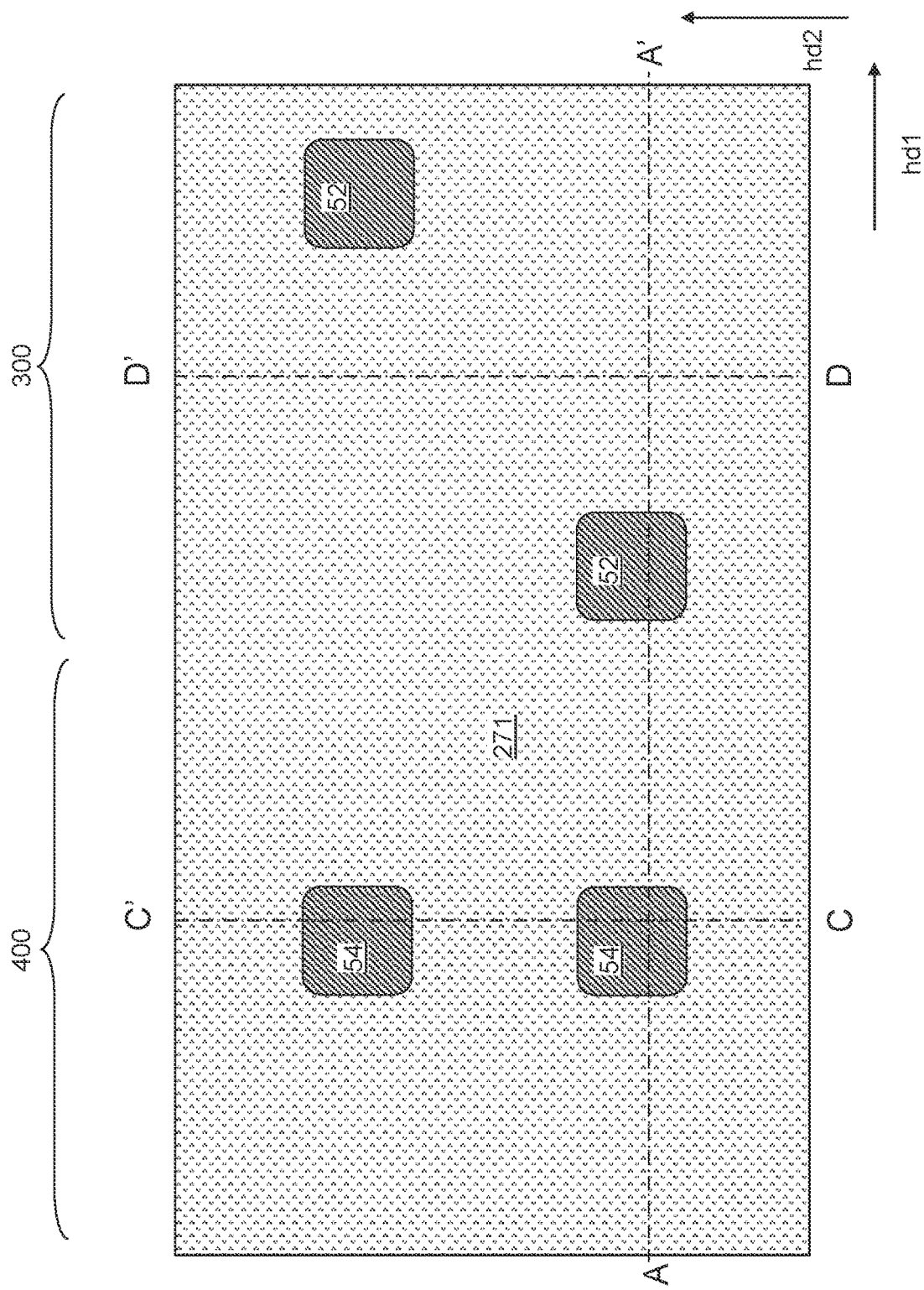
FIG. 13B is a top-down view of the exemplary structure of FIG. 13A. The vertical plane A-A' is the plane of the vertical cross-sectional view of FIG. 13A.

FIG. 13A is a vertical cross-sectional view of the exemplary structure after formation of recess cavities according to an embodiment of the present disclosure. FIG. 13B is a top-down view of the exemplary structure of FIG. 13A. The vertical plane A-A' is the plane of the vertical cross-sectional view of FIG. 13A. FIG. 13C is a vertical cross-sectional view along the vertical plane C-C' of FIG. 13B. FIG. 13D is a vertical cross-sectional view along the vertical plane D-D' of FIG. 13B. Referring to FIGS. 13A-13D, a first bottom antireflective coating (BARC) layer 261 and a first photoresist layer 271 may be applied over the planarization dielectric layer 70, and may be lithographically patterned to form discrete openings in areas that overlie the first active region A1, the second active region A2, and two epitaxial semiconductor material portions 54. Recess cavities (77, 79) may be formed through the planarization dielectric layer 70 and the inter-device isolation structures (46, 48) by performing an anisotropic etch process. The recess cavities (77, 79) include first recess cavities 77 that are formed over the active regions (A1, A2) and second recess cavities 79 that are formed over the epitaxial semiconductor material portions 54. A top surface of the first active region A1 or the second active region A2 (i.e., a top surface of one of the source/drain regions 52) is physically exposed at a bottom of each first recess cavity 77. A top surface of an epitaxial semiconductor material portion 54 is physically exposed at a bottom of each second recess cavity 79. The first photoresist layer 271 and the first BARC layer 261 may be subsequently removed, for example, by ashing.

Figure 14A:
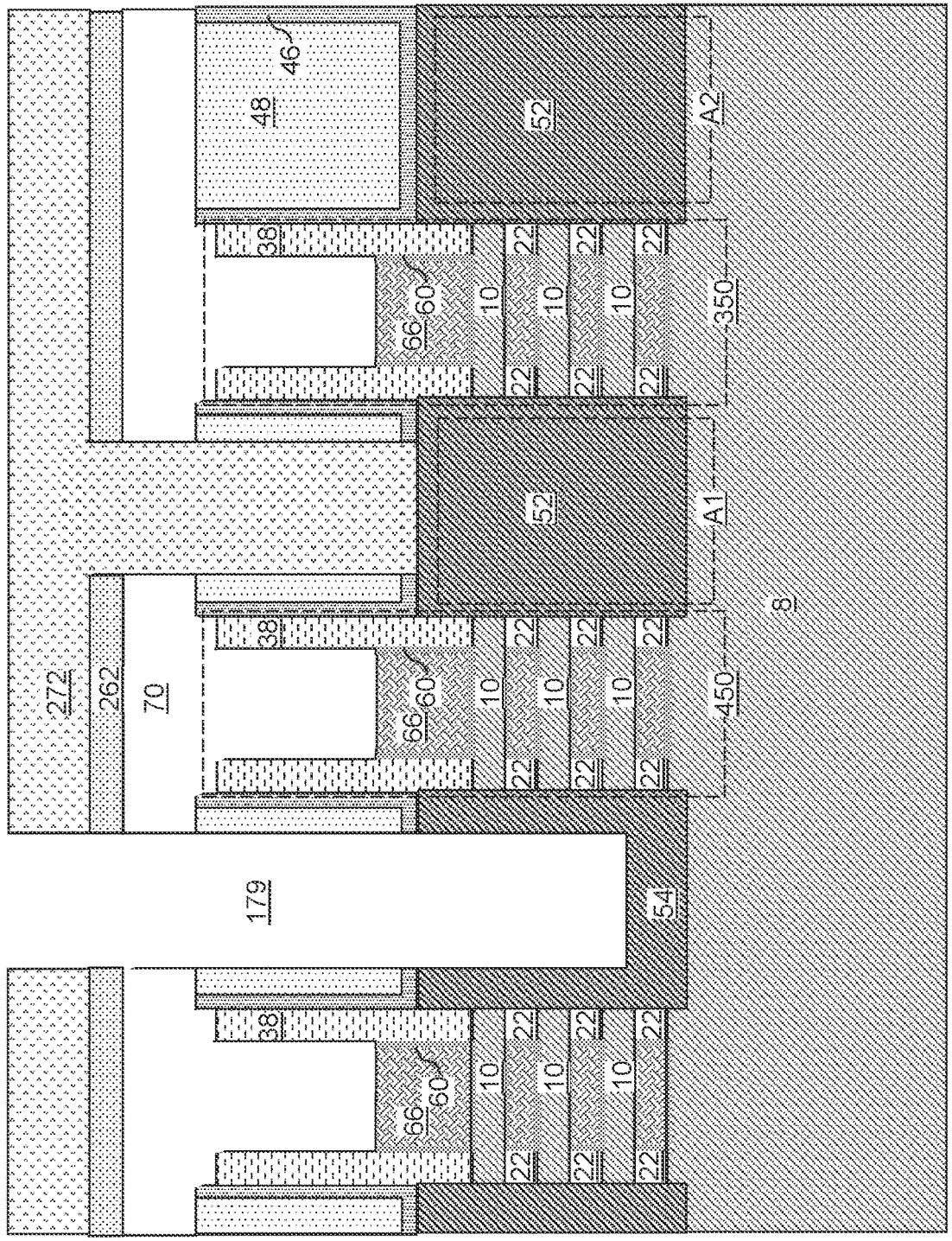
FIG. 14A is a vertical cross-sectional view of the exemplary structure after formation of connector via cavities according to an embodiment of the present disclosure.
Figure 14B:
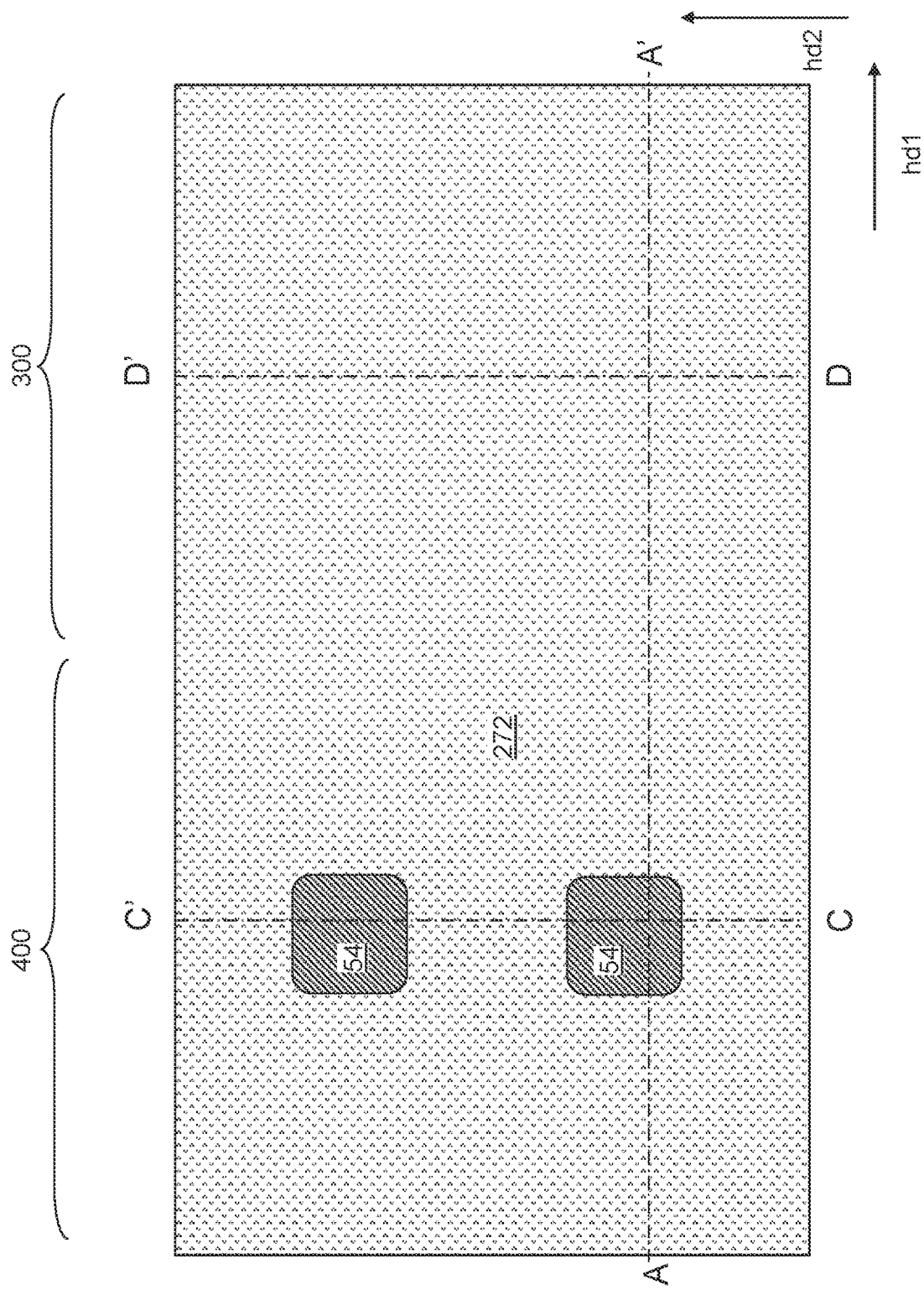
FIG. 14B is a top-down view of the exemplary structure of FIG. 14A. The vertical plane A-A' is the plane of the vertical cross-sectional view of FIG. 14A.

FIG. 14A is a vertical cross-sectional view of the exemplary structure after formation of connector via cavities according to an embodiment of the present disclosure. FIG. 14B is a top-down view of the exemplary structure of FIG. 14A. The vertical plane A-A' is the plane of the vertical cross-sectional view of FIG. 14A. Referring to FIGS. 14A and 14B, a second bottom antireflective coating (BARC) layer 262 and a second photoresist layer 272 may be applied over the planarization dielectric layer 70, and may be lithographically patterned to form discrete openings in areas that overlie the two epitaxial semiconductor material portions 54. Thus, the areas of the openings in the second photoresist layer 272 overlap with the areas of the second recess cavities 79, and do not have any overlap with the areas of the first recess cavities 77. The areas of the first active region A1 and the second active region A2 are covered by the second photoresist layer 272, which functions as an etch mask layer during a subsequent anisotropic etch process.

An anisotropic etch process is performed to vertically recess the second recess cavities 79 while the first recess cavities 77 are masked with an etch mask layer such as the second photoresist layer 272. Each second recess cavity 79 is vertically extended through a respective epitaxial semiconductor material portion 54 to provide a connector via cavity 179. Each connector via cavity 179 vertically extends into the respective epitaxial semiconductor material portion 54, and may, or may not, extend through the respective epitaxial semiconductor material portion 54. Thus, a top surface of the substrate single crystalline semiconductor layer 8 may, or may not, be physically exposed at the bottom each connector via cavity 179. Sidewalls of the respective epitaxial semiconductor material portion 54 are physically exposed around each connector via cavity 179. The second photoresist layer 272 and the second BARC layer 262 may be subsequently removed, for example, by ashing.

Figure 15:
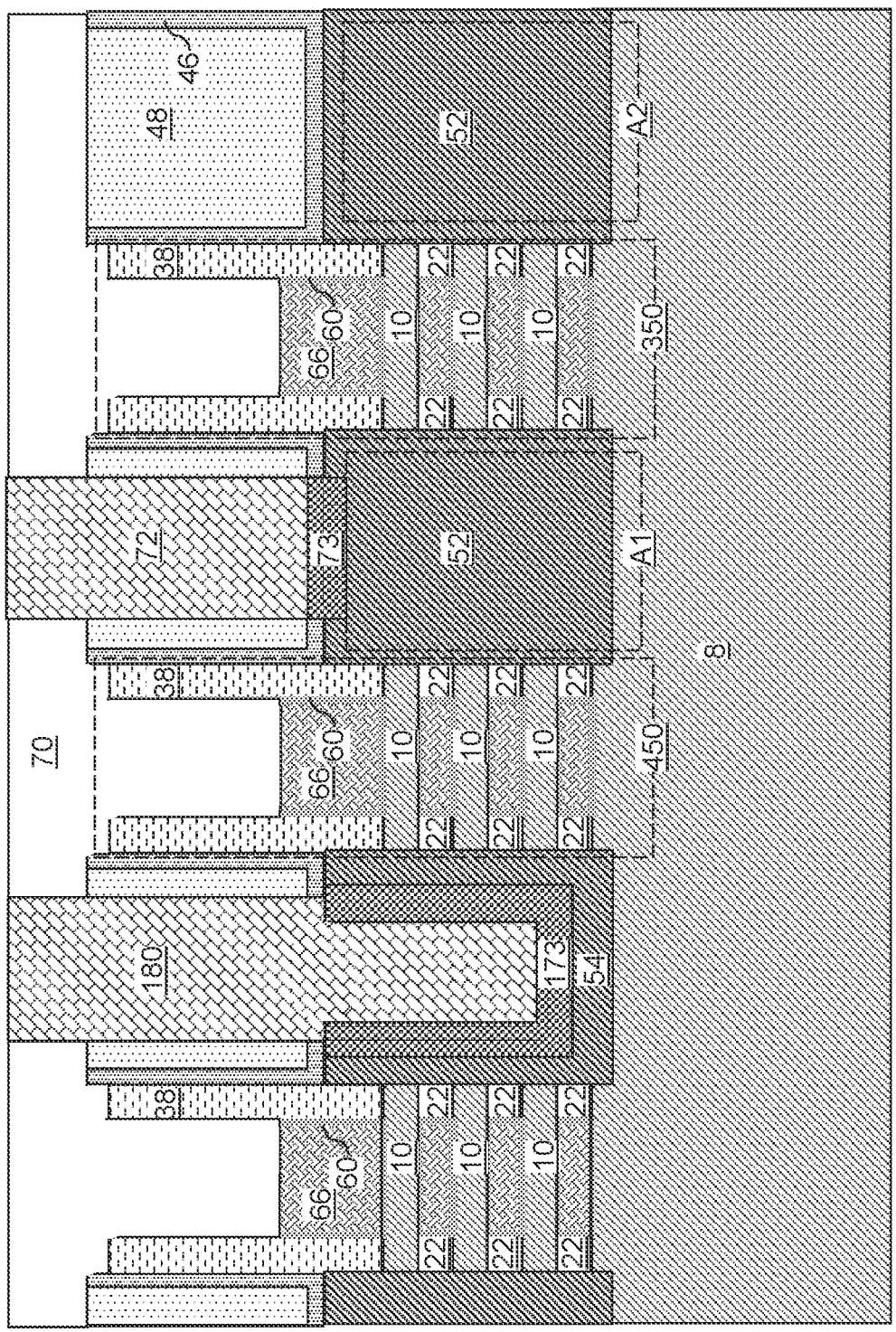
FIG. 15 is a vertical cross-sectional view of the exemplary structure after formation of connector via structures and metallic cap structures according to an embodiment of the present disclosure.

FIG. 15 is a vertical cross-sectional view of the exemplary structure after formation of connector via structures and metallic cap structures according to an embodiment of the present disclosure. Referring to FIG. 15, at least one metallic material may be deposited in the connector via cavities 179 and the first recess cavities 77. The at least one metallic material may include at least one elemental metal, at least one intermetallic alloy, and/or at least one conductive metallic compound. For example, the at least one metallic material may include W, Ru, Co, Cu, Ti, Ta, Mo, Ni, TiN, TaN, WN, alloys thereof, and/or stacks thereof. Other suitable metallic materials are within the contemplated scope of disclosure. Excess portions of the at least one metallic material may be removed from above the planarization dielectric layer 70 by chemical mechanical planarization process. Each remaining portion of the at least one metallic material filling the connector via cavities 179 comprises a connector via structure 180. Each remaining portion of the at least one metallic material filling the first recess cavities 77 comprise a metallic cap structure 72. The top surfaces of the connector via structure 180 and the metallic cap structures 72 may be within the horizontal plane including the top surface of the planarization dielectric layer 70. The connector via structures 180 and the metallic cap structures 72 may include the same conductive material, which may be a metallic material.

In one embodiment, a connector via structures 180 may contact the substrate single crystalline semiconductor layer 8. In another embodiment, a connector via structures 180 may be vertically spaced from the substrate single crystalline semiconductor layer 8 by a remaining portion of the epitaxial semiconductor material portion 54. In one embodiment, a conductor via structure 180 may contact one or more hybrid dielectric fins (14, 16). Each hybrid dielectric fin (14, 16) comprises comprising a respective dielectric fin liner 14 embedding a respective dielectric fill material portion 16.

In one embodiment, the at least one metallic material of the conductive via structures 180 and the metallic cap structures 72 may include a material that forms a metal silicide upon reaction with silicon. For example, the at least one metallic material may include tungsten, titanium, cobalt, nickel, or another elemental metal that forms a stable phase metal silicide material. Other suitable metallic materials are within the contemplated scope of disclosure. A thermal anneal process may be performed at an elevated temperature to form metal silicide portions (73, 173). The metal silicide portions (73, 173) may include active-region metal silicide portions 73 that are formed on the active regions (A1, A2) (such as the source/drain regions 52) and connector metal silicide portions 173 that are formed on the epitaxial semiconductor material portion 54. The elevated temperature may be in a range from 500 degrees Celsius to 850 degrees Celsius, although lower and higher temperatures may also be used. Each active-region metal silicide portion 73 may be disposed between a respective underlying active region (A1 or A2) and an overlying metallic cap structure 72. Each connector metal silicide portion 173 may be formed between a connector via structure 180 and an epitaxial semiconductor material portion 54.

Figure 16:
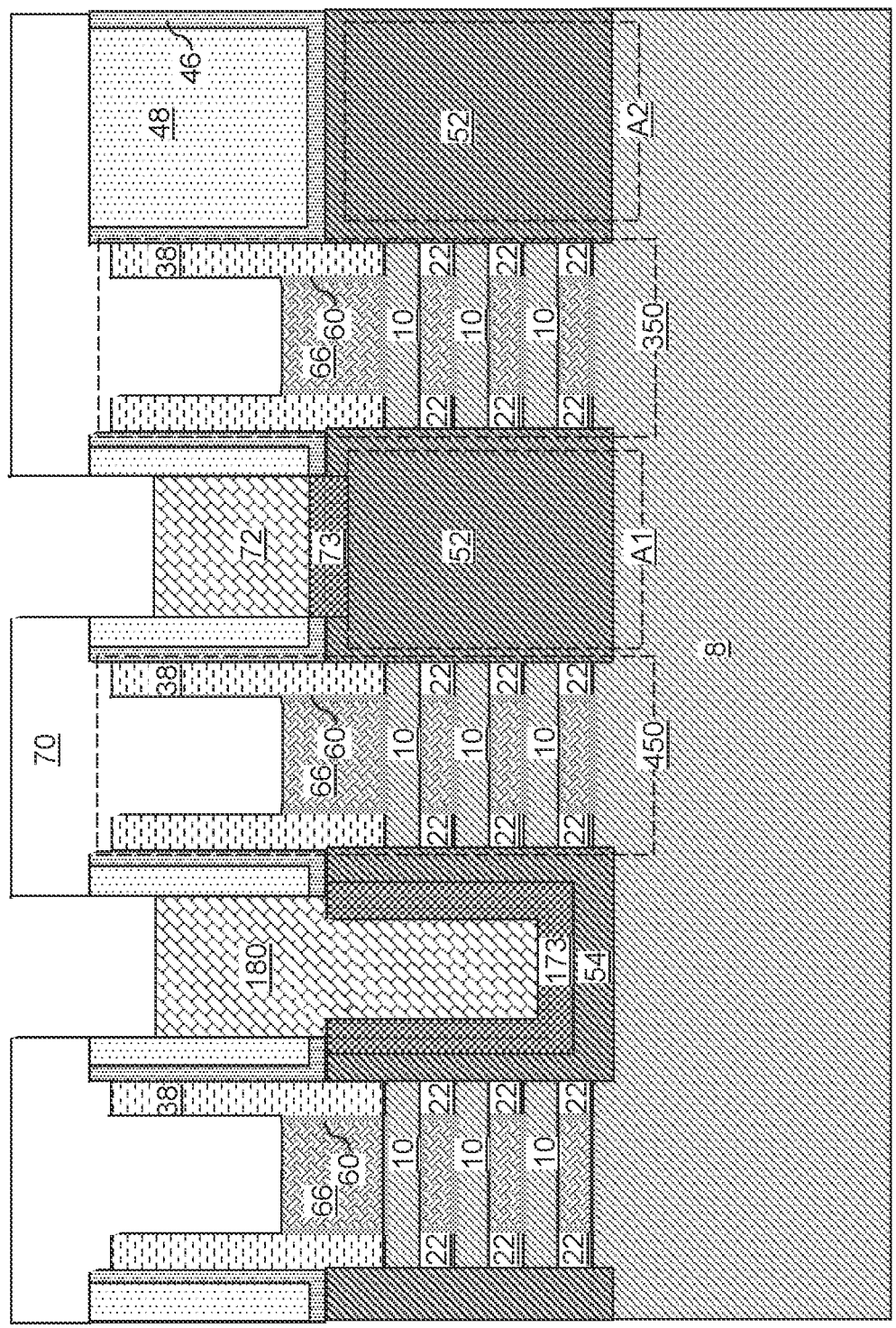
FIG. 16 is a vertical cross-sectional view of the exemplary structure after vertically recessing the connector via structures and the metallic cap structures according to an embodiment of the present disclosure.

FIG. 16 is a vertical cross-sectional view of the exemplary structure after vertically recessing the connector via structures and the metallic cap structures according to an embodiment of the present disclosure. Referring to FIG. 16, the connector via structures 180 and the metallic cap structures 72 may be vertically recessed by performing an etch process, which may be an isotropic etch process (such as a wet etch process) or an anisotropic etch process (which may be a reactive ion etch process). Thus, the metallic material in the first recess cavity 77 and in the connector via cavity 179 may be vertically recessed in the same etch process. The connector via structures 180 may have a height that is greater that the height of the metallic cap structures 72. The bottom surface of each connector via structure 180 may be more proximal to the horizontal plane including the bottom surface the first active region A1 that the bottom surface of each metallic cap structure 72 is to the horizontal plane including the bottom surface of the first active region A1. In one embodiment, the top surfaces of the connector via structures 180 may be vertically recessed at a same etch rate as the top surfaces of the metallic cap structures 72. In this embodiment, the top surfaces of the connector via structures 180 may be located within the same horizontal plane as the top surfaces of the metallic cap structures 72. In one embodiment, the top surfaces of the connector via structures 180 and the metallic cap structures 72 may be recessed below the horizontal plane including the top surfaces of the dielectric gate spacer 38. The top surface of the connector via structures 180 and the metallic cap structures 72 are located above the horizontal plane including the top surfaces of the active regions (A1, A2), which include the source/drain regions 52.

Recess cavities are formed over the metallic cap structures 72 and the connector via structures 180.

Figure 17:
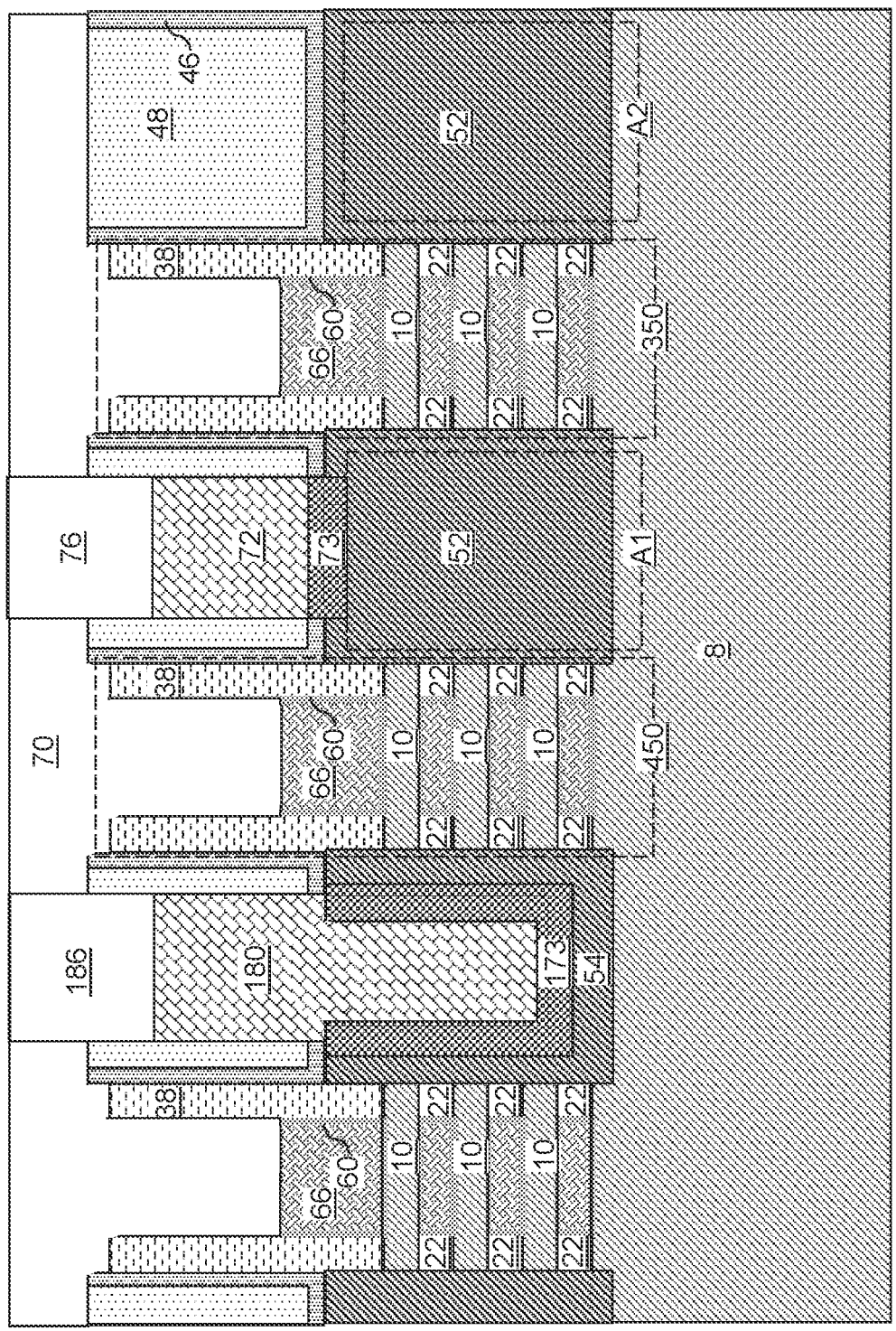
FIG. 17 is a vertical cross-sectional view of the exemplary structure after formation of dielectric cap structures according to an embodiment of the present disclosure.

FIG. 17 is a vertical cross-sectional view of the exemplary structure after formation of dielectric cap structures according to an embodiment of the present disclosure. Referring to FIG. 17, a dielectric fill material may be deposited in unfilled volumes of the recess cavities over the metallic cap structures 72 and the connector via structures 180. The dielectric fill material may include any of the materials that may be used for the planarization dielectric layer 70. For example, the dielectric fill material may include any of undoped silicate glass, a doped silicate glass, hafnium oxide, hafnium silicate, silicon oxide carbide, aluminum oxide, aluminum oxynitride, zirconium oxide, zirconium silicate, titanium oxide, zirconium aluminum oxide, zinc oxide, tantalum oxide, lanthanum oxide, yttrium oxide, tantalum carbide nitride, silicon nitride, zirconium nitride, silicon carbide nitride, or a dielectric compound of silicon, oxygen, carbon, and nitrogen. Other dielectric fill materials are within the contemplated scope of disclosure. Excess portions of the dielectric fill material may be removed from above the horizontal plane including the top surface of the planarization dielectric layer 70, for example, by chemical mechanical planarization. Dielectric cap structures (76, 186) are formed in the recess cavities. Specifically, transistor-side dielectric cap structures 76 are formed over each metallic cap structure 72, and connector-side dielectric cap structures 186 may be formed over each connector via structure 180.

In one embodiment, the dielectric cap structures (76, 186) may include a different dielectric material than the planarization dielectric layer 70. The transistor-side dielectric cap structures 76 and the connector-side dielectric cap structures 186 may include the same dielectric material. The top surface of each dielectric cap structure (76, 186) may be formed within a horizontal plane including the top surface of the planarization dielectric layer 70. Generally, a dielectric fill material may be deposited in an unfilled volume of each first recess cavity 77 over a respective metallic cap structure 72, and in an unfilled volume of each connector via cavity 179 over a respective connector via structure 180. A transistor-side dielectric cap structure 76 may be formed over each metallic cap structure 72, and n connector-side dielectric cap structure 186 may be formed over each connector via structure 180. Each transistor-side dielectric cap structure 76 may contact a top surface of a respective metallic cap structure 72, and may have a top surface within the horizontal plane including a top surface of the planarization dielectric layer 70. Each connector-side dielectric cap structure 186 may contact a top surface of a respective connector via structure 180, and may have a top surface within the horizontal plane including the top surface of the planarization dielectric layer 70.

Figure 18:
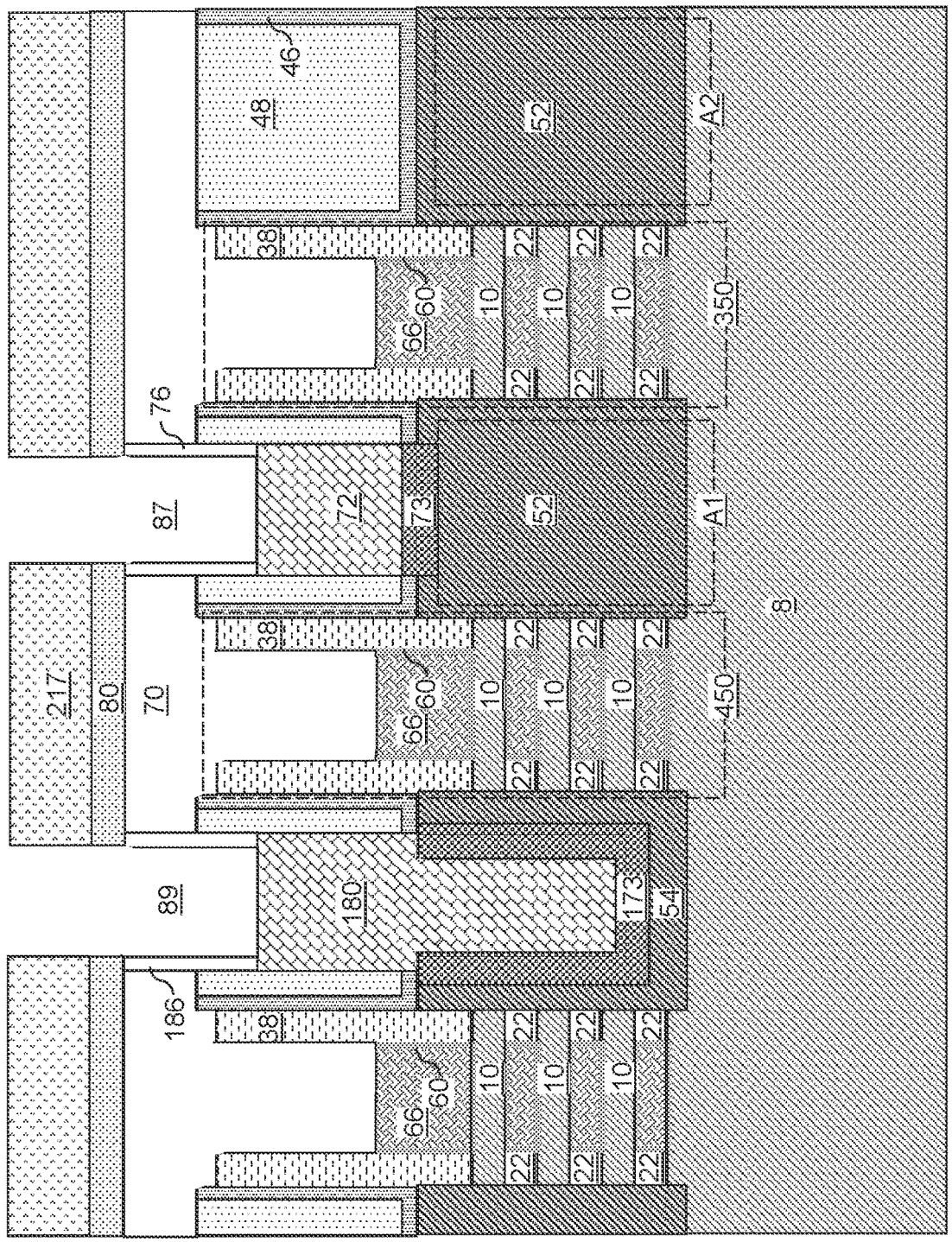
FIG. 18 is a vertical cross-sectional view of the exemplary structure after formation of a via-level dielectric layer and front-side via cavities according to an embodiment of the present disclosure.

FIG. 18 is a vertical cross-sectional view of the exemplary structure after formation of a via-level dielectric layer and front-side via cavities according to an embodiment of the present disclosure. Referring to FIG. 18, a via-level dielectric layer 80 may be deposited over the planarization dielectric layer 70. The via-level dielectric layer 80 includes a dielectric material such as undoped silicate glass, a doped silicate glass, organosilicate glass, or a porous low dielectric constant (low-k) dielectric material. The thickness of the via-level dielectric layer 80 may be in a range from 100 nm to 300 nm, although lesser and greater thicknesses may also be used.

A photoresist layer 217 may be applied over the via-level dielectric layer 80, and may be lithographically patterned to form openings in areas that overlie the metallic cap structures 72 or the connector via structures 180. An anisotropic etch process may be performed to form via cavities that extend through the via-level dielectric layer 80 and optionally through the transistor-side dielectric cap structures 76. The via cavities are formed on the front side of the exemplary structure, and as such, are herein referred to as front-side via cavities (87, 89). The front-side via cavities (87, 89) include first front-side via cavities 87 that extend to a top surface of a respective one of the metallic cap structures 72, and second front-side via cavities 89 that extend to a top surface of a respective one of the connector via cavities 179. The photoresist layer 217 may be subsequently removed, for example, by ashing.

Figure 19A:
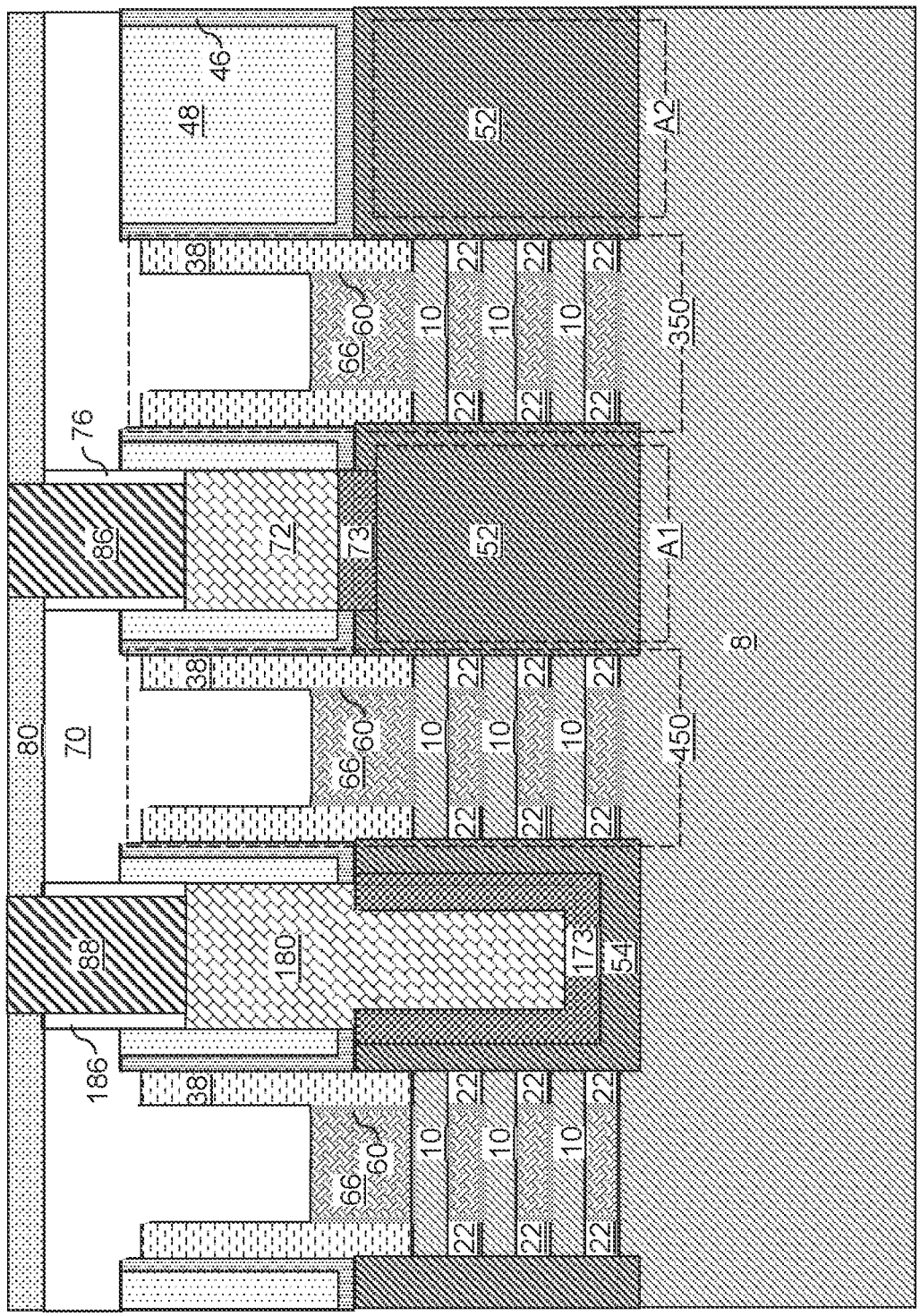
FIG. 19A is a vertical cross-sectional view of the exemplary structure after formation of front-side via structures according to an embodiment of the present disclosure.
Figure 19B:
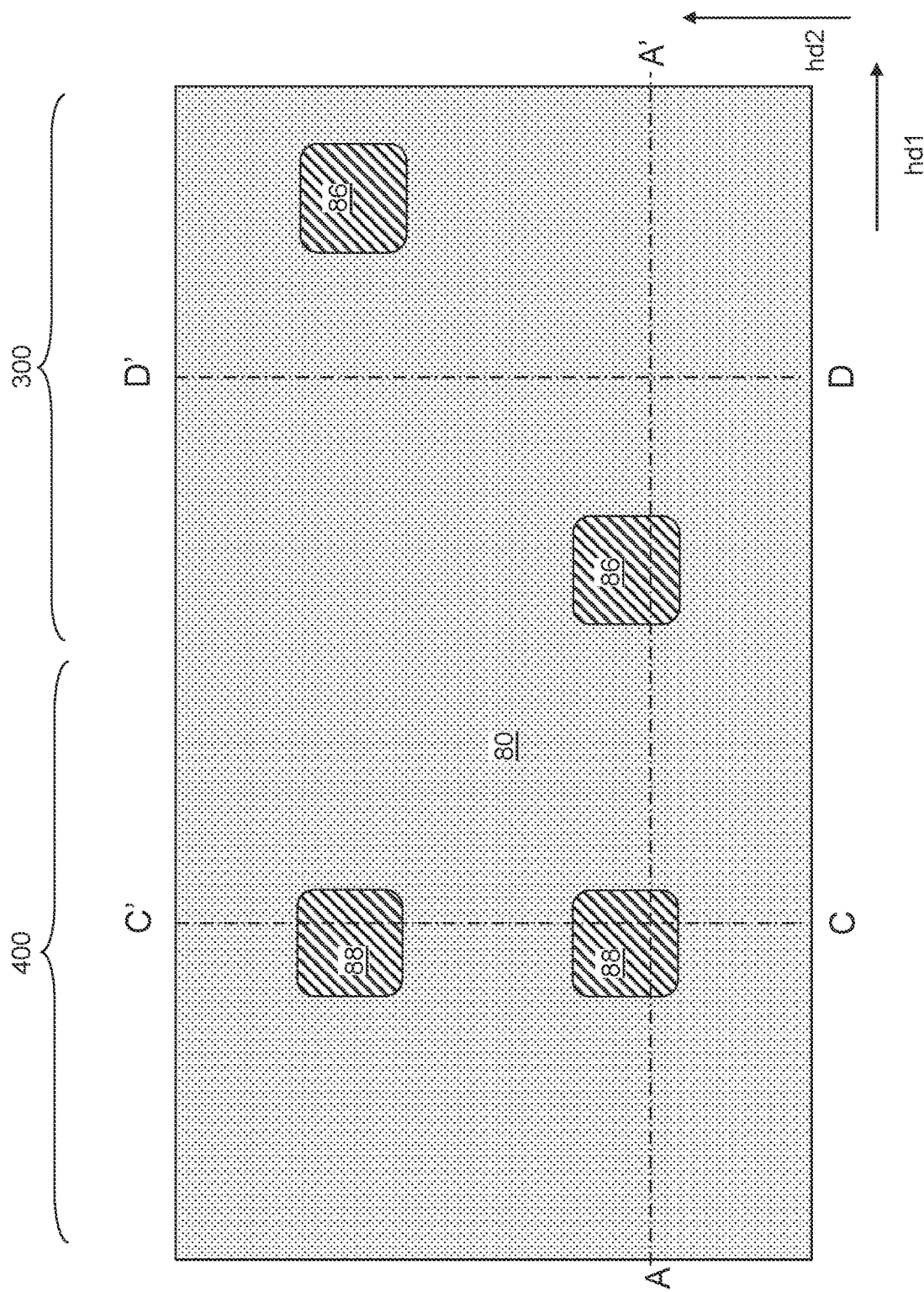
FIG. 19B is a top-down view of the exemplary structure of FIG. 19A. The vertical plane A-A' is the plane of the vertical cross-sectional view of FIG. 19A.

FIG. 19A is a vertical cross-sectional view of the exemplary structure after formation of front-side via structures according to an embodiment of the present disclosure. FIG. 19B is a top-down view of the exemplary structure of FIG. 19A. The vertical plane A-A' is the plane of the vertical cross-sectional view of FIG. 19A. Referring to FIGS. 19A and 19B, at least one conductive material may be deposited in the front-side via cavities (87, 89). The at least one conductive material may include at least one elemental metal, at least one intermetallic alloy, and/or at least one conductive metallic compound. For example, the at least one conductive material may include W, Ru, Co, Cu, Ti, Ta, Mo, Ni, TiN, TaN, WN, alloys thereof, and/or stacks thereof. Other suitable conductive materials are within the contemplated scope of disclosure. Excess portions of the at least one conductive material may be removed from above the via-level dielectric layer 80 by a planarization process such as a recess etch process and/or a chemical mechanical planarization process. Top surfaces of remaining portions of the at least one conductive material may be coplanar with the top surface of the via-level dielectric layer 80.

Each remaining portion of the at least one conductive material comprises a front-side contact via structure (86, 88). The front-side contact via structures (86, 88) include active-region-side contact via structures 86 that contact a respective one of the metallic cap structures 72, and connector-side contact via structures 88 that contact a respective one of the connector via structures 180. Each active-region-side contact via structure 86 extends through the via-level dielectric layer 80 and through a transistor-side dielectric cap structure 76. Each connector-side contact via structure 88 extends through the via-level dielectric layer 80 and through a connector-side dielectric cap structure 186. In one embodiment, top surfaces of the active-region-side contact via structures 86 and the connector-side contact via structure 88 are located within the horizontal plane including a top surface of the via-level dielectric layer 80. The active-region-side contact via structures 86 and the connector-side contact via structures 88 comprise the same metal.

Each active-region-side contact via structure 86 may be formed on a respective metallic cap structure 72, and may contact a top surface of the respective metallic cap structure 72. Each active-region contact via structure 86 contacts, and is laterally surrounded by, a respective transistor-side dielectric cap structure 76. Each connector-side contact via structure 88 may be formed on a respective connector via structure 180, and may contact the top surface of the respective connector via structure 180. Each connector-side contact via structure 88 contacts, and is laterally surrounded by, a respective connector-side dielectric cap structure 186.

Figure 20A:
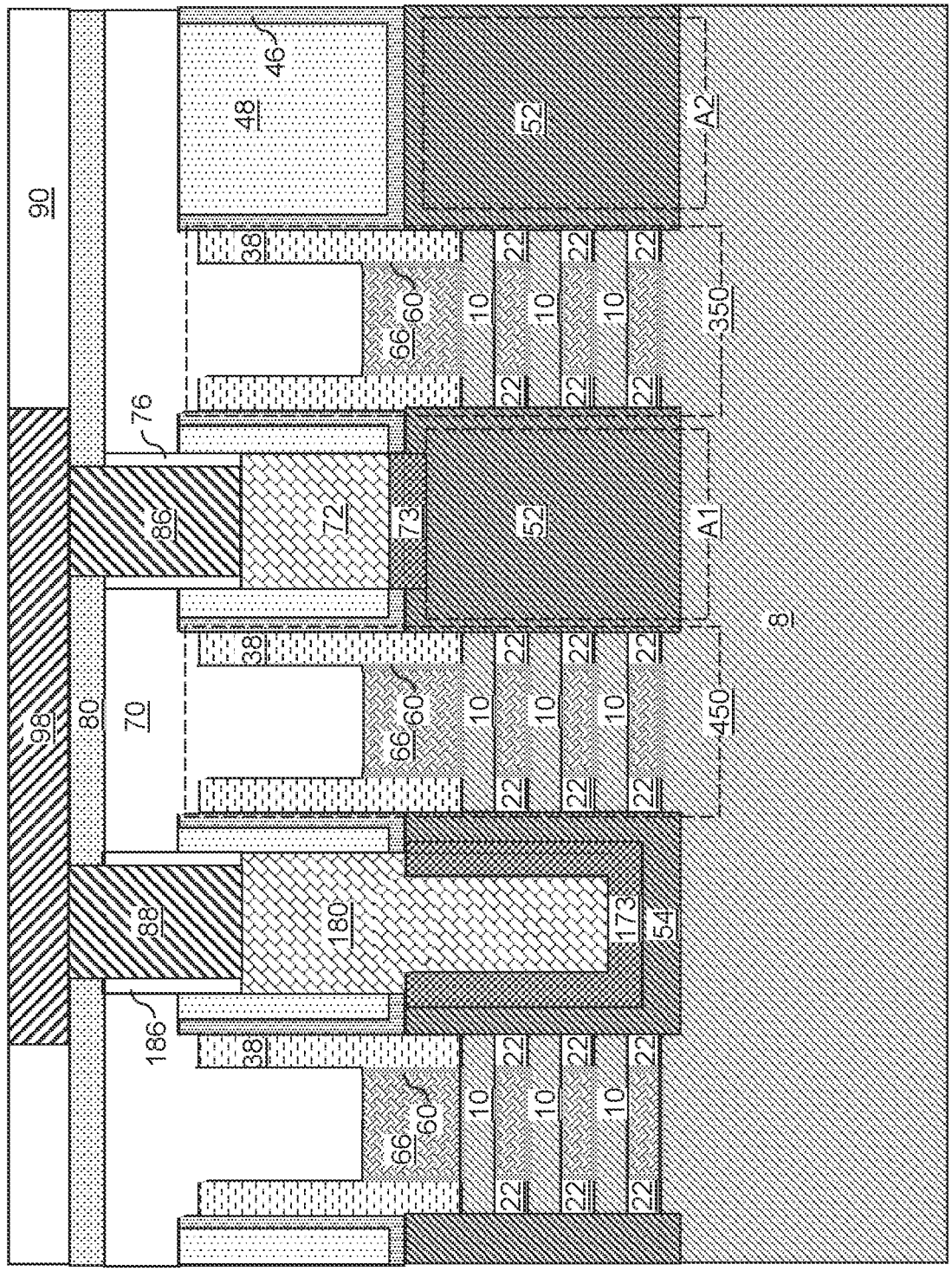
FIG. 20A is a vertical cross-sectional view of the exemplary structure after formation of a line-level dielectric layer and metal lines according to an embodiment of the present disclosure.
Figure 20B:
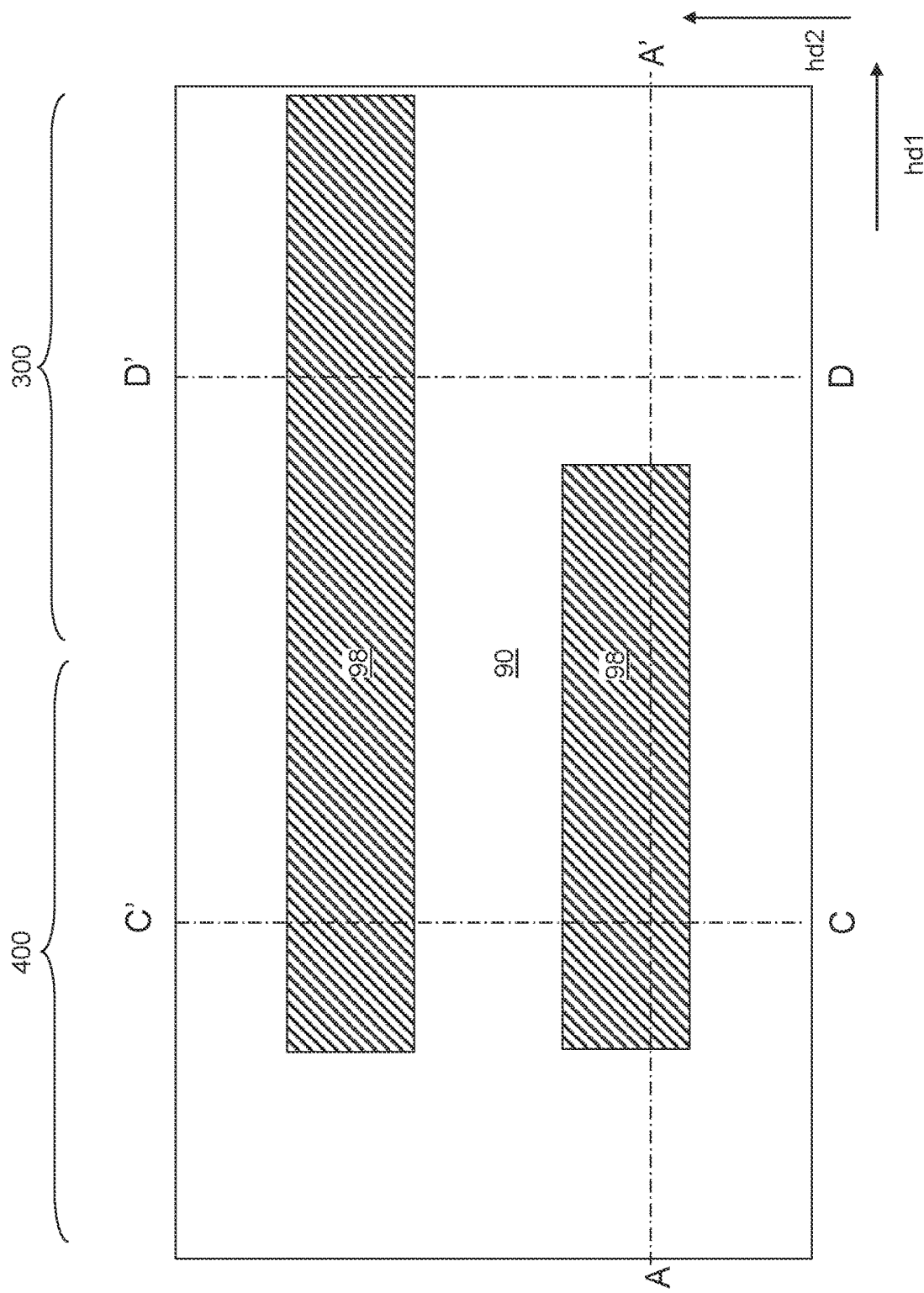
FIG. 20B is a top-down view of the exemplary structure of FIG. 20A. The vertical plane A-A' is the plane of the vertical cross-sectional view of FIG. 20A.

FIG. 20A is a vertical cross-sectional view of the exemplary structure after formation of a line-level dielectric layer and metal lines according to an embodiment of the present disclosure. FIG. 20B is a top-down view of the exemplary structure of FIG. 20A. The vertical plane A-A' is the plane of the vertical cross-sectional view of FIG. 20A. Referring to FIGS. 20A and 20B, a line-level dielectric layer 90 may be deposited over the via-level dielectric layer 80. Line trenches may be formed in areas that connect a respective pair of an active-region-side contact via structures 86 and a connector-side contact via structure 88. For example, a photoresist layer may be applied over the line-level dielectric layer 90, and may be patterned to form line-shaped openings. The pattern in the photoresist layer may be transferred through the line-level dielectric layer 90 to form the line trenches by performing an anisotropic etch process. The photoresist layer may be subsequently removed. At least one metallic material may be deposited in the line trenches, and may be subsequently planarized, for example, by chemical mechanical planarization. Each remaining portion of the at least one conductive material in the line trenches constitutes a metal line 98. A metal line 98 may contact a top surface of an active-region-side contact via structure 86 and a top surface of a connector-side contact via structure 88. Generally, front-side metal interconnect structures (86, 88, 98) may be formed on the connector via structures 180 and the metallic cap structures 72 to provide electrical connection between pairs of a metallic cap structure 72 and a connector via structure 180.

Figure 21:
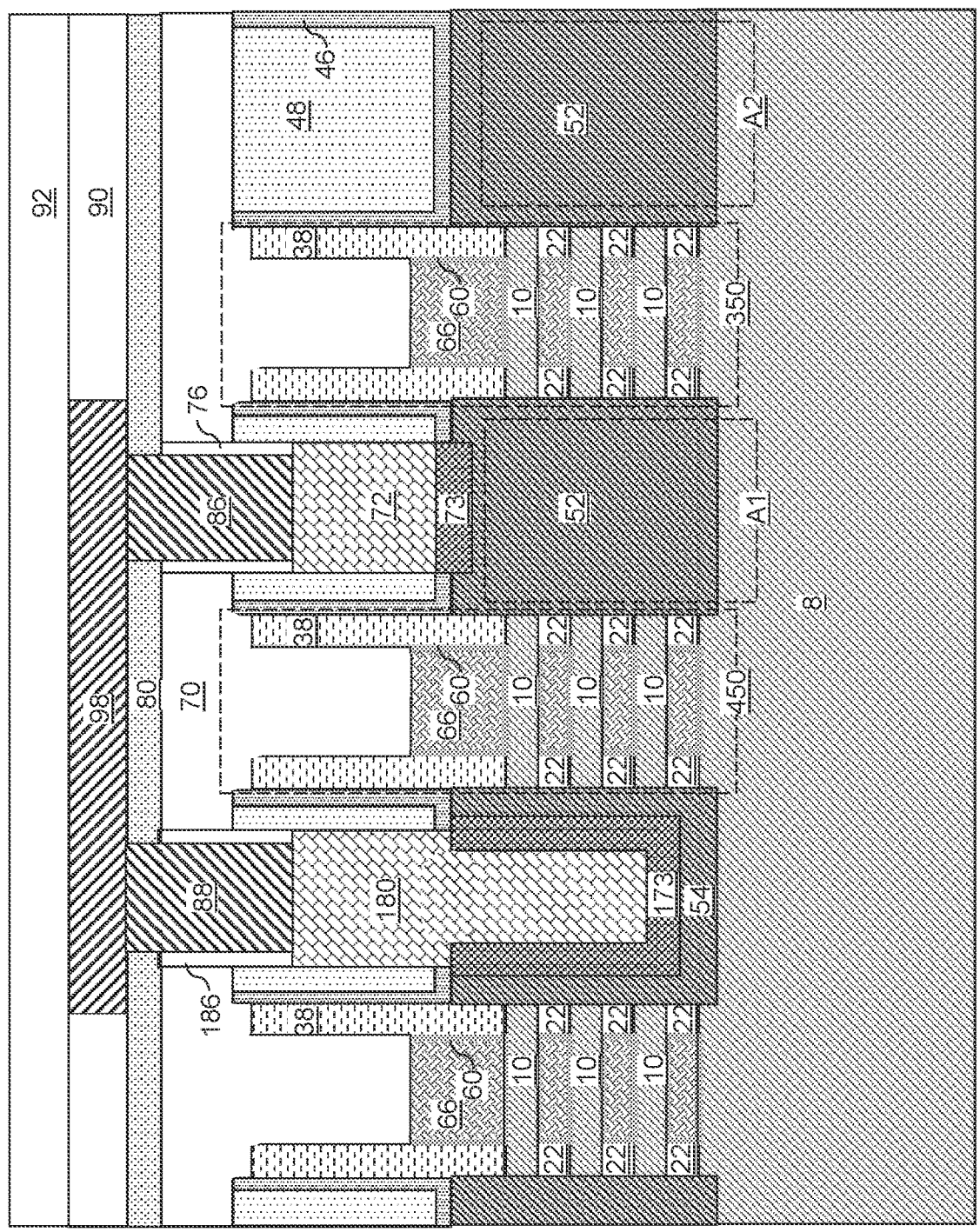
FIG. 21 is a vertical cross-sectional view of the exemplary structure after formation of additional front-side dielectric layers and front-side metal interconnect structures according to an embodiment of the present disclosure.

FIG. 21 is a vertical cross-sectional view of the exemplary structure after formation of additional front-side dielectric layers and front-side metal interconnect structures according to an embodiment of the present disclosure. Referring to FIG. 21, additional front-side dielectric layers 92 and additional front-side metal interconnect structures (not shown) may be optionally formed. Bonding pads (not shown) may be formed, and wafer packaging and/or wafer bonding processes may be subsequently performed.

Figure 22A:
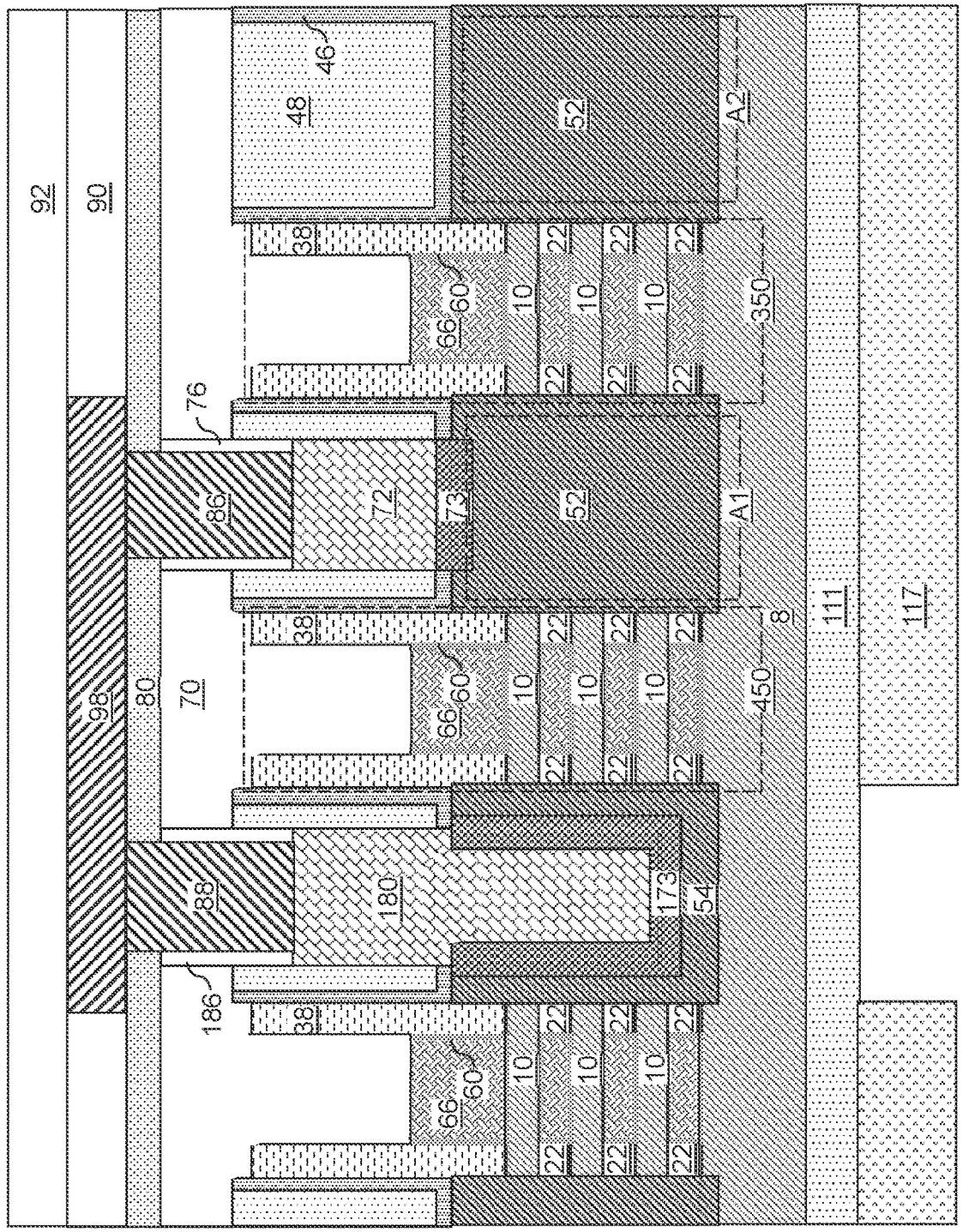
FIG. 22A is a vertical cross-sectional view of the exemplary structure after thinning the semiconductor substrate layer, formation of a backside hard mask layer, and a patterned photoresist layer according to an embodiment of the present disclosure.
Figure 22B:
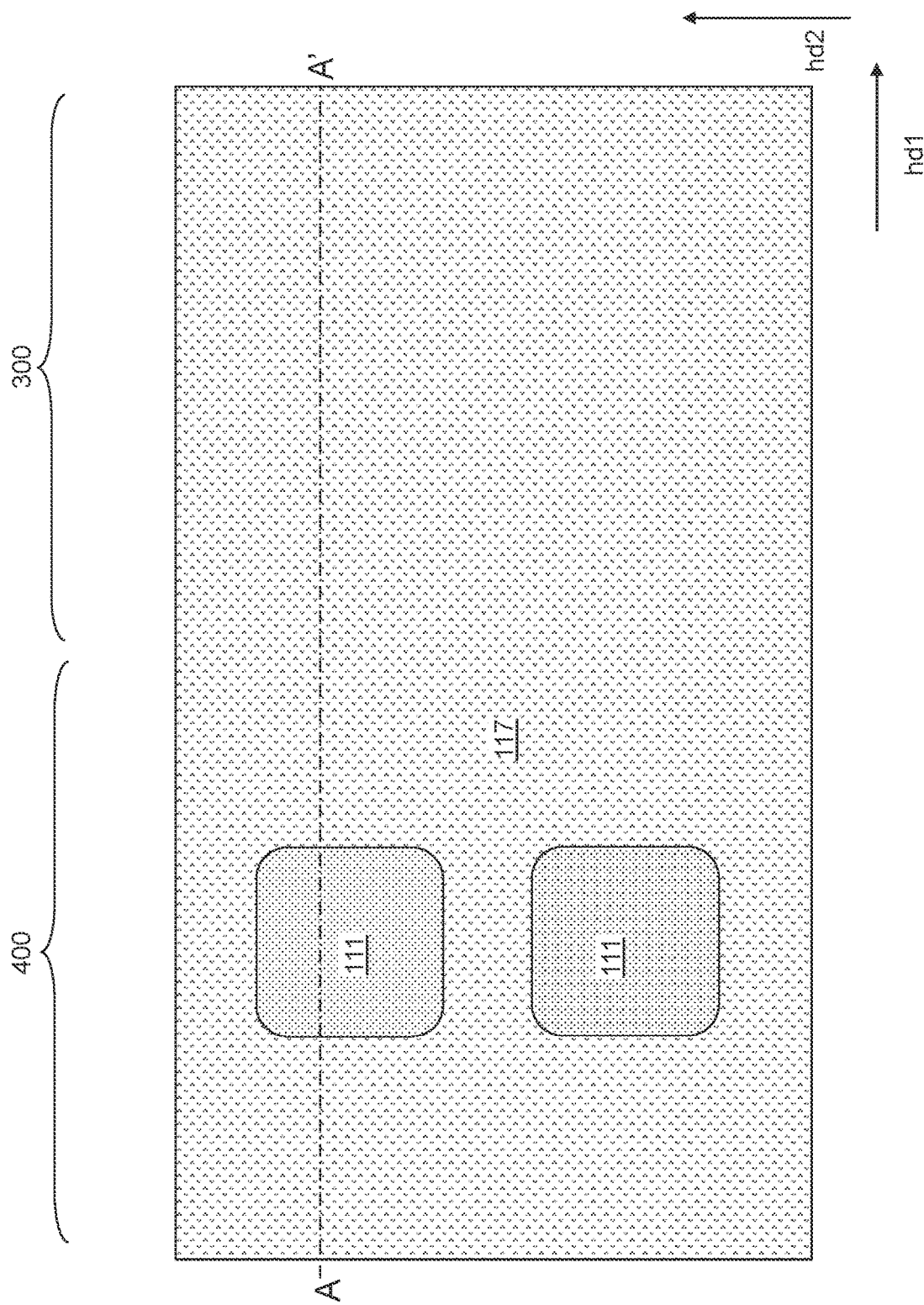
FIG. 22B is a bottom-up view of the exemplary structure of FIG. 21A. The vertical plane A-A' is the plane of the vertical cross-sectional view of FIG. 21A.

FIG. 22A is a vertical cross-sectional view of the exemplary structure after thinning the semiconductor substrate layer, formation of a backside hard mask layer, and a patterned photoresist layer according to an embodiment of the present disclosure. FIG. 22B is a bottom-up view of the exemplary structure of FIG. 21A. The vertical plane A-A' is the plane of the vertical cross-sectional view of FIG. 21A. Referring to FIGS. 22A and 22B, the substrate single crystalline semiconductor layer 8 may be thinned, for example, by grinding, chemical etching, and/or chemical mechanical planarization. The thickness of the substrate single crystalline semiconductor layer 8 as thinned may be in a range from 0.5 micron to 10 microns, such as from 1 micron to 5 microns, although lesser and greater thicknesses may also be used.

A backside hard mask layer 111 may be deposited on the thinned backside surface of the substrate single crystalline semiconductor layer 8. The backside hard mask layer 111 includes a dielectric material such as silicon oxide, silicon nitride, or a dielectric metal oxide. The thickness of the backside hard mask layer 111 may be in a range from 50 nm to 200 nm, although lesser and greater thicknesses may also be used. While the exemplary structure is illustrated in the upright position, it is understood that the exemplary structure may be flipped upside down for the purpose of performing backside processing steps including deposition of the backside hard mask layer 111 and subsequent processing steps. A photoresist layer 117 may be applied on the backside hard mask layer 111, and may be lithographically patterned to form openings within the areas of the connector via structures 180.

Figure 23:
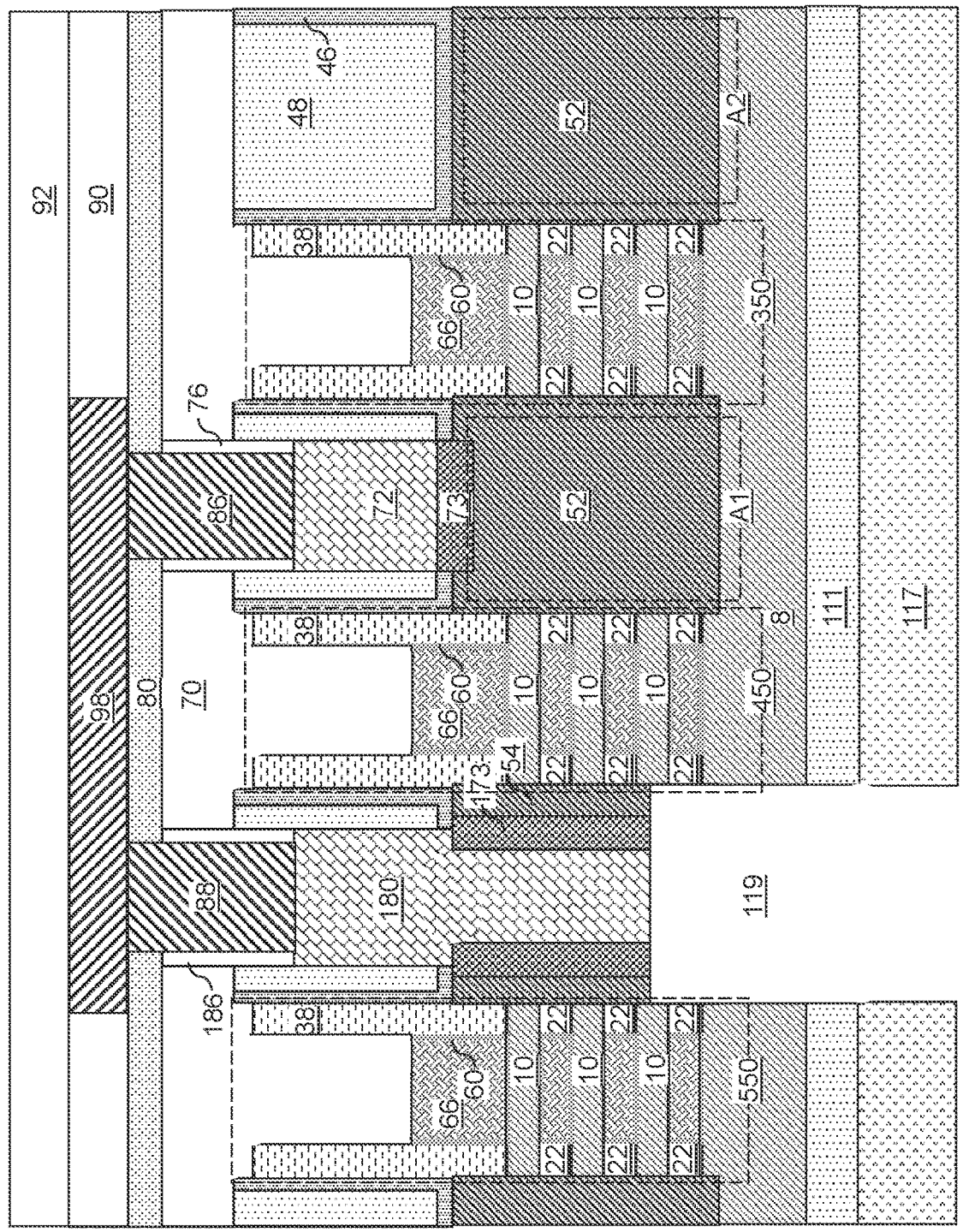
FIG. 23 is a vertical cross-sectional view of the exemplary structure after formation of backside via cavities according to an embodiment of the present disclosure.

FIG. 23 is a vertical cross-sectional view of the exemplary structure after formation of backside via cavities according to an embodiment of the present disclosure. Referring to FIG. 23, the exemplary structure may be placed in an etch chamber upside down, and an anisotropic etch process may be performed to transfer the pattern in the photoresist layer 117 thorough the backside hard mask layer 111 and the substrate single crystalline semiconductor layer 8. The anisotropic etch process may be continued until bottom surfaces of the connector via structures 180 are physically exposed. If the connector via structures 18 are not in contact with the substrate single crystalline semiconductor layer 8 at the processing steps of FIGS. 22A and 22B, horizontal portions of the epitaxial semiconductor material portions 54 and the connector metal silicide portions 173 may be removed during the anisotropic etch process. A backside via cavity 119 may be formed underneath each opening in the photoresist layer 117. A bottom surface of a connector via structure 180 may be physically exposed over each backside via cavity 119 (when the exemplary structure is viewed in the upright position). Each backside via cavity 119 may be laterally bounded by a sidewall of the backside hard mask layer 111, by a sidewall of the substrate single crystalline semiconductor layer 8, and optionally by a sidewall of the dummy gate structure 450 and/or by a sidewall of another dummy gate structure 550 and/or by a sidewall of at least one hybrid dielectric fin (14, 16). The photoresist layer 117 may be subsequently removed, for example, by ashing.

Figure 24:
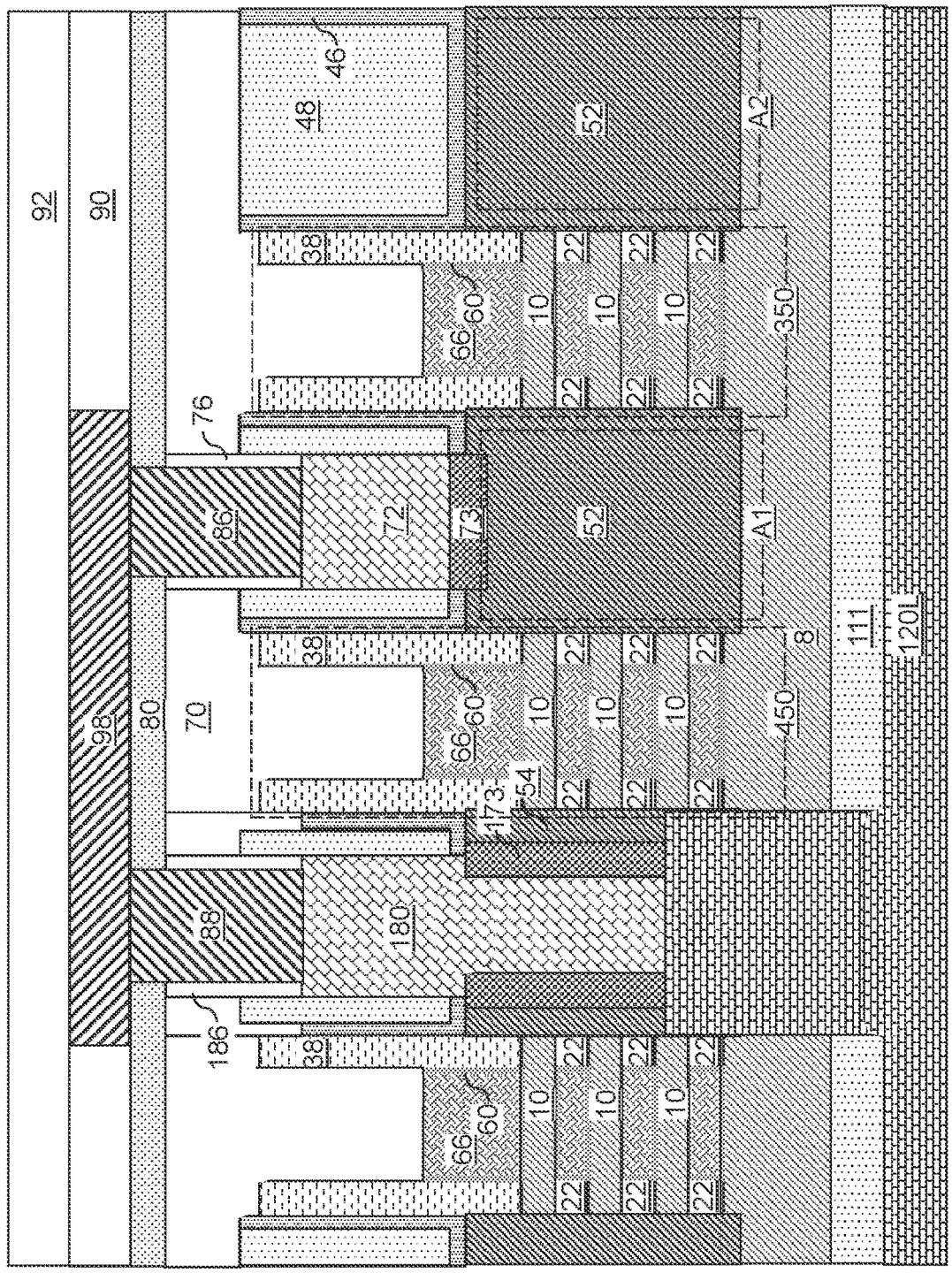
FIG. 24 is a vertical cross-sectional view of the exemplary structure after formation of a backside metallic material layer according to an embodiment of the present disclosure.

FIG. 24 is a vertical cross-sectional view of the exemplary structure after formation of a backside metallic material layer according to an embodiment of the present disclosure. Referring to FIG. 24, a backside metallic material layer 120L may be deposited in the backside via cavities 119 and over the backside hard mask layer 111. The backside metallic material layer 120L includes at least one metallic material such as, Ru, Co, Cu, Ti, Ta, Mo, Ni, TiN, TaN, WN, alloys thereof, and/or stacks thereof. Other suitable metallic materials are within the contemplated scope of disclosure.

Figure 25:
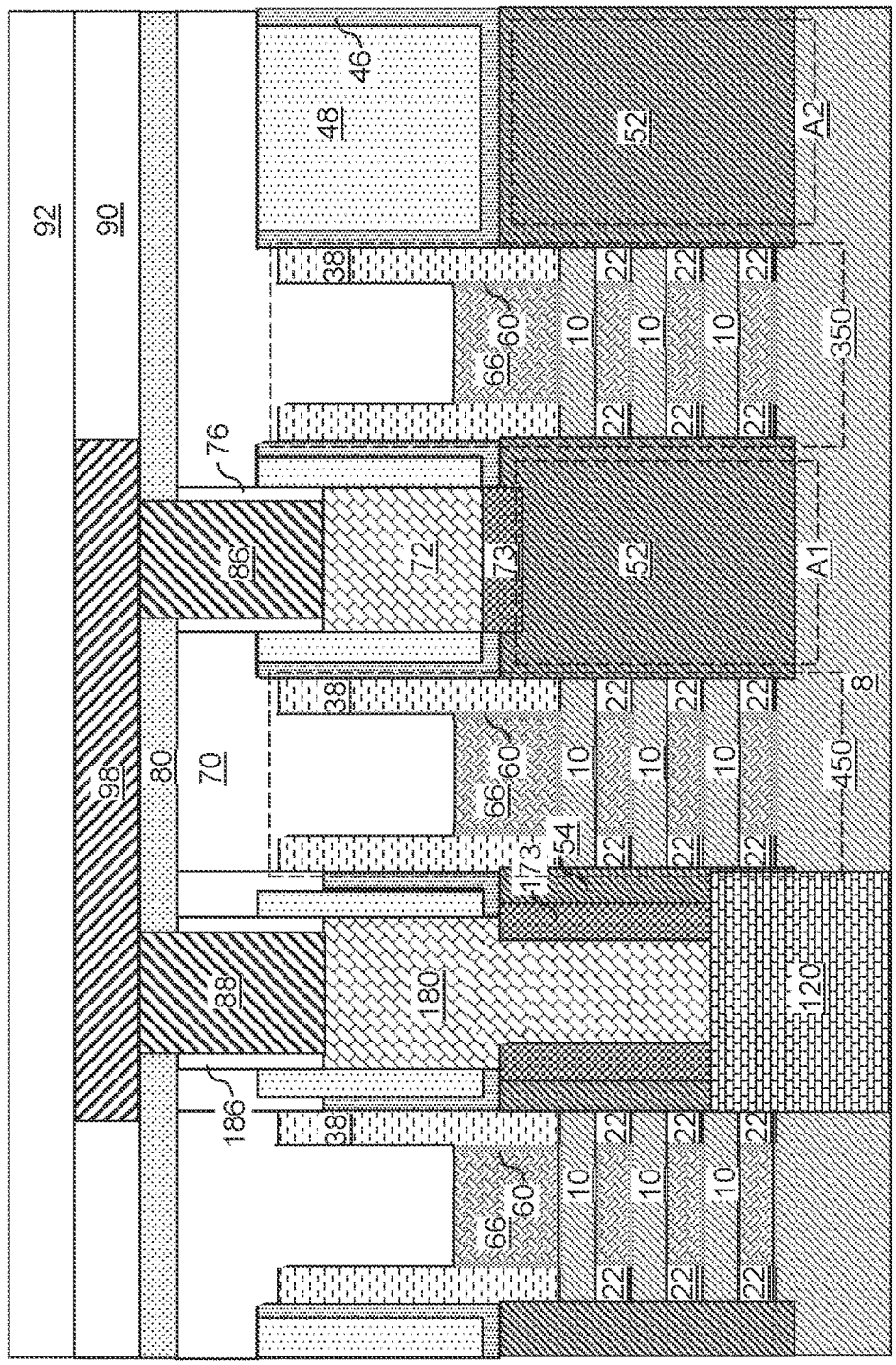
FIG. 25 is a vertical cross-sectional view of the exemplary structure after formation of backside via structures according to an embodiment of the present disclosure.

FIG. 25 is a vertical cross-sectional view of the exemplary structure after formation of backside via structures according to an embodiment of the present disclosure. Referring to FIG. 25, the backside metallic material layer 120L may be recessed to remove portions located outside the backside via cavities 119, for example, by a recess etch process. Each remaining portion of the backside metallic material layer 120L that remains in the backside via cavities 119 constitute a backside via structure 120. The backside hard mask layer 111 may be subsequently removed, for example, by performing an isotropic etch process. Physically exposed horizontal surfaces of the backside via structures 120 may be at, above, or below, the horizontal plane including the bottom surface of the thinned substrate single crystalline semiconductor layer 8. Generally, each backside via structure 120 may be formed through a remaining portion of the substrate single crystalline semiconductor layer 8 after thinning the substrate single crystalline semiconductor layer 8. The backside via structures 120 may be formed through a substrate (such as the substrate single crystalline semiconductor layer 8) directly on a bottom surface of a respective connector via structure 180.

Figure 26:
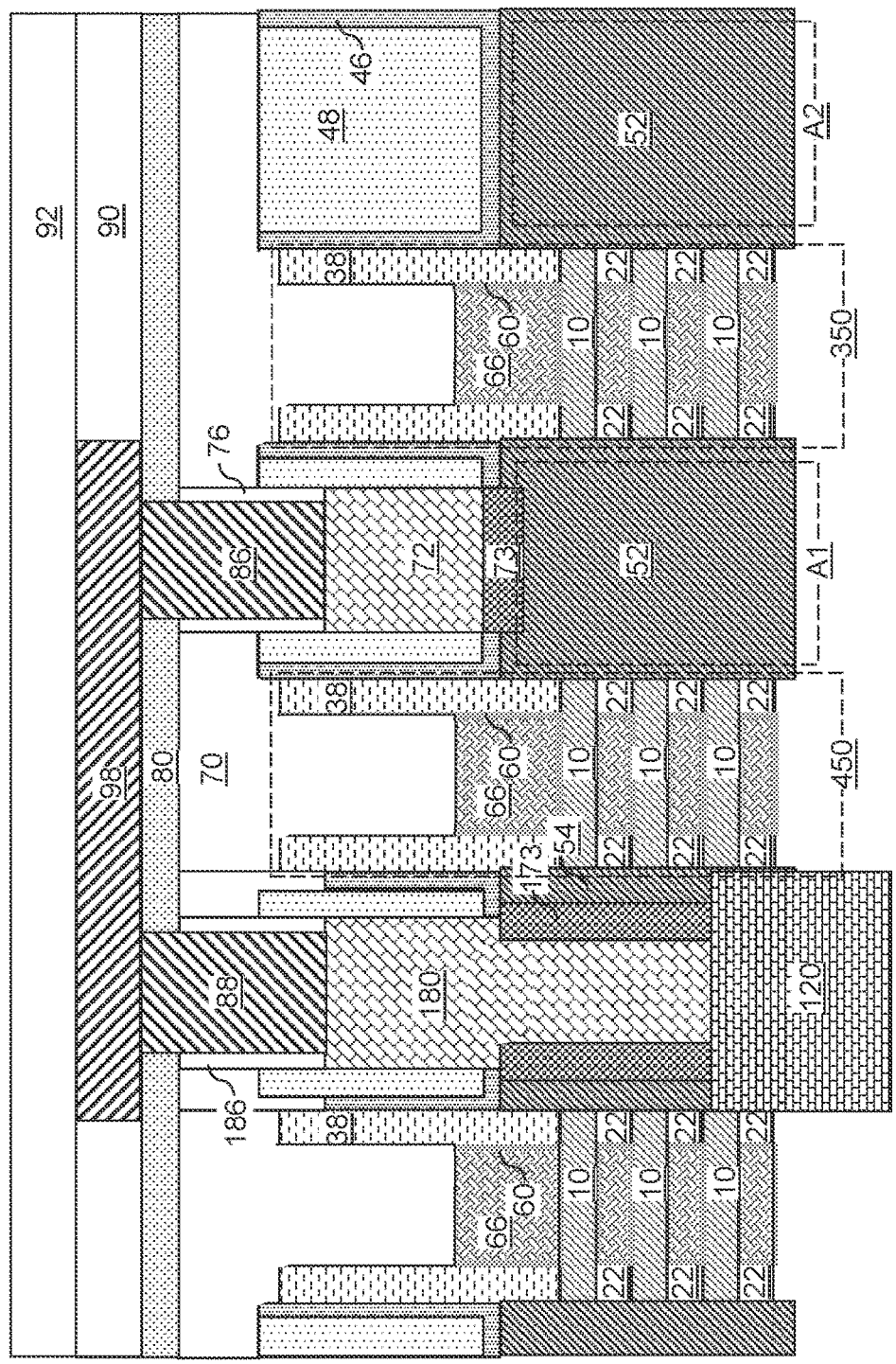
FIG. 26 is a vertical cross-sectional view of the exemplary structure after removal of the semiconductor substrate layer according to an embodiment of the present disclosure.

FIG. 26 is a vertical cross-sectional view of the exemplary structure after removal of the semiconductor substrate layer according to an embodiment of the present disclosure. Referring to FIG. 26, the substrate single crystalline semiconductor layer 8 may be removed by performing an isotropic etch process that etches the semiconductor material of the substrate single crystalline semiconductor layer 8 selective to the materials of the backside via structures 120, the gate dielectric layers 60, and the dielectric channel spacers 22. In one embodiment, the isotropic etch process may be selective to the materials of the source/drain regions 52 and the epitaxial semiconductor material portions 54. For example, a first wet etch process using a KOH solution may be used to provide a fast etch process that removes at least 50% of the thickness of the thinned substrate single crystalline semiconductor layer 8, and a second wet etch process using hot trimethyl-2 hydroxyethyl ammonium hydroxide ("hot TMY") or tetramethyl ammonium hydroxide (TMAH) may be used to remove remaining portions of the thinned substrate single crystalline semiconductor layer 8 selective to the materials of the backside via structures 120, the gate dielectric layers 60, the dielectric channel spacers 22, the source/drain regions 52, and the epitaxial semiconductor material portions 54.

Figure 27:
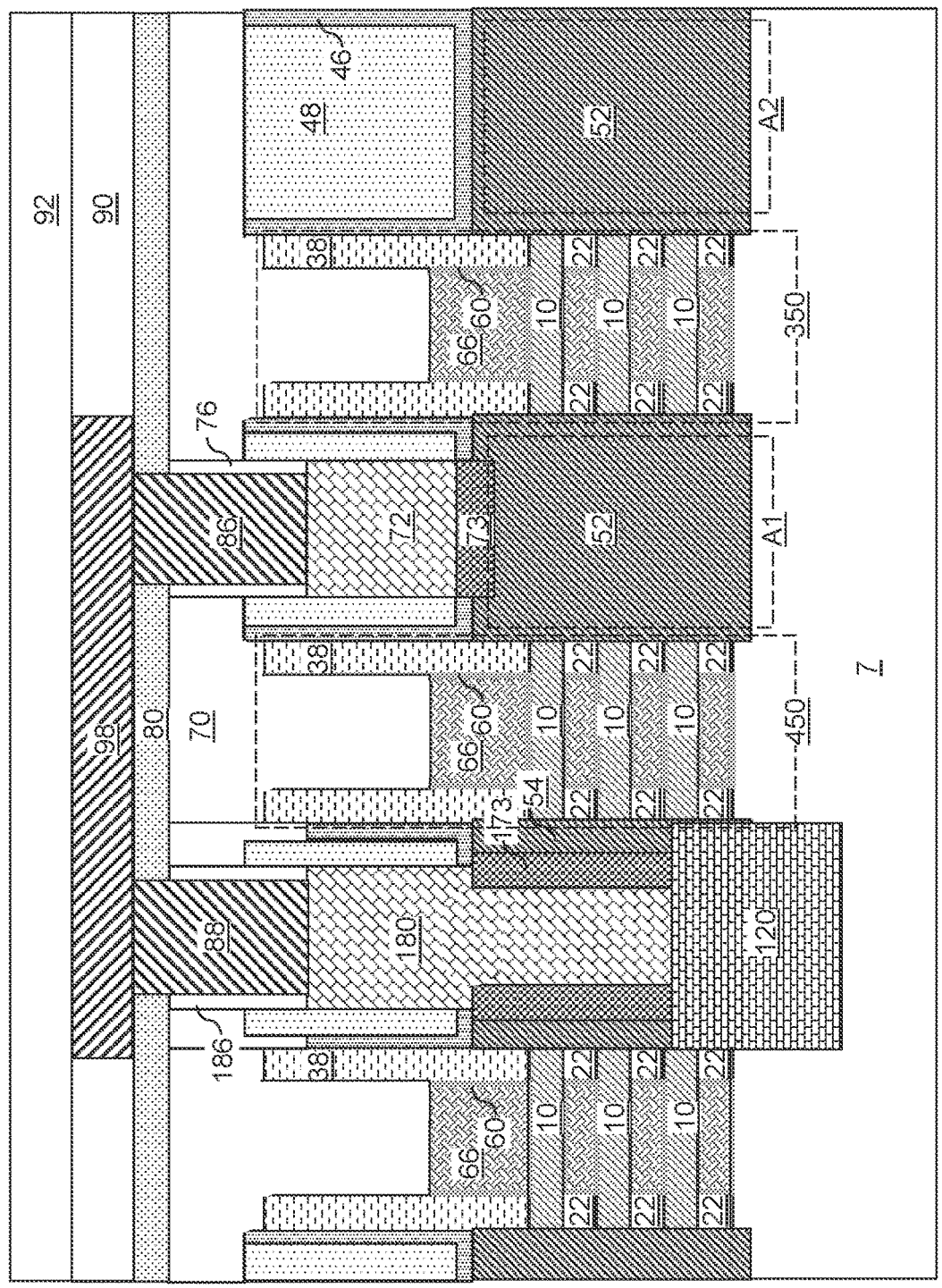
FIG. 27 is a vertical cross-sectional view of the exemplary structure after deposition of a backside insulating matrix layer according to an embodiment of the present disclosure.

FIG. 27 is a vertical cross-sectional view of the exemplary structure after deposition of a backside insulating matrix layer according to an embodiment of the present disclosure. Referring to FIG. 27, a backside insulating matrix layer 7 may be deposited on the physically exposed surfaces of the backside via structures 120, the gate dielectric layers 60, the dielectric channel spacers 22, the source/drain regions 52, and the epitaxial semiconductor material portions 54. The backside insulating matrix layer 7 includes a dielectric material such as undoped silicate glass or a doped silicate glass. The backside insulating matrix layer 7 may be deposited by chemical vapor deposition or by spin-coating. The backside insulating matrix layer 7 covers the backside via structures 120. Thus, the remaining portion of the substrate single crystalline semiconductor layer 8 may be replaced with the backside insulating matrix layer 7.

Figure 28:
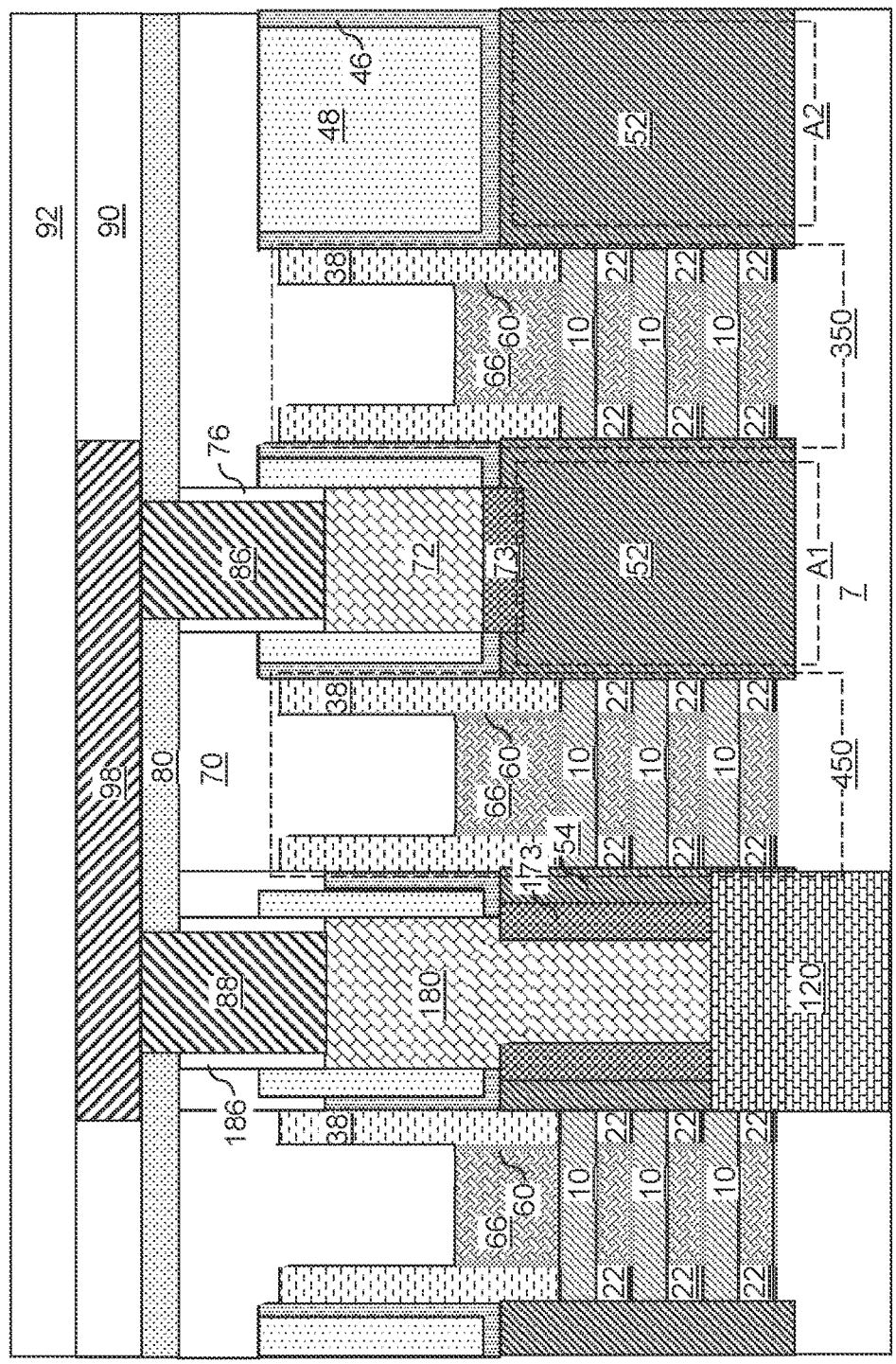
FIG. 28 is a vertical cross-sectional view of the exemplary structure after planarization of the backside insulating matrix layer according to an embodiment of the present disclosure.

FIG. 28 is a vertical cross-sectional view of the exemplary structure after planarization of the backside insulating matrix layer according to an embodiment of the present disclosure. Referring to FIG. 28, the backside insulating matrix layer 7 may be planarized, for example, by chemical mechanical planarization. The bottom surfaces of the backside via structures 120 may be used as stopping structures for the chemical mechanical planarization process. In this embodiment, bottom surfaces of the backside via structures 120 may be coplanar with the bottom surface of the backside insulating matrix layer 7.

Figure 29A:
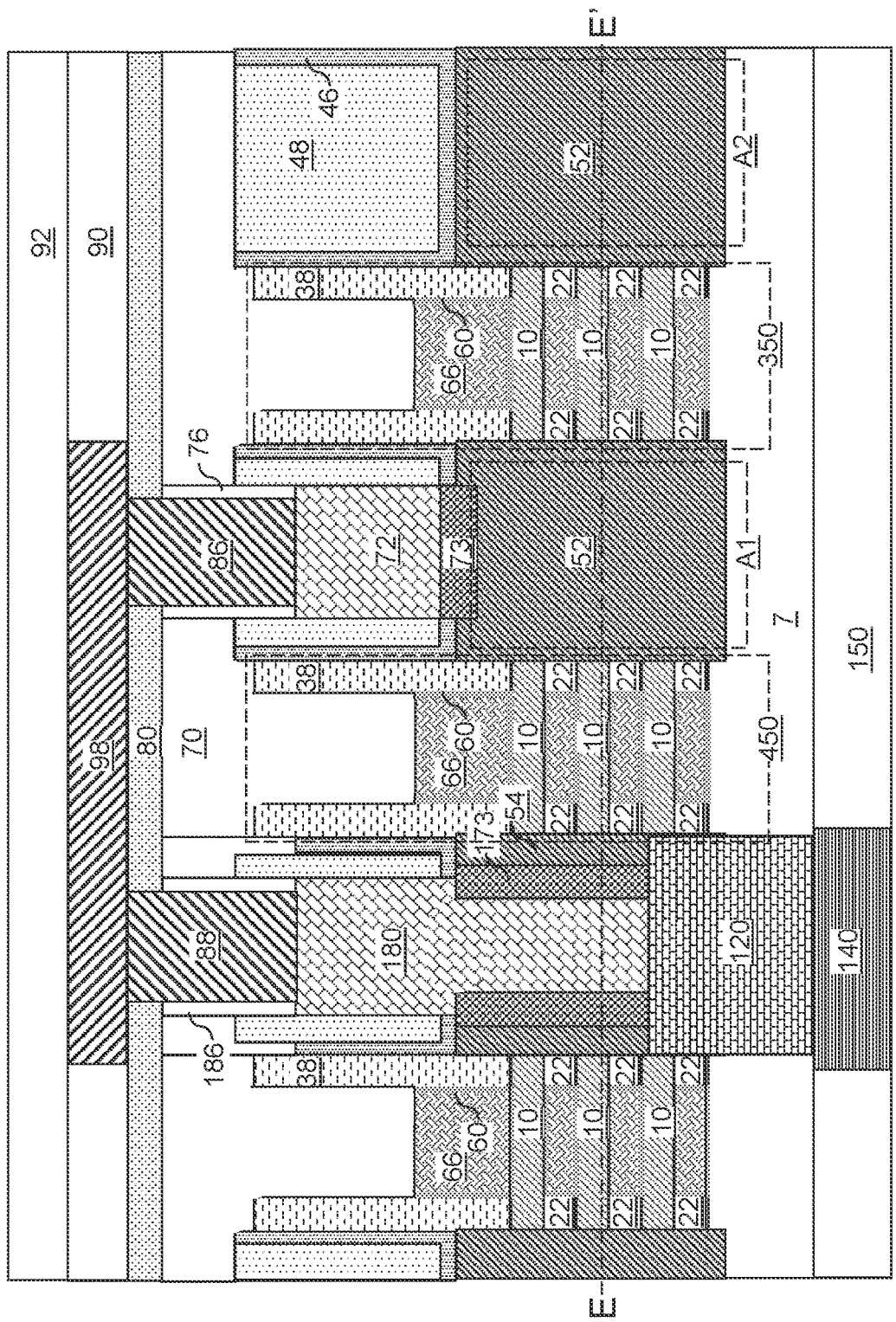
FIG. 29A is a vertical cross-sectional view of the exemplary structure after formation of backside metal pads and a pad-level dielectric layer according to an embodiment of the present disclosure.
Figure 29B:
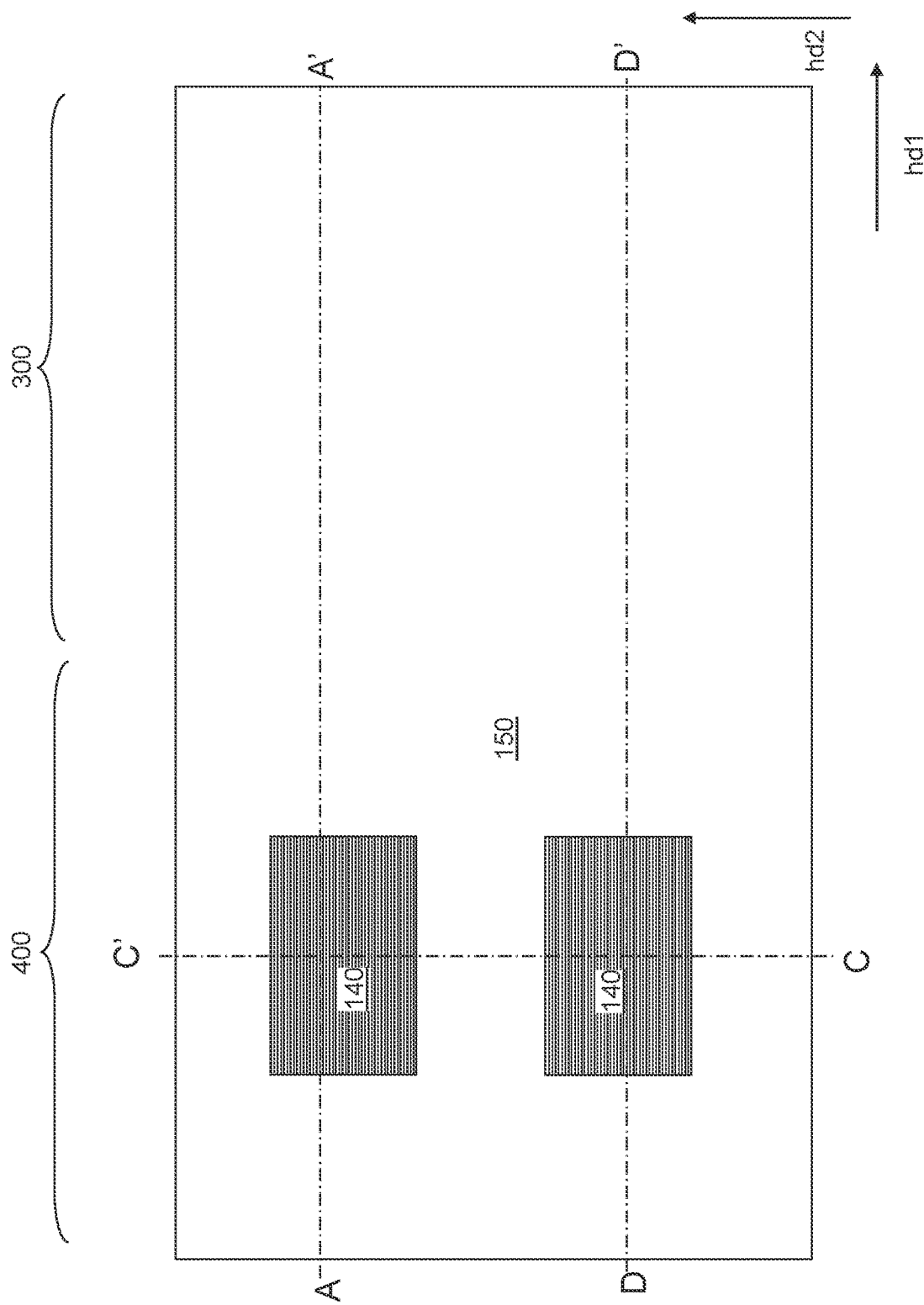
FIG. 29B is a bottom-up view of the exemplary structure of FIG. 29A.
Figure 29C:
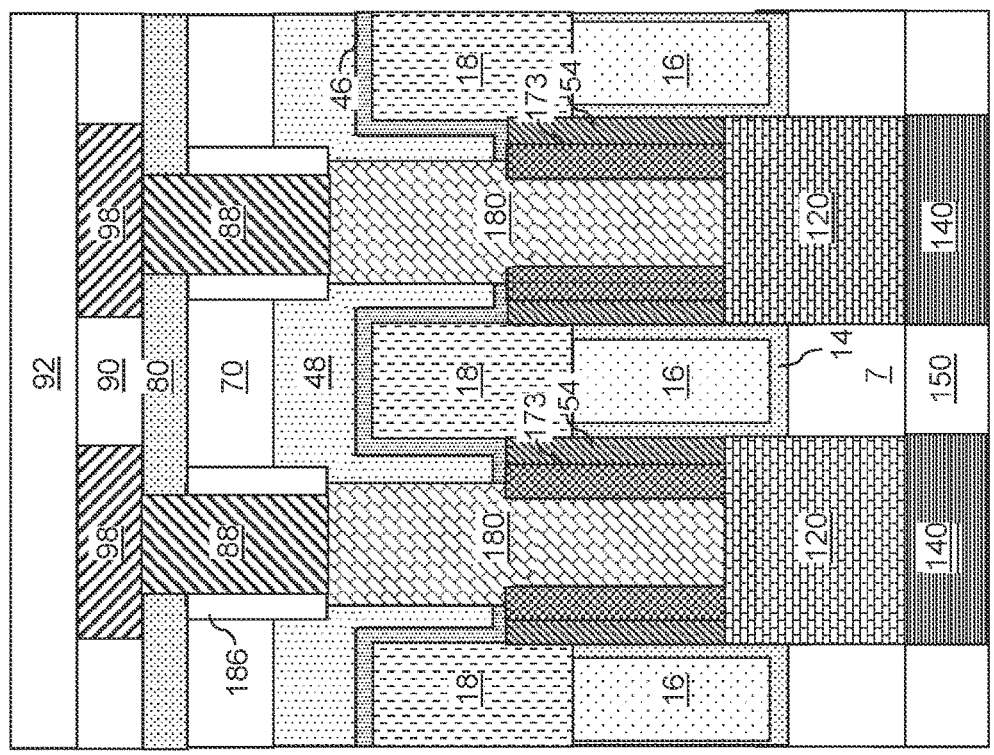
FIG. 29C is a vertical cross-section view of the exemplary structure along the vertical plane C-C' of FIG. 29B.
Figure 29D:
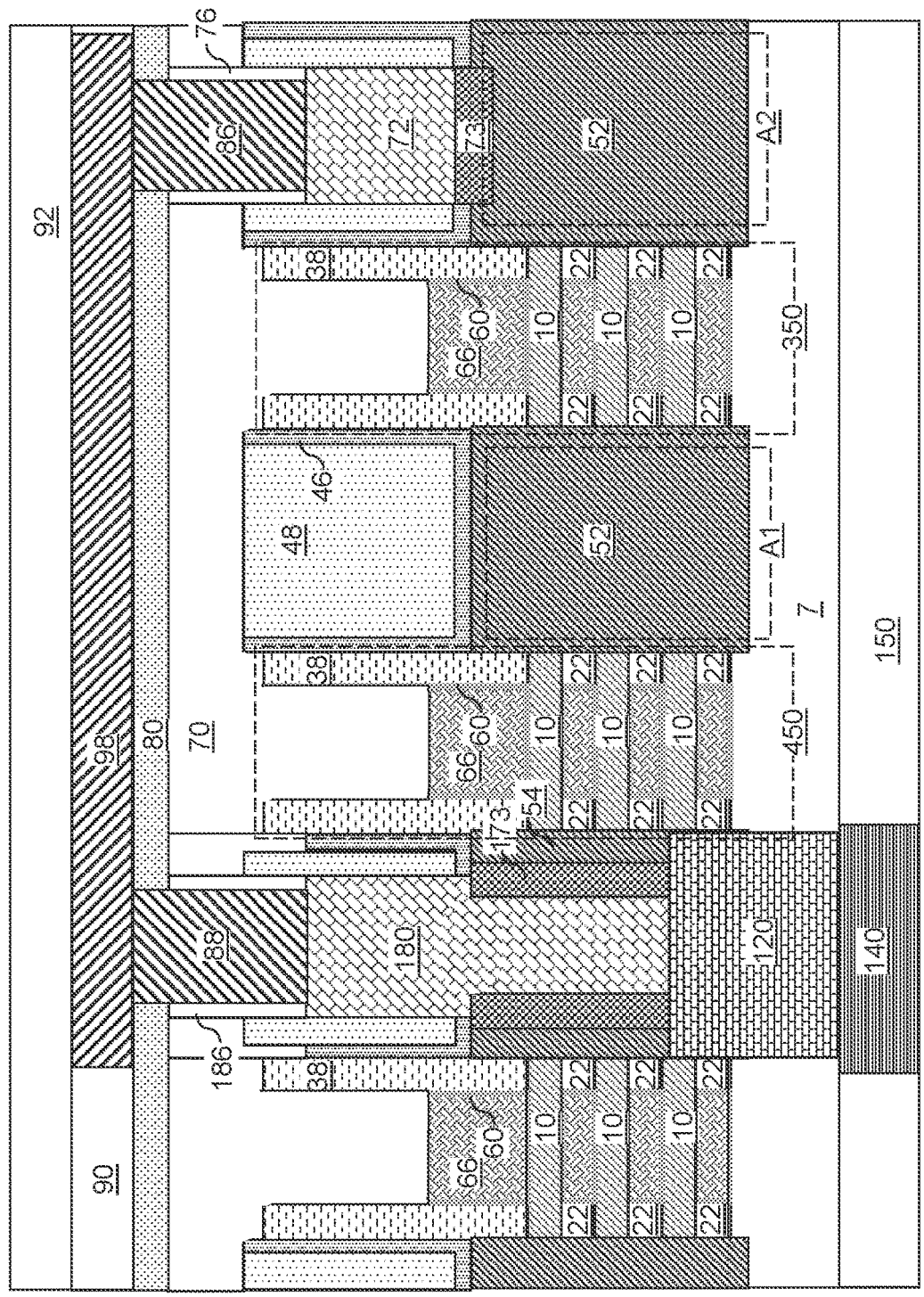
FIG. 29D is a vertical cross-section view of the exemplary structure along the vertical plane D-D' of FIG. 29B.
Figure 29E:
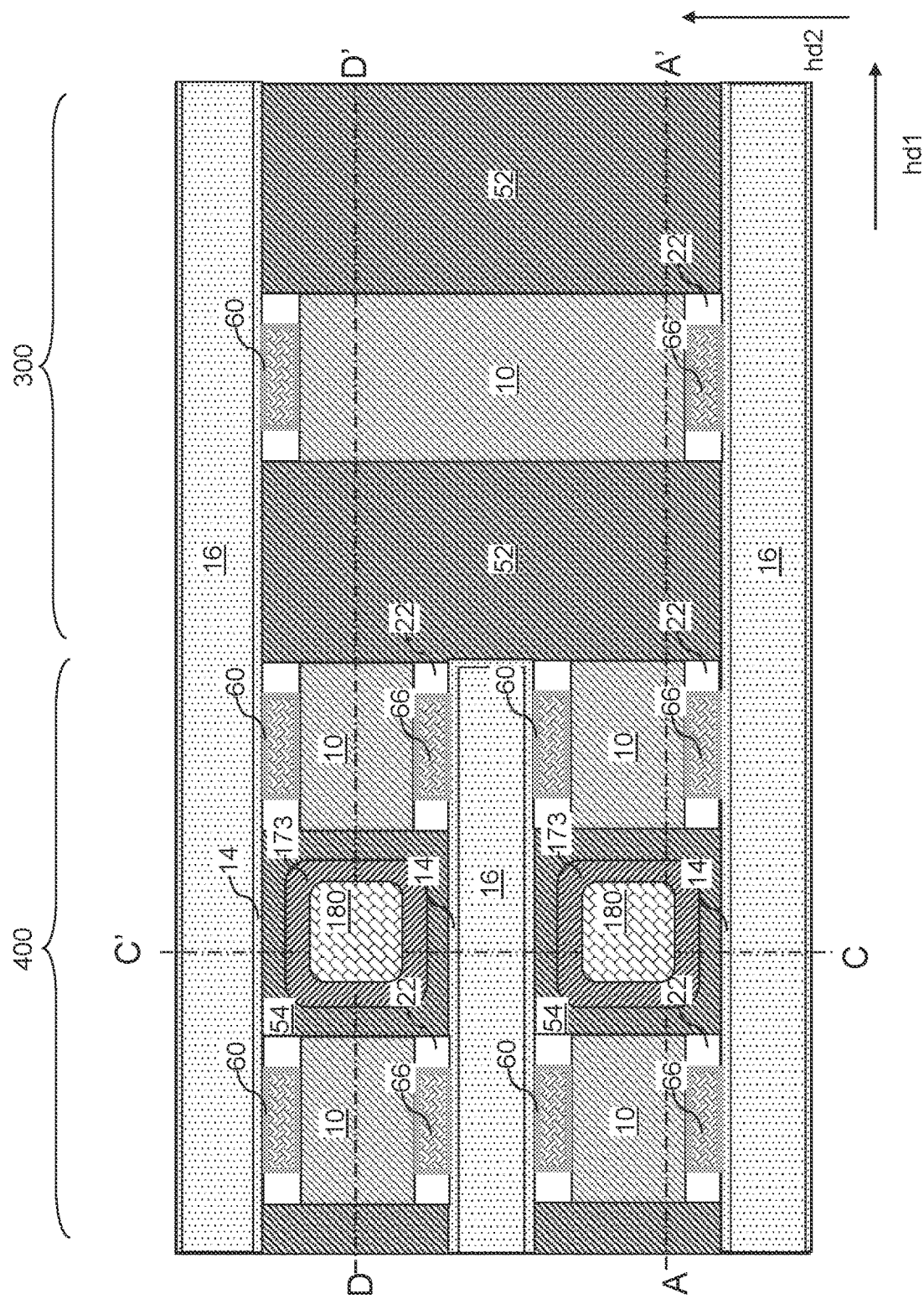
FIG. 29E is a horizontal cross-sectional view of the exemplary structure along the horizontal plane E-E' of FIG. 29A.

FIG. 29A is a vertical cross-sectional view of the exemplary structure after formation of backside metal pads and a pad-level dielectric layer according to an embodiment of the present disclosure. FIG. 29B is a bottom-up view of the exemplary structure of FIG. 29A. FIG. 29C is a vertical cross-section view of the exemplary structure along the vertical plane C-C' of FIG. 29B. FIG. 29D is a vertical cross-section view of the exemplary structure along the vertical plane D-D' of FIG. 29B. FIG. 29E is a horizontal cross-sectional view of the exemplary structure along the horizontal plane E-E' of FIG. 29A. Referring to FIGS. 29A-29E, a pad-level dielectric layer 150 may be deposited on the backside insulating matrix layer 7. The pad-level dielectric layer 150 includes a dielectric material such as silicon oxide, silicon nitride, or a stack thereof. The thickness of the pad-level dielectric layer 150 may be in a range from 200 nm to 1,000 nm, such as from 300 m to 600 nm, although lesser and greater thicknesses may also be used.

Pad cavities may be patterned through the pad-level dielectric layer 150 in areas having an areal overlap with a respective one of the backside via structures 120. At least one metallic material may be deposited in the pad cavities and may be subsequently planarized to form backside metal pads 140. Each backside metal pad 140 may be formed on a respective one of the backside via structures 120.

Generally, at least one backside metal interconnect structure (such as a backside metal pad 140) may be formed on each backside via structure 120 after replacement of the remaining portion of the substrate single crystalline semiconductor layer 8 with the backside insulating matrix layer 7. While the present disclosure is described using an embodiment in which a backside metal pad 140 is formed as a backside metal interconnect structure directly on a surface of the backside via structures 120, embodiments are expressly contemplated herein in which any metal line structure, any metal via structure, or any integrated line and via structure is formed directly on a surface of each, or any of, the backside via structures 120. The backside metal interconnect structures may be located on a bottom surface of the backside insulating matrix layer 7.

Figure 30A:
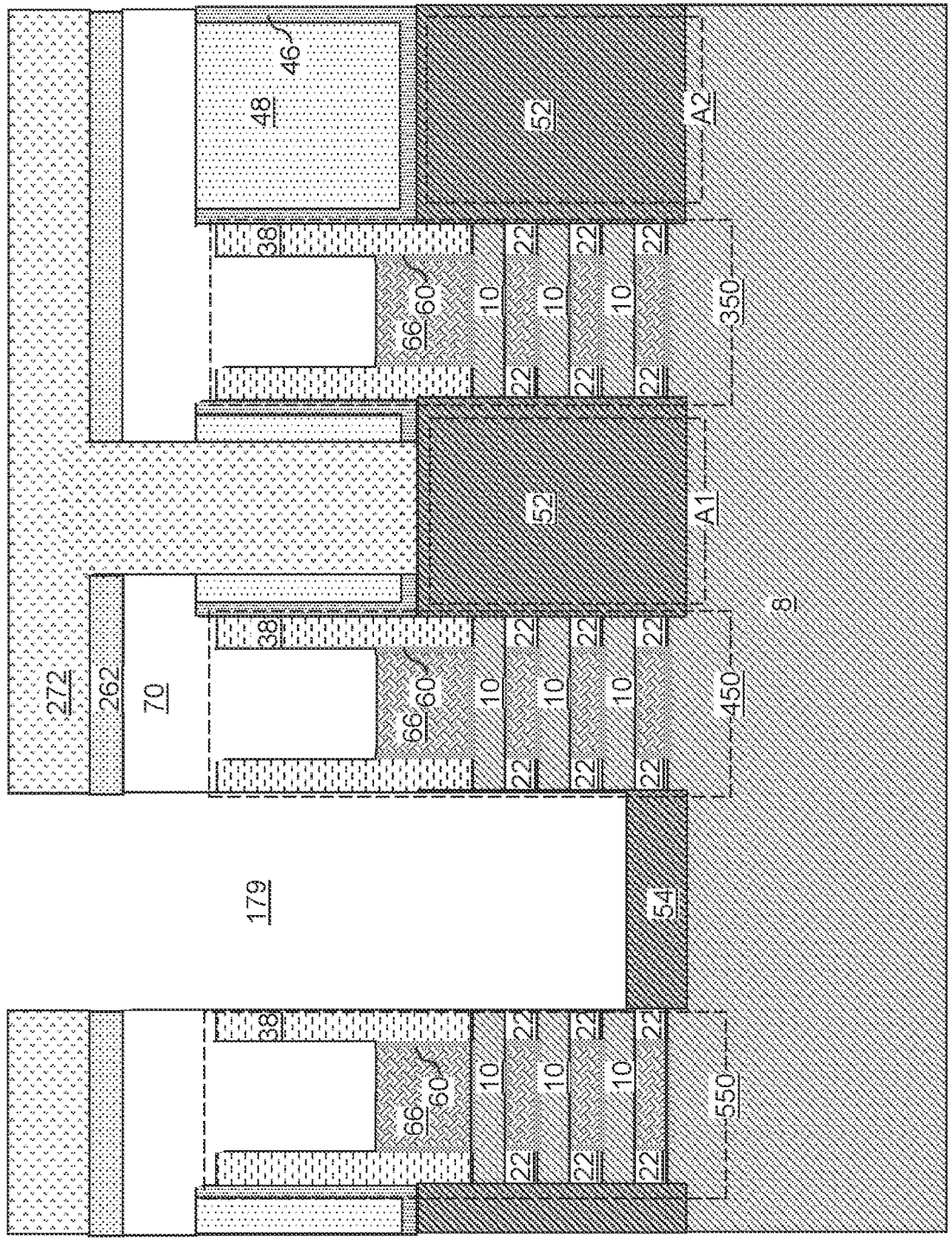
FIG. 30A is a vertical cross-sectional view of an alternative embodiment of the exemplary structure after formation of connector via cavities according to an embodiment of the present disclosure.
Figure 30B:
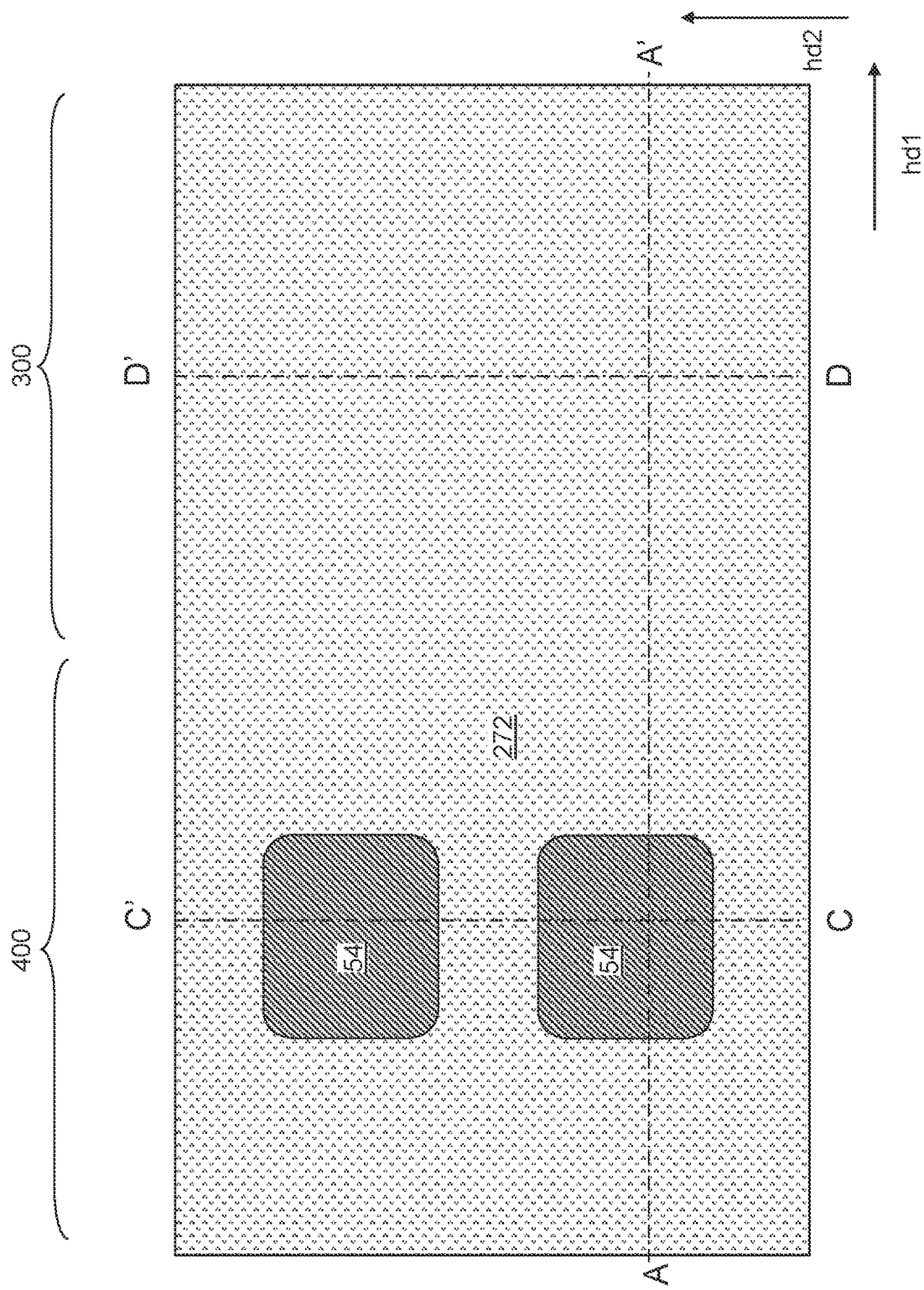
FIG. 30B is a top-down view of the alternative embodiment of the exemplary structure of FIG. 30A. The vertical plane A-A' is the plane of the vertical cross-sectional view of FIG. 30A.

FIG. 30A is a vertical cross-sectional view of an alternative embodiment of the exemplary structure after formation of connector via cavities according to an embodiment of the present disclosure. FIG. 30B is a top-down view of the alternative embodiment of the exemplary structure of FIG. 30A. The vertical plane A-A' is the plane of the vertical cross-sectional view of FIG. 30A. Referring to FIGS. 30A and 30B, an alternative configuration of the exemplary structure according to an embodiment of the present disclosure is illustrated after formation of connector via cavities 179, i.e., at the processing step corresponding to the processing steps of FIGS. 14A and 14B. The alternative configuration may be obtained by increasing the area of the openings through the second photoresist layer 272. Thus, the volume of each connector via cavity 179 may be expanded. In one embodiment, sidewalls of components of the dummy gate structure 450 may be physically exposed to each connector via cavity 179. For example, a sidewall of a gate dielectric layer 60 of the dummy gate structure 450, a sidewall of a dielectric gate spacer 38 of the dummy gate structure 450, and/or a sidewall of a dielectric channel spacer 22 of the dummy gate structure 450 may be physically exposed to a connector via cavity 179. In addition, a sidewall of a gate dielectric layer 60 of the dummy gate structure 450, a sidewall of a dielectric gate spacer 38 of the dummy gate structure 450, and/or a sidewall of a dielectric channel spacer 22 of another dummy gate structure 550 may be physically exposed to the connector via cavity 179. Further, sidewalls of hybrid dielectric fins (14, 16) and sidewalls of etch stop dielectric fins 18 may be physically exposed to a connector via cavity 179. An epitaxial semiconductor material portion 54 may, or may not, be completely removed during formation of a connector via cavity 179. In embodiments in which an epitaxial semiconductor material portion 54 is not completely removed, a remaining portion of the epitaxial semiconductor material portion 54 may be present between a connector via cavity 179 and the substrate single crystalline semiconductor layer 8. In embodiments in which an epitaxial semiconductor material portion 54 is completely removed, a top surface of the substrate single crystalline semiconductor layer 8 may be physically exposed at the bottom of a connector via cavity 179.

Figure 31:
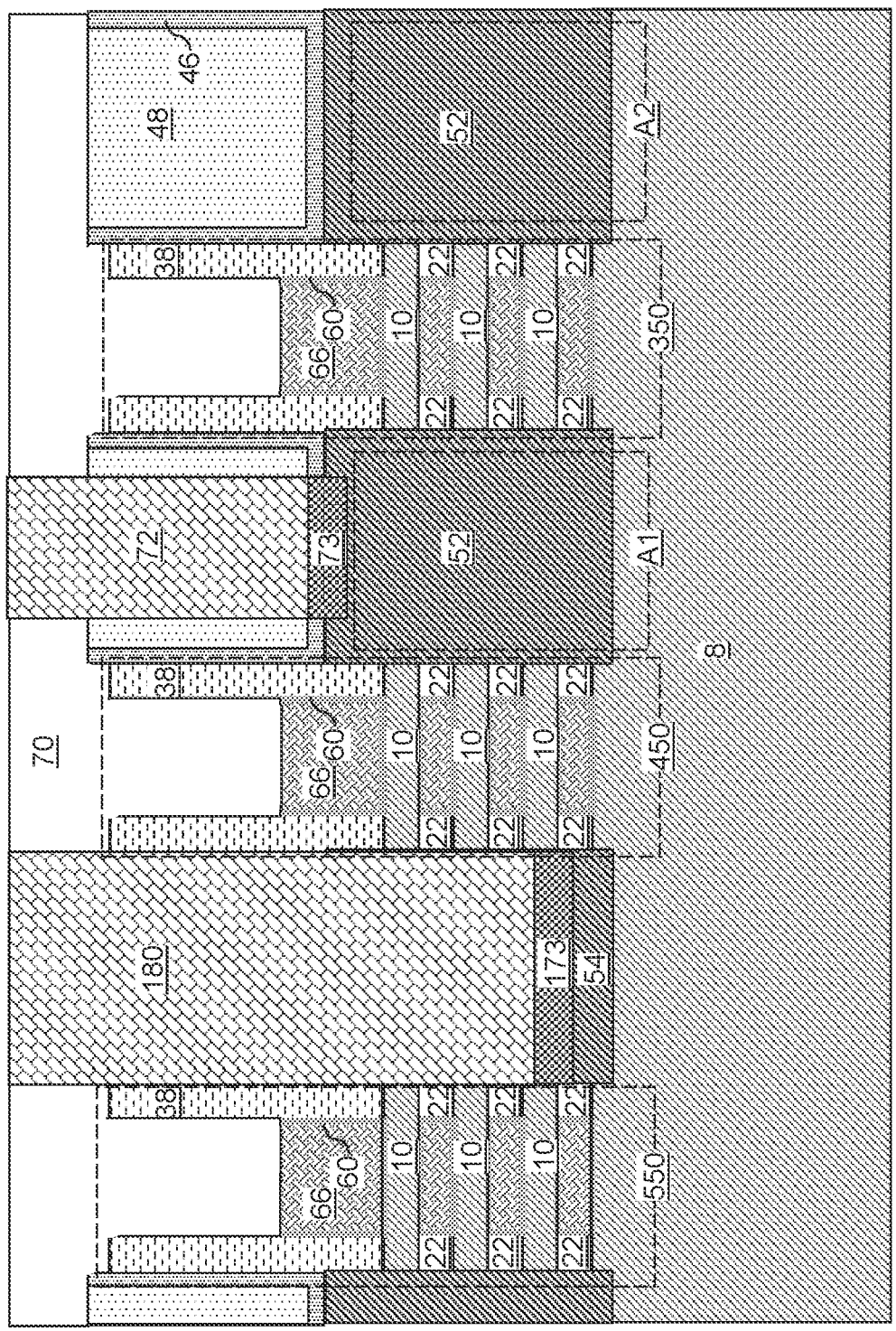
FIG. 31 is a vertical cross-sectional view of the alternative embodiment of the exemplary structure after formation of connector via structures and metallic cap structures according to an embodiment of the present disclosure.
Figure 32A:
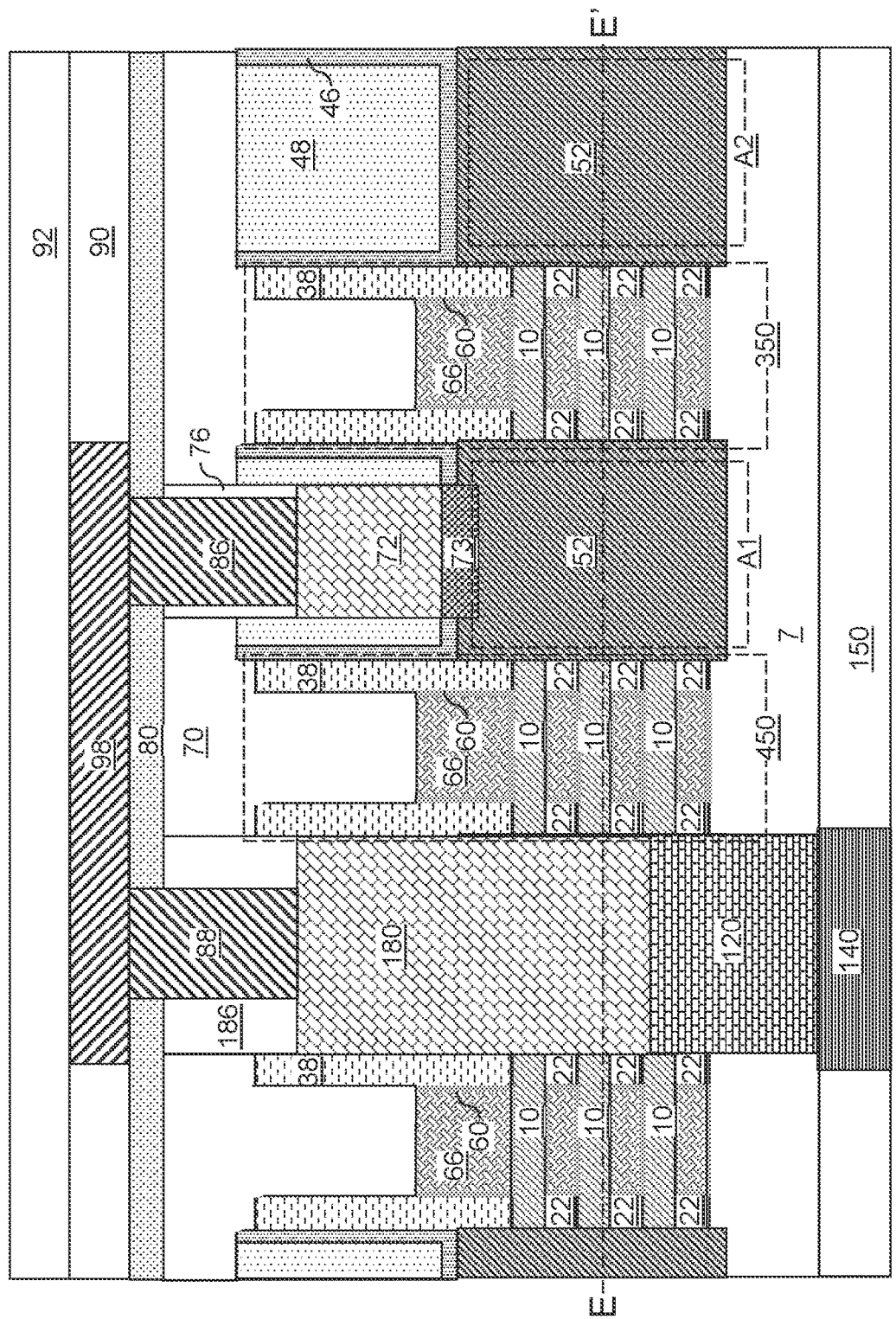
FIG. 32A is a vertical cross-sectional view of the alternative embodiment of the exemplary structure after formation of a backside insulating matrix layer, backside metal pads, and a pad-level dielectric layer according to an embodiment of the present disclosure.
Figure 32B:
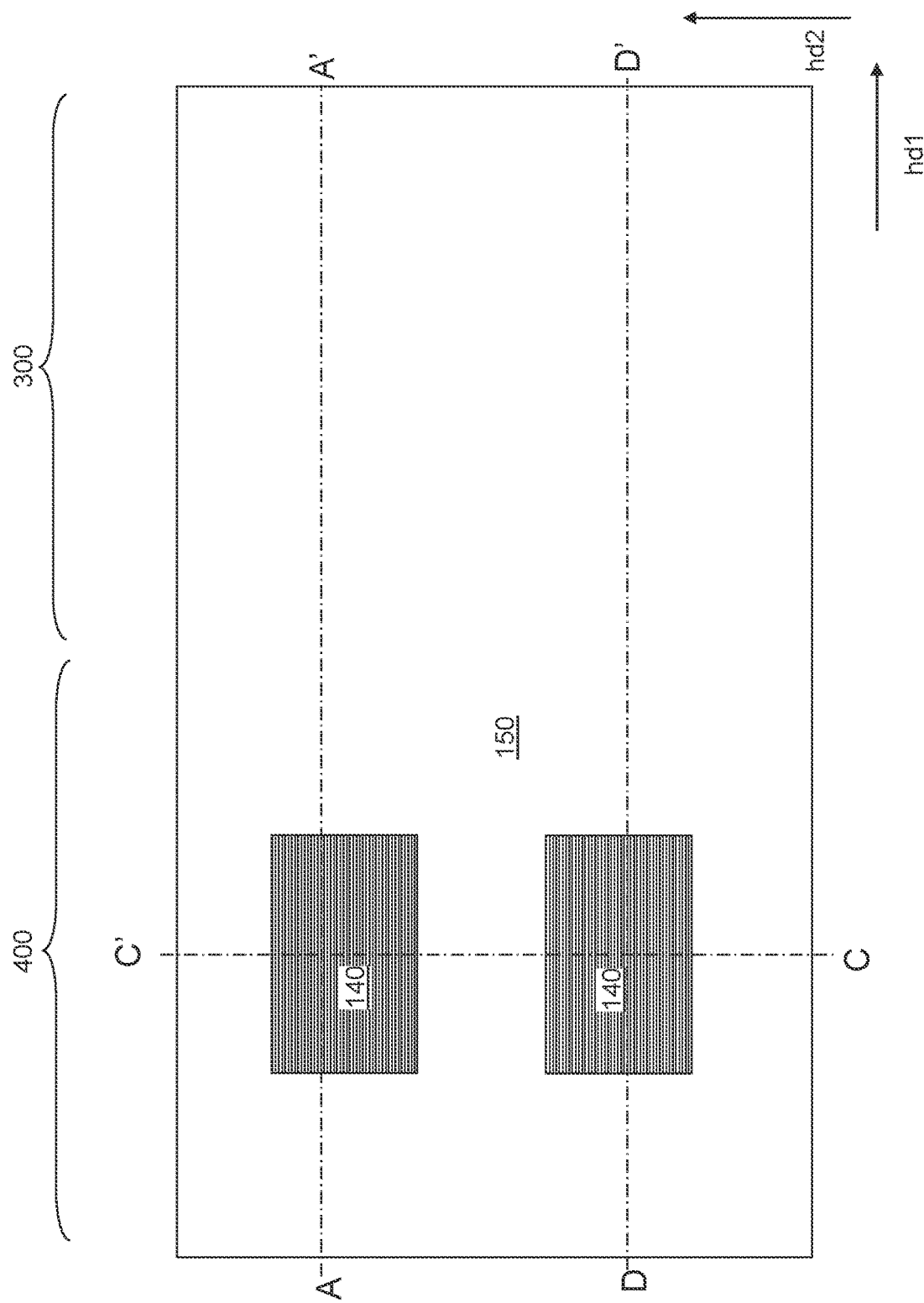
FIG. 32B is a bottom-up view of the alternative embodiment of the exemplary structure of FIG. 32A.
Figure 32C:
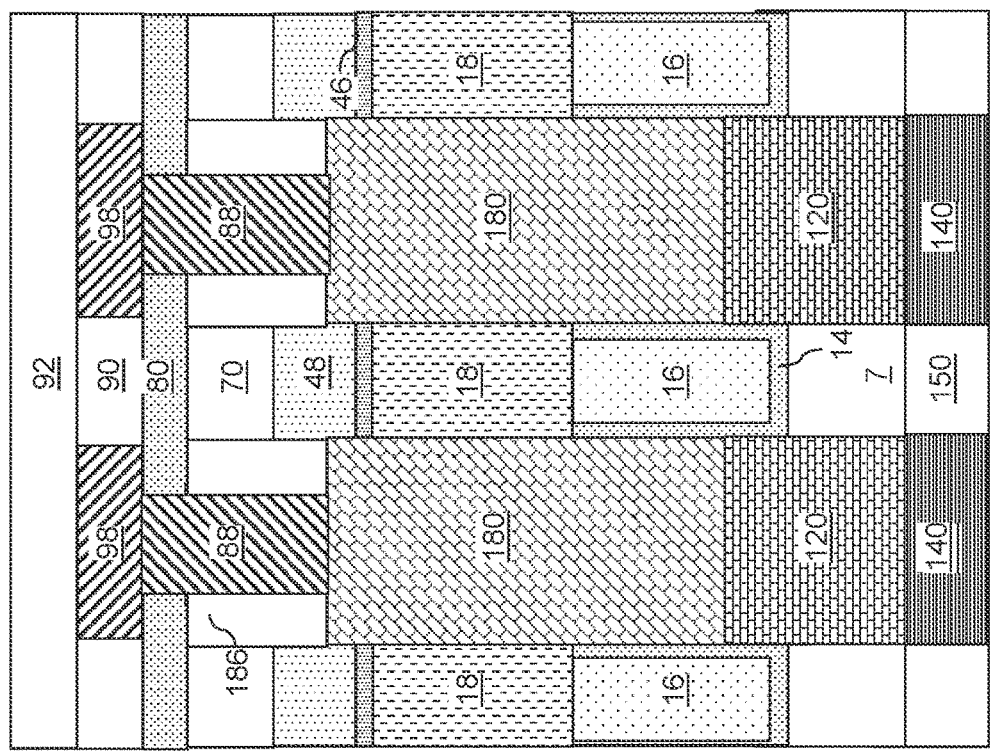
FIG. 32C is a vertical cross-section view of the alternative embodiment of the exemplary structure along the vertical plane C-C' of FIG. 32B.
Figure 32D:
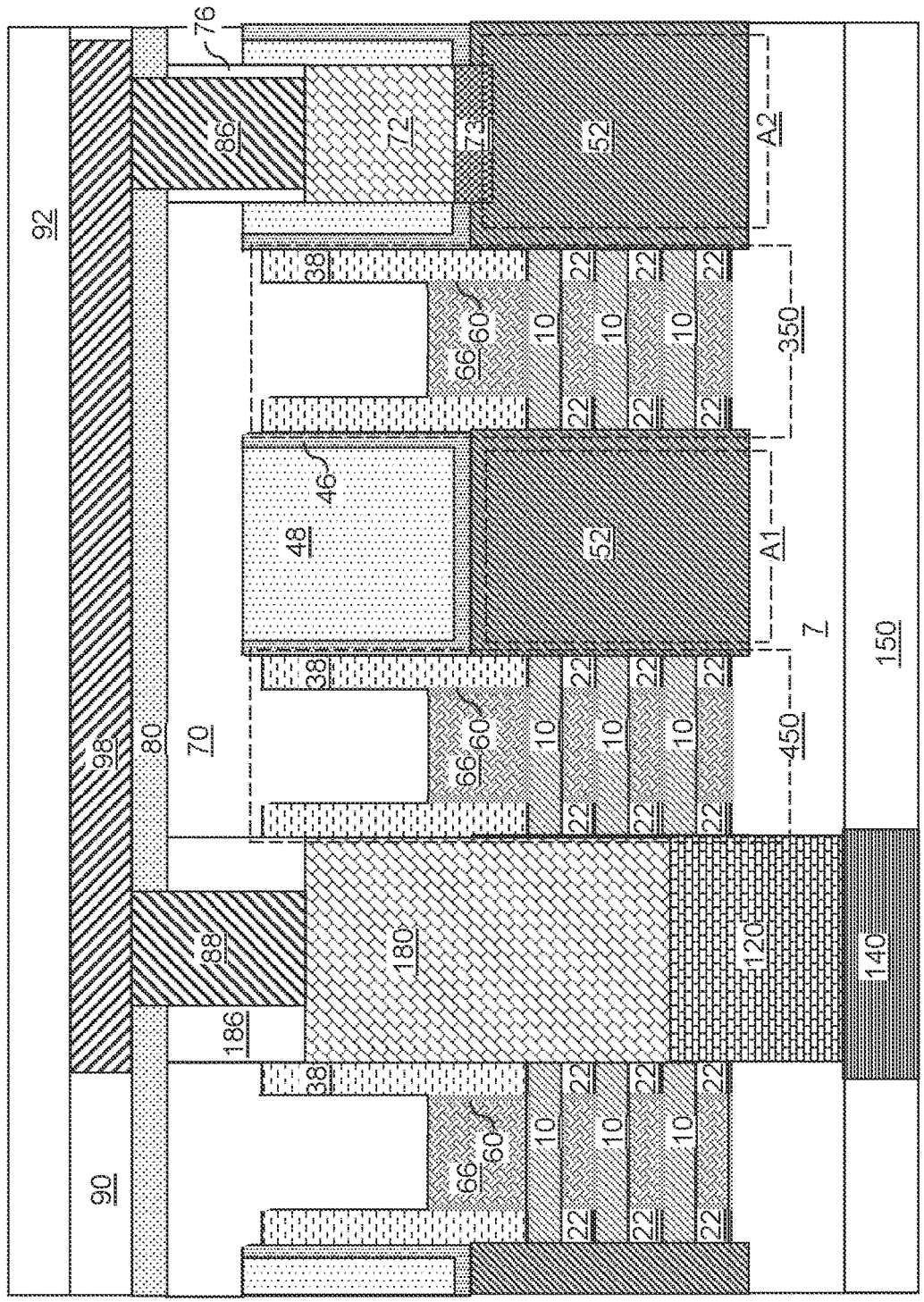
FIG. 32D is a vertical cross-section view of the alternative embodiment of the exemplary structure along the vertical plane D-D' of FIG. 32B.
Figure 32E:
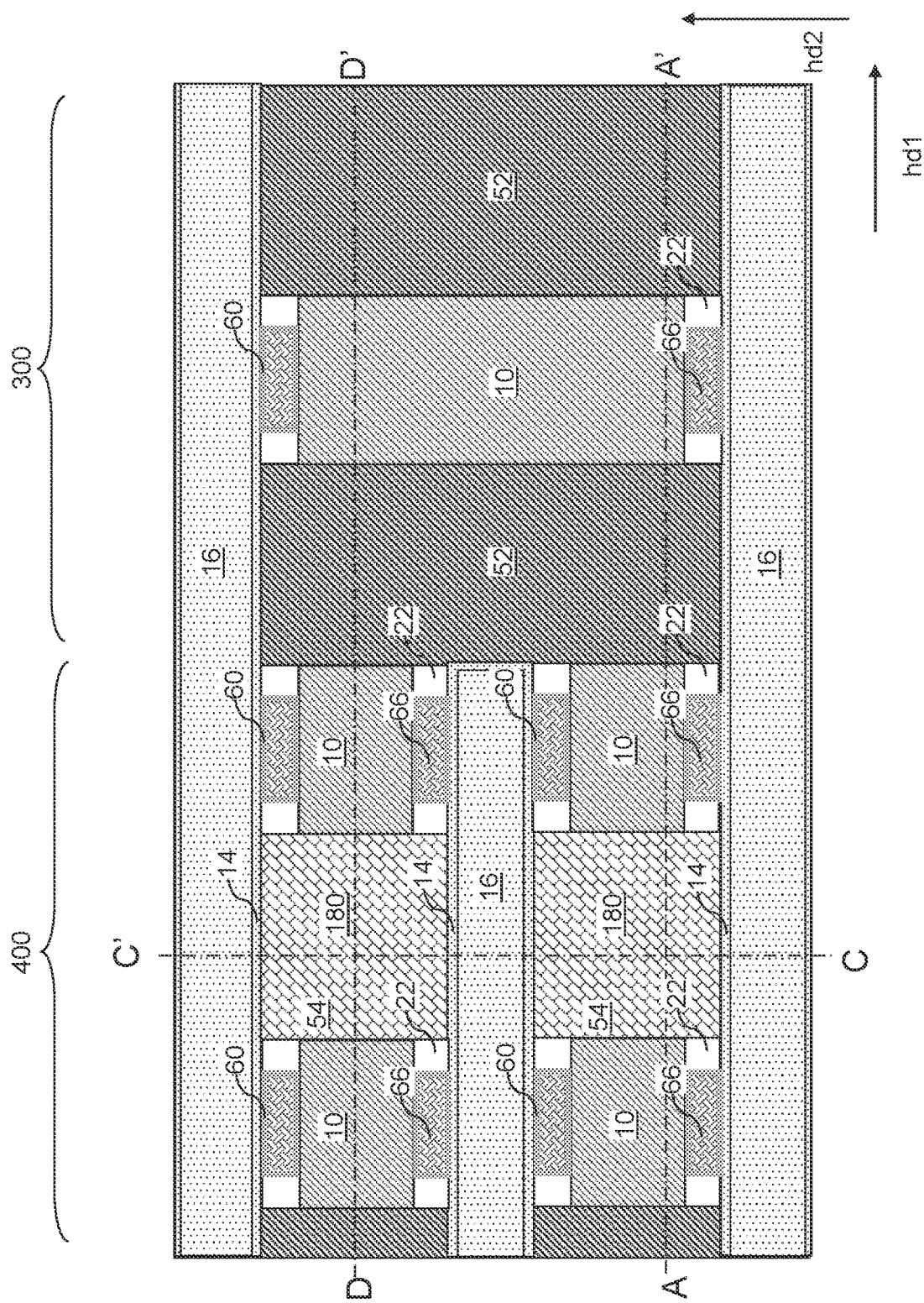
FIG. 32E is a horizontal cross-sectional view of the exemplary structure along the horizontal plane E-E' of FIG. 32A.

Referring to FIG. 31, the processing steps of FIG. 15 may be performed to form connector via structures 180 and metallic cap structures 72. Each connector via structure 180 may contact a sidewall of a gate dielectric layer 60 of the dummy gate structure 450, a sidewall of a dielectric gate spacer 38 of the dummy gate structure 450, a sidewall of a dielectric channel spacer 22 of the dummy gate structure 450, sidewalls of hybrid dielectric fins (14, 16), and/or sidewalls of etch stop dielectric fins 18. Further, each connector via structure 180 may contact a sidewall of a gate dielectric layer 60 of an additional dummy gate structure 550, a sidewall of a dielectric gate spacer 38 of the additional dummy gate structure 550, a sidewall of a dielectric channel spacer 22 of the additional dummy gate structure 550

Referring to FIGS. 32A-32E, the processing steps of FIGS. 16-29E may be performed to form a via-level dielectric layer 80, front-side contact via structures (86, 88), a line-level dielectric layer 90, metal lines 98, additional front-side dielectric layers 92 and front-side metal interconnect structures (not shown), backside via structures 120, a backside insulating matrix layer 7, a pad-level dielectric layer 150, and backside metal pads 140. While the present disclosure is described using an embodiment in which a backside metal pad 140 is formed as a backside metal interconnect structure directly on a surface of the backside via structures 120, embodiments are expressly contemplated herein in which any metal line structure, any metal via structure, or any integrated line and via structure is formed directly on a surface of each, or any of, the backside via structures 120.

Referring to FIGS. 1A-29E and according to various embodiments of the present disclosure, a semiconductor structure is provided, which comprises: a semiconductor nanostructure (such as a gate-all-around (GAA) transistor) located on a front surface of a backside insulating matrix layer 7 and including at least one semiconductor channel plate 10, a gate structure (60, 66, 38, 22), and a first active region A1 and a second region A2 located at end portions of the at least one semiconductor channel plate 10 and comprising a source region (i.e., one of the source/drain regions 52/54) and a drain region (i.e., another of the source/drain regions 52/54); an epitaxial semiconductor material portion 54 laterally spaced from the semiconductor nanostructure (such as the GAA transistor) and overlying the backside insulating matrix layer 7; a layer stack including, from bottom to top, a planarization dielectric layer 70 and a via-level dielectric layer 80 and overlying the semiconductor nanostructure (such as the GAA transistor) and the epitaxial semiconductor material portion 54; a backside metal interconnect structure (such as a backside metal pad 140) located on a bottom surface of the backside insulating matrix layer 7; an electrically conductive path (120, 180, 88, 98, 86, 72, 73) connecting the first active region A1 and the backside metal interconnect structure (such as the backside metal pad 140) and comprising a connector via structure 180 having a top surface below a horizontal plane including a top surface of the dielectric gate spacer 38 and above a horizontal plane including a top surface of the first active region A1; and a metal silicide portion 173 contacting a sidewall of the connector via structure 180 and a sidewall of the epitaxial semiconductor material portion 54.

In one embodiment, the electrically conductive path (120, 180, 88, 98, 86, 72, 73) comprises a metallic cap structure 72 overlying the first active region A1 and comprising a same conductive material as the connector via structure 180. In one embodiment, a top surface of the connector via structure 180 may be within a same horizontal plane as the top surface of the metallic cap structure 72. In one embodiment, the electrically conductive path (120, 180, 88, 98, 86, 72, 73) comprises: an active-region-side contact via structure 86 contacting a top surface of the metallic cap structure 72 and extending through the via-level dielectric layer 80; and a connector-side contact via structure 88 contacting a top surface of the connector via structure 180 and extending through the via-level dielectric layer 80.

In one embodiment, top surfaces of the active-region-side contact via structure 86 and the connector-side contact via structure 88 are located within a horizontal plane including a top surface of the via-level dielectric layer 80; and the active-region-side contact via structure 86 and the connector-side contact via structure 88 comprise, and/or consists essentially of, a same metal. In one embodiment, a transistor-side dielectric cap structure 76 may contact a top surface of the metallic cap structure 72, and may have a top surface within a horizontal plane including a top surface of the planarization dielectric layer 70. The transistor-side dielectric cap structure 76 may laterally surround the active-region-side contact via structure 86. In one embodiment, a connector-side dielectric cap structure 186 may contact a top surface of the connector via structure 180, and may have a top surface within the horizontal plane including the top surface of the planarization dielectric layer 70. The connector-side dielectric cap structure 186 may laterally surround the connector-side contact via structure 88.

In one embodiment, the electrically conductive path (120, 180, 88, 98, 86, 72, 73) comprises an additional metal silicide portion 73 contacting the first active region A1 and the metallic cap structure 72 and comprising an alloy of a semiconductor material of the first active region A1 and a metal within the metallic cap structure 72.

In one embodiment, the semiconductor structure comprises a dummy gate structure 450 located on a sidewall of the first active region A1 and comprising an additional gate dielectric layer 60, an additional gate electrode 66, an additional dielectric gate spacer 38, and additional dielectric channel spacers 22. The epitaxial semiconductor material portion 54 contacts the additional dielectric gate spacer 38 and one of the additional dielectric channel spacers 22, and the connector via structure 180 is laterally spaced from the dummy gate structure 450 by the epitaxial semiconductor material portion 54. In one embodiment, the electrically conductive path (120, 180, 88, 98, 86, 72, 73) comprises a backside via structure 120 contacting a bottom surface of the connector via structure 180 and a top surface of the backside metal interconnect structure (such as the backside metal pad 140) and vertically extending through the backside insulating matrix layer 7.

Referring to FIGS. 30A-32E and related drawings and according to various embodiments of the present disclosure, a semiconductor structure is provided, which comprises: a semiconductor nanostructure (such as a gate-all-around (GAA) transistor) located on a front surface of a backside insulating matrix layer 7 and including at least one semiconductor channel plate 10, a gate structure 350 comprising a gate dielectric layer 60, a gate electrode 66, a dielectric gate spacer 38, and dielectric channel spacers 22, and a first active region A1 and a second region A2 located at end portions of the at least one semiconductor channel plate 10 and comprising a source region (one of the source/drain regions 52/54) and a drain region (another of the source/drain regions 52/54); a dummy gate structure 450 located on a sidewall of the first active region A1 and comprising an additional gate dielectric layer 60, an additional gate electrode 66, an additional dielectric gate spacer 38, and additional dielectric channel spacers 22; a layer stack including, from bottom to top, a planarization dielectric layer 70 and a via-level dielectric layer 80 and overlying the semiconductor nanostructure (such as the GAA transistor); a backside metal interconnect structure (such as a backside metal pad 140) located on a bottom surface of the backside insulating matrix layer 7; and an electrically conductive path (120, 180, 88, 98, 86, 72, 73) connecting the first active region A1 and the backside metal interconnect structure (such as the backside metal pad 140) and comprising a connector via structure 180 in contact with a sidewall of the dummy gate structure 450 and having a top surface below a horizontal plane including a top surface of the dielectric gate spacer 38 and above a horizontal plane including a top surface of the first active region A1.

In one embodiment, hybrid dielectric fins (14, 16) comprising a respective dielectric fin liner 14 embedding a respective dielectric fill material portion 16 may be provided. The hybrid dielectric fins (14, 16) contact the gate structure 350, the first active region A1, the dummy gate structure 450, and the connector via structure 180. In one embodiment, the connector via structure 180 contacts the planarization dielectric layer 70, the additional dielectric gate spacer 38, and one of the additional dielectric channel spacers 22.

In one embodiment, the electrically conductive path (120, 180, 88, 98, 86, 72, 73) comprises a metallic cap structure 72 having a same material composition as the connector via structure 180, overlying the first active region A1, and having a top surface below the horizontal plane including the interface between the planarization dielectric layer 70 and the via-level dielectric layer 80.

In one embodiment, the electrically conductive path (120, 180, 88, 98, 86, 72, 73) comprises: an active-region-side contact via structure 86 contacting a top surface of the metallic cap structure 72 and extending through the via-level dielectric layer 80; and a connector-side contact via structure 88 contacting a top surface of the connector via structure 180 and extending through the via-level dielectric layer 80.

In one embodiment, a bottom surface of the connector via structure 180 is more proximal to a horizontal plane including an interface between the first active region A1 and the backside insulating matrix layer 7 than a bottom surface of the metallic cap structure 72 is to the horizontal plane including the interface between the first active region A1 and the backside insulating matrix layer 7.

Figure 33:
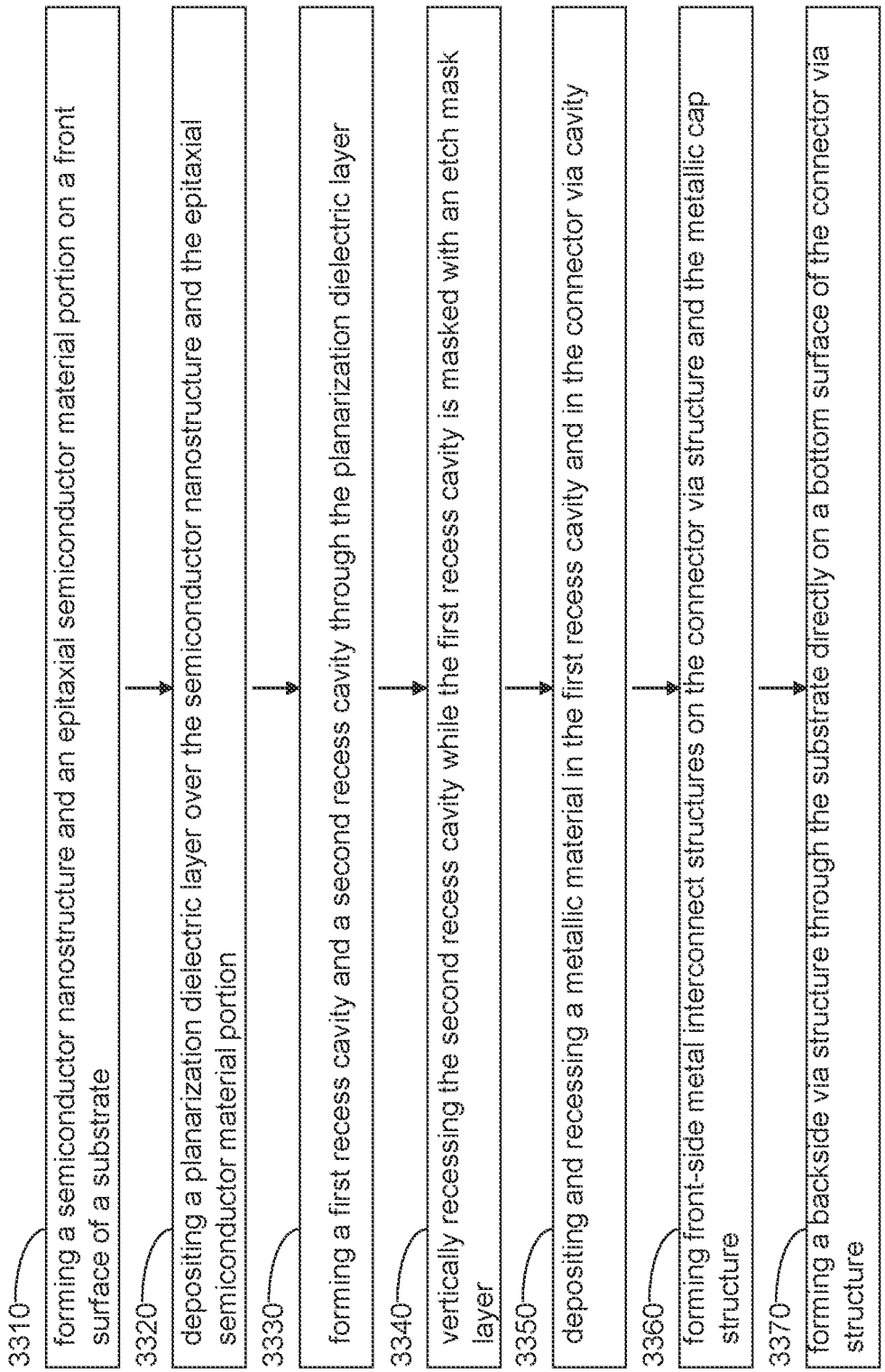
FIG. 33 is a flowchart illustrating steps for forming the exemplary structure of the present disclosure according to an embodiment of the present disclosure.

Referring to FIG. 33, a flowchart illustrates steps for forming the exemplary structure of the present disclosure according to an embodiment of the present disclosure. Referring to steps 3310 and FIGS. 1A-12D, a semiconductor nanostructure (such as a gate-all-around (GAA) transistor) and an epitaxial semiconductor material portion 54 may be formed on a front surface of a substrate (such as a substrate single crystalline semiconductor layer 8). Referring to step 3320 and FIGS. 12A-12D, a planarization dielectric layer 70 may be deposited over the semiconductor nanostructure (such as the GAA transistor) and the epitaxial semiconductor material portion 54. Referring to step 3330 and FIGS. 13A-13D, a first recess cavity 77 and a second recess cavity 79 may be formed through the planarization dielectric layer 70. A top surface of a first active region A1 of the semiconductor nanostructure (such as the GAA transistor) is physically exposed at a bottom of the first recess cavity 77, and a top surface of the epitaxial semiconductor material portion 54 is physically exposed at a bottom of the second recess cavity 79. Referring to step 3340 and FIGS. 14A and 14B and 30A and 30B, the second recess cavity 79 may be vertically recessed while the first recess cavity 77 is masked with an etch mask layer (such as a second photoresist layer 272). A connector via cavity 179 vertically extending through the epitaxial semiconductor material portion 54 is formed.

Referring to step 3350 and FIGS. 15 and 31, a metallic material may be deposited and recessed in the first recess cavity 77 and in the connector via cavity 179. A metallic cap structure 72 is formed on the first active region A1 of the semiconductor nanostructure (such as the GAA transistor) and a connector via structure 180 is formed in the connector via cavity 179. Referring to step 3360 and FIGS. 16-21 and FIGS. 32A-32E, front-side metal interconnect structures (86, 88, 98) may be formed on the connector via structure 180 and the metallic cap structure 72. Referring step 3370 and FIGS. 22A-32E, a backside via structure 120 may be formed through the substrate directly on a bottom surface of the connector via structure 180.

The various methods and structures of the present disclosure may provide low-resistance electrically conductive path between an active region of a semiconductor nanostructure (such as a gate-all-around (GAA) transistor) and a backside metal interconnect structure that is formed on the backside of the semiconductor nanostructure (such as the GAA transistor). The connection via structures 180 may be used to provide a low-resistance conductive path. The gate electrode 66 in the dummy gate structure 450 may be electrically floating, or may be negatively biased to ensure that the semiconductor channel plates 10 do not provide leakage current paths. The conductive via structures 180 are formed as self-aligned structure that are formed within a respective opening defines by a pair of hybrid dielectric fins (14, 16) and a pair of etch stop dielectric fins 18 that are laterally spaced apart along the second horizontal direction hd2. Further, each conductive via structure 180 may be laterally confined by the dummy gate structure 450 and an additional dummy gate structure that are laterally spaced apart along the first horizontal direction hd1. Reduction of the resistance in the electrically conductive path reduces the voltage drop and the RC delay of the electrical wiring for the active regions (A1, A2) of the semiconductor nanostructure (such as the GAA transistor).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a backside insulating matrix layer;
a nanostructure overlying the backside insulating matrix layer and including at least one semiconductor channel plate, a gate structure, a first active region, and a second active region;
an epitaxial semiconductor material portion laterally spaced from the semiconductor nanostructure and overlying the backside insulating matrix layer;
a backside metal interconnect structure located on a bottom surface of the backside insulating matrix layer; and
an electrically conductive path connecting the first active region and the backside metal interconnect structure.

2. The semiconductor structure of claim 1, wherein the electrically conductive path comprises a connector via structure having a top surface below a horizontal plane including a top surface of a dielectric gate spacer and above a horizontal plane including a top surface of the first active region.

3. The semiconductor structure of claim 2, wherein the electrically conductive path comprises a metallic cap structure overlying the first active region and comprising a same conductive material as the connector via structure.

4. The semiconductor structure of claim 3, wherein a top surface of the connector via structure is within a same horizontal plane as the top surface of the metallic cap structure.

5. The semiconductor structure of claim 3, further comprising a layer stack including, from bottom to top, a planarization dielectric layer and a via-level dielectric layer and overlying the semiconductor nanostructure and the epitaxial semiconductor material portion, wherein the electrically conductive path comprises an active-region-side contact via structure contacting a top surface of the metallic cap structure and extending through the via-level dielectric layer.

6. The semiconductor structure of claim 5, further comprising a connector-side contact via structure contacting a top surface of the connector via structure and extending through the via-level dielectric layer.

7. The semiconductor structure of claim 6, wherein:
top surfaces of the active-region-side contact via structure and the connector-side contact via structure are located within a horizontal plane including a top surface of the via-level dielectric layer; and
the active-region-side contact via structure and the connector-side contact via structure comprise a same metal.

8. The semiconductor structure of claim 6, further comprising:
a transistor-side dielectric cap structure contacting a top surface of the metallic cap structure, having a top surface within a horizontal plane including a top surface of the planarization dielectric layer, and laterally surrounding the active-region-side contact via structure; and
a connector-side dielectric cap structure contacting a top surface of the connector via structure, having a top surface within the horizontal plane including the top surface of the planarization dielectric layer, and laterally surrounding the connector-side contact via structure.

9. The semiconductor structure of claim 3, further comprising a metal silicide portion contacting a sidewall of the connector via structure and a sidewall of the epitaxial semiconductor material portion.

10. The semiconductor structure of claim 9, wherein the electrically conductive path comprises an additional metal silicide portion contacting the first active region and the metallic cap structure and comprising an alloy of a semiconductor material of the first active region and a metal within the metallic cap structure.

11. A semiconductor structure comprising:
a backside insulating matrix layer;
a nanostructure overlying the backside insulating matrix layer and including at least one semiconductor channel plate, a gate structure, a first active region, and a second active region;
a layer stack including, from bottom to top, a planarization dielectric layer and a via-level dielectric layer and overlying the semiconductor nanostructure;
a backside metal interconnect structure located on a bottom surface of the backside insulating matrix layer; and
an electrically conductive path connecting the first active region and the backside metal interconnect structure.

12. The semiconductor structure of claim 11, further comprising a dummy gate structure located on a sidewall of the first active region, wherein the electrically conductive path comprises a connector via structure in contact with a sidewall of the dummy gate structure.

13. The semiconductor structure of claim 12, wherein:
the gate structure comprises a gate dielectric layer, a gate electrode, a dielectric gate spacer, and dielectric channel spacers; and
the connector via structure has a top surface located below a horizontal plane including a top surface of the dielectric gate spacer and above a horizontal plane including a top surface of the first active region.

14. The semiconductor structure of claim 11, further comprising:
a dummy gate structure located on a sidewall of the first active region and including an additional gate dielectric layer, an additional gate electrode, an additional dielectric gate spacer, and additional dielectric channel spacers; and
hybrid dielectric fins comprising a respective dielectric fin liner embedding a respective dielectric fill material portion, wherein the hybrid dielectric fins contact the gate structure, the first active region, the dummy gate structure, and a connector via structure that contacts the dummy gate structure.

15. The semiconductor structure of claim 14, wherein the connector via structure contacts the planarization dielectric layer, the additional dielectric gate spacer, and one of the additional dielectric channel spacers.

16. The semiconductor structure of claim 14, wherein the electrically conductive path comprises a metallic cap structure having a same material composition as the connector via structure, overlying the first active region, and having a top surface below a horizontal plane including an interface between the planarization dielectric layer and the via-level dielectric layer.

17. A method of forming a semiconductor structure, comprising:
forming a semiconductor nanostructure and an epitaxial semiconductor material portion over a substrate;
depositing a planarization dielectric layer over the semiconductor nanostructure and the epitaxial semiconductor material portion;
forming a first recess cavity and a second recess cavity through the planarization dielectric layer, wherein a top surface of a first active region of the semiconductor nanostructure is physically exposed at a bottom of the first recess cavity and a top surface of the epitaxial semiconductor material portion is physically exposed at a bottom of the second recess cavity;
forming a connector via cavity by vertically extending the second recess cavity;
forming a metallic cap structure on the first active region of the semiconductor nanostructure and a connector via structure in the connector via cavity;
forming front-side metal interconnect structures on the connector via structure and the metallic cap structure; and
forming a backside via structure through the substrate directly on a bottom surface of the connector via structure.

18. The method of claim 17, wherein the second recess cavity is vertically recessed through the epitaxial semiconductor material portion while the first recess cavity is masked with an etch mask layer.

19. The method of claim 17, wherein the metallic cap structure and the connector via structure are formed by depositing and recessing a metallic material in the first recess cavity and in the connector via cavity.

20. The method of claim 17, wherein:
the substrate comprises a single crystalline semiconductor material layer;
the method comprises thinning the single crystalline semiconductor material layer after formation of a metal line structure; and
the backside via structure is formed through a remaining portion of the single crystalline semiconductor material layer after thinning the single crystalline semiconductor material layer.

* * * * *